US009239408B2

(12) United States Patent
Maeda et al.

(10) Patent No.: US 9,239,408 B2
(45) Date of Patent: Jan. 19, 2016

(54) COLORED PHOTOSENSITIVE COMPOSITION

(75) Inventors: Yosuke Maeda, Tokyo (JP); Masaaki Shimizu, Tokyo (JP); Koichi Shigeno, Tokyo (JP); Tomoyuki Ariyoshi, Tokyo (JP)

(73) Assignee: ADEKA CORPORATION, Tokyo (JP)

( * ) Notice: Subject to any disclaimer, the term of this patent is extended or adjusted under 35 U.S.C. 154(b) by 0 days.

(21) Appl. No.: 13/981,516

(22) PCT Filed: Jan. 26, 2012

(86) PCT No.: PCT/JP2012/051596
§ 371 (c)(1),
(2), (4) Date: Jul. 24, 2013

(87) PCT Pub. No.: WO2012/111400
PCT Pub. Date: Aug. 23, 2012

(65) Prior Publication Data
US 2013/0306920 A1 Nov. 21, 2013

(30) Foreign Application Priority Data

Feb. 18, 2011 (JP) .................................. 2011-033660
Sep. 5, 2011 (JP) .................................. 2011-192513

(51) Int. Cl.
G02B 5/23 (2006.01)
G02B 1/04 (2006.01)
G03F 7/00 (2006.01)
G03F 7/027 (2006.01)
G03F 7/105 (2006.01)
C09B 23/01 (2006.01)
C09B 23/04 (2006.01)
C09B 23/06 (2006.01)
C09B 23/08 (2006.01)
C09B 67/22 (2006.01)
G02F 1/1335 (2006.01)
G03F 1/00 (2012.01)
G03C 1/00 (2006.01)

(52) U.S. Cl.
CPC .............. *G02B 1/04* (2013.01); *C09B 23/0008* (2013.01); *C09B 23/0016* (2013.01); *C09B 23/0025* (2013.01); *C09B 23/0033* (2013.01); *C09B 23/0041* (2013.01); *C09B 23/0058* (2013.01); *C09B 23/0066* (2013.01); *C09B 23/04* (2013.01); *C09B 23/06* (2013.01); *C09B 23/083* (2013.01); *C09B 67/0033* (2013.01); *C09B 67/0041* (2013.01); *G03F 7/0007* (2013.01); *G03F 7/027* (2013.01); *G03F 7/105* (2013.01)

(58) Field of Classification Search
USPC ....... 252/586; 349/106; 427/162, 514; 430/7; 430/281.1, 286.1, 350; 524/104; 548/455; 359/891; 522/111
See application file for complete search history.

(56) References Cited

U.S. PATENT DOCUMENTS

| 4,925,782 | A | 5/1990 | Okada et al. |
| 6,153,356 | A * | 11/2000 | Urano et al. ............... 430/281.1 |
| 7,244,547 | B2 * | 7/2007 | Goto ........................ 430/286.1 |
| 8,206,619 | B2 * | 6/2012 | Ishida et al. ................. 252/586 |
| 2005/0100821 | A1 | 5/2005 | Goto |
| 2007/0238802 | A1 * | 10/2007 | Harada et al. .................. 522/75 |
| 2008/0048155 | A1 | 2/2008 | Toriniwa et al. |
| 2008/0237553 | A1 * | 10/2008 | Miya et al. .................... 252/586 |
| 2009/0263744 | A1 * | 10/2009 | Kuroki ....................... 430/281.1 |
| 2010/0129753 | A1 * | 5/2010 | Yamada et al. ............ 430/280.1 |
| 2013/0147345 | A1 | 6/2013 | Maeda et al. |

FOREIGN PATENT DOCUMENTS

| CN | 101581881 | 11/2009 | |
| EP | 1520695 | 4/2005 | |
| EP | 1806605 | 7/2007 | |
| EP | 2613610 | 7/2013 | |
| JP | 03-053987 | 3/1991 | |
| JP | 08-109335 | 4/1996 | |
| JP | 2000-98602 | 4/2000 | |
| JP | 2003-29408 | 1/2003 | |
| JP | 2005-029725 | 2/2005 | |
| JP | 2005-292409 | 10/2005 | |
| JP | 2007-230081 | 9/2007 | |
| JP | 2007-286189 | 11/2007 | |
| JP | 2008-044216 | 2/2008 | |
| JP | 2009-235392 | 10/2009 | |
| JP | 2010-276824 | 12/2010 | |
| JP | 2012-168258 | 9/2012 | |
| WO | WO 2006/035807 | 4/2006 | |
| WO | WO 2006/-35807 A1 * | 4/2006 | ............. G03F 7/004 |

OTHER PUBLICATIONS

International Search Report, PCT/JP2012/051596, Feb. 28, 2012.

* cited by examiner

*Primary Examiner* — Bijan Ahvazi
(74) *Attorney, Agent, or Firm* — Young & Thompson

(57) ABSTRACT

Disclosed is a colored (alkali-developable) photosensitive composition using a compound that is excellent in solubility and heat-resistance in a resin composition, and also relates to an optical filter using the colored (alkali-developable) photosensitive composition, specifically a color filter that does not decrease luminance and thus is preferable for image display devices such as liquid crystal display panels. Specifically, disclosed is a colored (alkali-developable) photosensitive composition containing (A) a dye that contains at least one kind of compound represented by any of the general formulas (1) to (4), (B) a polymerizable compound having an ethylenically unsaturated bond or (B') a polymerizable compound having an ethylenically unsaturated bond, which has alkali-developability, and (C) a photopolymerization initiator, and use of the composition. The compound represented by any of the general formulas (1) to (4) is as described.

10 Claims, No Drawings

COLORED PHOTOSENSITIVE COMPOSITION

TECHNICAL FIELD

The present invention relates to a colored photosensitive composition using a dye containing a compound having a specific structure, which is polymerizable by energy ray, and a color filter using the colored photosensitive composition.

BACKGROUND ART

Compounds having absorption with high intensity against specific light are used as optical elements of recording layers of optical recording media such as CD-Rs, DVD-Rs, DVD+Rs and BD-Rs, and of image display devices such as liquid crystal display devices (LCDs), plasma display panels (PDPs), electroluminescence displays (ELDs), cathode ray tube display devices (CRTs), fluorescent display tubes and field emission type displays.

In optical filters for image display devices such as liquid crystal display devices (LCDs), plasma display panels (PDPs), electroluminescent displays (ELDs), cathode ray tube display devices (CRTs), fluorescent display tubes and field emission type displays, various compounds that absorb light at wavelengths of 300 to 1,100 nm are used as light absorbing materials.

For these light absorbing agents, especially steep light absorption, i.e., that the half width of λmax is small, and that the functions are not lost by light, heat and the like, are required.

Optical filters that are mainly used in liquid crystal display devices (LCDs) include color filters. Generally three primary colors of RGB have been used for color filters. It is difficult to impart hues of pure RGB by a single color material, and thus efforts for making hues to those of pure RGB have been made by using plural color materials. Therefore, color materials of yellow, orange, purple and the like other than RGB are also required.

For light absorbing agents used for color filters, organic and/or inorganic pigments have been used due to their high heat-resistance. The pigments have a problem that they decrease the luminance of display devices since they are pigments, and this problem has been solved by increasing the luminance of light sources. However, in accordance with the trend of low power consumption, dyes having excellent solubility in solvents and resin compositions and high heat-resistance, and color filters using the dyes have been actively developed. Patent Literatures 1 to 3 each discloses a dye using a compound having a specific structure. Patent Literatures 4 and 5 disclose an optical filter using a compound having a specific structure.

However, the dyes (compounds) described in these documents are not satisfiable from the viewpoints of solubility and heat-resistance.

CITATION LIST

Patent Literature

Patent Literature 1: U.S. Pat. No. 4,925,782
Patent Literature 2: JP 03-053987
Patent Literature 3: JP 08-109335
Patent Literature 4: JP 2007-286189
Patent Literature 5: JP 2009-235392

SUMMARY OF INVENTION

Technical Problem

Accordingly, the present invention aims at providing a colored (alkali-developable) photosensitive composition using a compound that is excellent in solubility and heat-resistance in a polymerizable resin composition. Furthermore, the present invention further aims at providing an optical filter using the colored (alkali-developable) photosensitive composition, specifically a color filter that does not decrease luminance and thus is preferable for an image display device such as a liquid crystal display panel.

Solution to Problem

The present inventors did many intensive studies, and consequently found that a compound having a specific structure is excellent in solubility, and is excellent in solution stability and heat-resistance in a polymerizable resin composition, and also found that a colored (alkali-developable) photosensitive composition using the above-mentioned dye does not decrease the luminance of an optical filter (specifically a color filter) and thus is preferable for a color filter for an image display device such as a liquid crystal display panel, and attained the present invention.

The present invention provides a colored photosensitive composition containing (A) a dye containing at least one kind of compound represented by any of the following general formulas (1) to (4), (B) a polymerizable compound having an ethylenically unsaturated bond, and (C) a photopolymerization initiator.

$$A\text{-}Q\text{-}A' \quad (1)$$

$$pAn^{q-}$$

wherein

A represents a group selected from (a) to (m) in the following Group I,

A' represents a group selected from (a') to (m') in the following Group II,

Q represents a linking group comprising a methine chain having 1 to 9 carbon atom(s) optionally including a ring structure in the chain, wherein the hydrogen atom in the methine chain may be substituted with a hydroxyl group, a halogen atom, a cyano group, —NRR', an aryl group, an arylalkyl group or an alkyl group, wherein the —NRR', aryl group, arylalkyl group and alkyl group may further be substituted with a hydroxyl group, a halogen atom, a cyano group or —NRR', and may be interrupted by —O—, —S—, —CO—, —COO—, —OCO—, —SO$_2$—, —NH—, —CONH—, —NHCO—, —N=CH— or —CH=CH—, R and R' each represents an aryl group, an arylalkyl group or an alkyl group, An$^{q-}$ represents an anion having a valency of q, wherein q represents an integer of 1 to 3, and p represents a coefficient for retaining the charge neutral,

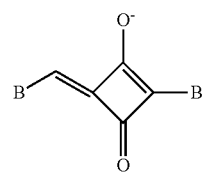

(2)

(3)
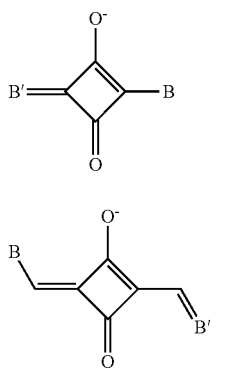
(4)
wherein
B represents a group selected from (a) to (m) of the following Group I,
B' represents a group selected from (a') to (m') of the following Group II,
Group I
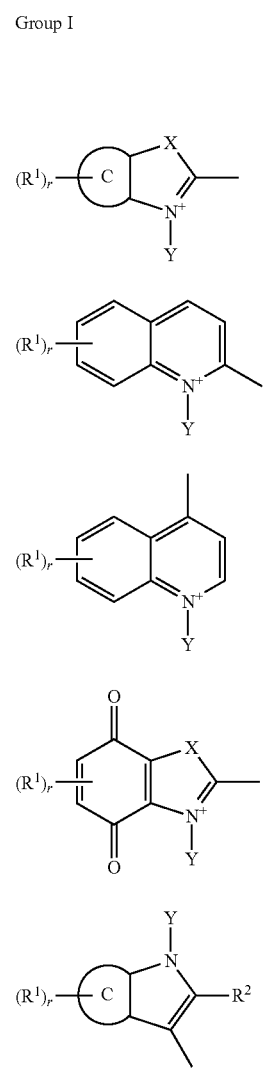
(f)
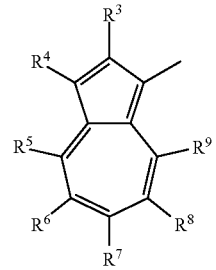
(g)
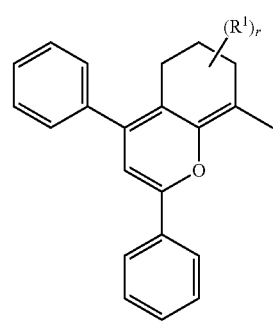
(h)
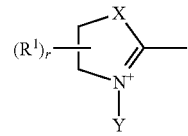
(i)
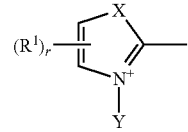
(j)
(k)
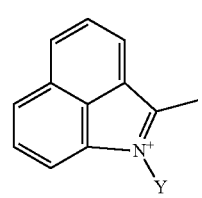
(l)
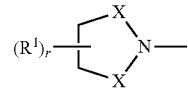
(m)
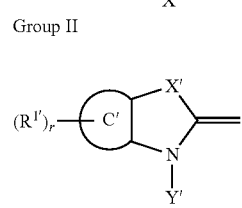
Group II
(a')

-continued

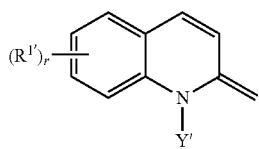

(b')

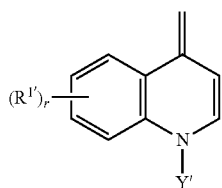

(c')

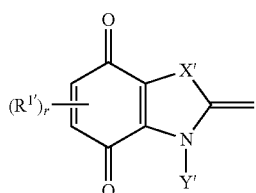

(d')

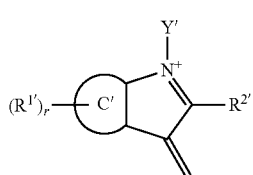

(e')

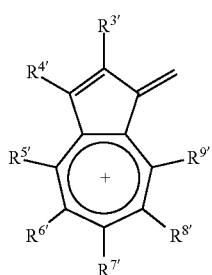

(f')

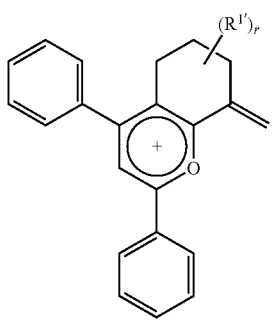

(g')

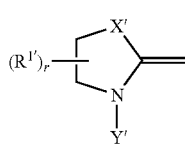

(h')

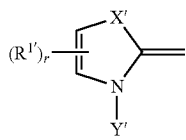

(i')

-continued

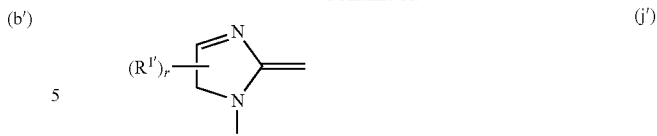

(j')

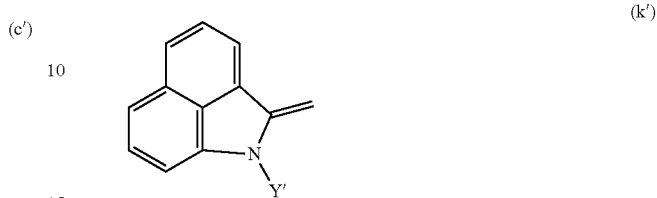

(k')

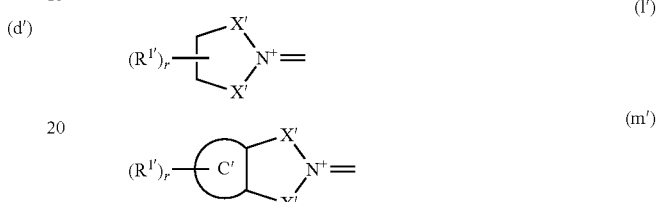

(l')

(m')

wherein
ring C and ring C' each represents a benzene ring, a naphthalene ring, a phenanthrene ring or a pyridine ring,
$R^1$ and $R^{1'}$ each represents a hydroxyl group, a halogen atom, a nitro group, a cyano group, —SO$_3$H, a carboxyl group, an amino group, an amide group, a ferrocenyl group, an aryl group having 6 to 30 carbon atoms, an arylalkyl group having 7 to 30 carbon atoms or an alkyl group having 1 to 8 carbon atom(s),
wherein the aryl group having 6 to 30 carbon atoms, arylalkyl group having 7 to 30 carbon atoms and alkyl group having 1 to 8 carbon atom(s) may be substituted with a hydroxyl group, a halogen atom, a nitro group, a cyano group, —SO$_3$H, a carboxyl group, an amino group, an amide group or a ferrocenyl group, and may be interrupted by —O—, —S—, —CO—, —COO—, —OCO—, —SO$_2$—, —NH—, —CONH—, —NHCO—, —N=CH— or a double bond,
$R^2$ to $R^9$ and $R^{2'}$ to $R^{9'}$ each represents a similar group to that for $R^1$ and $R^{1'}$ or a hydrogen atom,
X and X' represents an oxygen atom, a sulfur atom, a selenium atom, —CR$^{51}$R$^{52}$—, a cycloalkane-1,1-diyl group having 3 to 6 carbon atoms, —NH— or —NY$^2$—,
wherein $R^{51}$ and $R^{52}$ each represents a similar group to that for $R^1$ and $R^{1'}$ or a hydrogen atom,
Y, Y' and $Y^2$ each represents a hydrogen atom, or an alkyl group having 1 to 20 carbon atom(s), an aryl group having 6 to 30 carbon atoms or an arylalkyl group having 7 to 30 carbon atoms, which may be substituted with a hydroxyl group, a halogen atom, a cyano group, a carboxyl group, an amino group, an amide group, a ferrocenyl group, —SO$_3$H or a nitro group,
wherein the methylene group in the alkyl group, aryl group and arylalkyl group in Y, Y' and $Y^2$ may be interrupted by —O—, —S—, —CO—, —COO—, —OCO—, —SO$_2$—, —NH—, —CONH—, —NHCO—, —N=CH— or —CH=CH—, and
r and r' each represents 0 or a number of possible substitution in (a) to (e), (g) to (j), (l), (m), (a') to (e'), (g') to (j'), (l') and (m').
Furthermore, the present invention provides the colored photosensitive composition wherein the polymerizable compound having an ethylenically unsaturated bond (B) is (B') a polymerizable compound having an ethylenically unsaturated bond, which has alkali-developability.

Furthermore, the present invention provides a cured product of the colored photosensitive composition, a color filter for a display device formed by using the cured product, and a liquid crystal display panel formed by using the color filter for a display device.

Advantageous Effects of Invention

The colored photosensitive composition (colored alkali-developable photosensitive composition) of the present invention, which contains at least one kind of compound having a specific structure, has a preferable wavelength property, and is excellent in solution stability and heat-resistance. Furthermore, a cured product thereof is preferable for a color filter for a display device and a liquid crystal display panel.

DESCRIPTION OF EMBODIMENTS

Hereinafter the colored photosensitive composition and colored alkali-developable photosensitive composition (hereinafter also simply referred to as colored composition) of the present invention will be explained in detail based on preferable exemplary embodiments.

The colored composition of the present invention contains (A) a dye, (B) a polymerizable compound having an ethylenically unsaturated bond (including (B') a polymerizable compound having an ethylenically unsaturated bond, which has alkali-developability), (C) a photopolymerization initiator, and, as necessary, (D) an inorganic pigment and/or organic pigment. Hereinafter the respective components will be sequentially explained.

<Dye (A)>

The dye (A) used in the colored composition of the present invention contains at least one kind of compound represented by any of the above-mentioned general formulas (1) to (4). In addition, as the two Bs in the general formula (2) and B and B' in the general formulas (3) and (4), one nonionic group and one cationic group are selected so that the charge of the compound would be neutral.

In the above-mentioned general formulas (1) to (4), examples of the halogen atom represented by $R^1$ to $R^9$ and $R^{1'}$ to $R^{9'}$, and $R^{51}$ and $R^{52}$ in X and X' may include fluorine, chlorine, bromine and iodine.

Examples of the aryl group having 6 to 30 carbon atoms may include phenyl, naphthyl, 2-methylphenyl, 3-methylphenyl, 4-methylphenyl, 4-vinylphenyl, 3-iso-propylphenyl, 4-iso-propylphenyl, 4-butylphenyl, 4-iso-butylphenyl, 4-tert-butylphenyl, 4-hexylphenyl, 4-cyclohexylphenyl, 4-octylphenyl, 4-(2-ethylhexyl)phenyl, 4-stearylphenyl, 2,3-dimethylphenyl, 2,4-dimethylphenyl, 2,5-dimethylphenyl, 2,6-dimethylphenyl, 3,4-dimethylphenyl, 3,5-dimethylphenyl, 2,4-di-tert-butylphenyl, 2,5-di-tert-butylphenyl, 2,6-di-tert-butylphenyl, 2,4-di-tert-pentylphenyl, 2,5-di-tert-amylphenyl, 2,5-di-tert-octylphenyl, 2,4-dicumylphenyl, 4-cyclohexylphenyl, (1,1'-biphenyl)-4-yl, 2,4,5-trimethylphenyl, ferrocenyl and the like.

Examples of the arylalkyl group having 7 to 30 carbon atoms may include benzyl, phenethyl, 2-phenylpropan-2-yl, diphenylmethyl, triphenylmethyl, styryl, cinnamyl, ferrocenyl methyl, ferrocenyl propyl and the like.

Examples of the alkyl group having 1 to 8 carbon atom(s) may include methyl, ethyl, propyl, iso-propyl, butyl, sec-butyl, tert-butyl, iso-butyl, amyl, iso-amyl, tert-amyl, hexyl, 2-hexyl, 3-hexyl, cyclohexyl, 1-methylcyclohexyl, heptyl, 2-heptyl, 3-heptyl, iso-heptyl, tert-heptyl, 1-octyl, iso-octyl, tert-octyl and the like.

The above-mentioned aryl group having 6 to 30 carbon atoms, arylalkyl group having 7 to 30 carbon atoms and alkyl group having 1 to 8 carbon atom(s) may be substituted with a hydroxyl group, a halogen atom, a nitro group, a cyano group, —$SO_3H$, a carboxyl group, an amino group, an amide group or a ferrocenyl group, and may be interrupted by —O—, —S—, —CO—, —COO—, —OCO—, —$SO_2$—, —NH—, —CONH—, —NHCO—, —N=CH— or a double bond, and the number and position(s) of these substitution and interruption are arbitrary.

For example, examples of the group in which the above-mentioned alkyl group having 1 to 8 carbon atom(s) is substituted with halogen atom(s) may include chloromethyl, dichloromethyl, trichloromethyl, fluoromethyl, difluoromethyl, trifluoromethyl, nonafluorobutyl and the like.

Examples of the group in which the above-mentioned alkyl group having 1 to 8 carbon atom(s) is interrupted by —O— may include alkoxy groups such as methyloxy, ethyloxy, iso-propyloxy, propyloxy, butyloxy, pentyloxy, iso-pentyloxy, hexyloxy, heptyloxy, octyloxy and 2-ethylhexyloxy, and alkoxyalkyl groups such as 2-methoxyethyl, 2-(2-methoxy)ethoxyethyl, 2-ethoxyethyl, 2-butoxyethyl, 4-methoxybutyl and 3-methoxybutyl, and the like.

Examples of the group in which the above-mentioned alkyl group having 1 to 8 carbon atom(s) is substituted with halogen atom(s) and interrupted by —O— may include chloromethyloxy, dichloromethyloxy, trichloromethyloxy, fluoromethyloxy, difluoromethyloxy, trifluoromethyloxy, nonafluorobutyloxy and the like.

In the above-mentioned general formulas (1) to (4), examples of the cycloalkane-1,1-diyl group having 3 to 6 carbon atoms represented by X and X' may include cyclopropane-1,1-diyl, cyclobutane-1,1-diyl, 2,4-dimethylcyclobutane-1,1-diyl, 3,3-dimethylcyclobutane-1,1-diyl, cyclopentane-1,1-diyl, cyclohexane-1,1-diyl and the like.

In the above-mentioned general formulas (1) to (4), examples of the halogen atom, alkyl group having 1 to 20 carbon atom(s), aryl group having 6 to 30 carbon atoms and arylalkyl group having 7 to 30 carbon atoms represented by Y, Y' and $Y^2$ may include the groups exemplified in the explanation on the above-mentioned $R^1$ and the like, and the hydrogen atom(s) in these substituents may be substituted with a hydroxyl group, a halogen atom, a cyano group, a carboxyl group, an amino group, an amide group, a ferrocenyl group, —$SO_3H$ or a nitro group at an arbitrary number.

Furthermore, the methylene group in the alkyl group, aryl group and arylalkyl group in these Y, Y' and $Y^2$ may be interrupted by —O—, —S—, —CO—, —COO—, —OCO—, —$SO_2$—, —NH—, —CONH—, —NHCO—, —N=CH— or —CH=CH—. Examples may include alkyl groups such as methyl, ethyl, propyl, iso-propyl, butyl, sec-butyl, tert-butyl, iso-butyl, amyl, iso-amyl, tert-amyl, hexyl, 2-hexyl, 3-hexyl, cyclohexyl, 1-methylcyclohexyl, heptyl, 2-heptyl, 3-heptyl, iso-heptyl, tert-heptyl, 1-octyl, iso-octyl, tert-octyl, 2-ethylhexyl, nonyl, iso-nonyl, decyl, dodecyl, tridecyl, tetradecyl, pentadecyl, hexadecyl, heptadecyl and octadecyl; aryl groups such as phenyl, naphthyl, 2-methylphenyl, 3-methylphenyl, 4-methylphenyl, 4-vinylphenyl, 3-iso-propylphenyl, 4-iso-propylphenyl, 4-butylphenyl, 4-iso-butylphenyl, 4-tert-butylphenyl, 4-hexylphenyl, 4-cyclohexylphenyl, 4-octylphenyl, 4-(2-ethylhexyl)phenyl, 4-stearylphenyl, 2,3-dimethylphenyl, 2,4-dimethylphenyl, 2,5-dimethylphenyl, 2,6-dimethylphenyl, 3,4-dimethylphenyl, 3,5-dimethylphenyl, 2,4-di-tert-butylphenyl and cyclohexylphenyl; arylalkyl groups such as benzyl, phenetyl, 2-phenylpropan-2-yl, diphenylmethyl, triphenylmethyl, styryl and cinnamyl, and the like, which are interrupted by an ether bond, a thioether bond or the like, such as 2-methoxyethyl, 3-methoxypropyl, 4-methoxybutyl, 2-butoxyethyl, methoxyethoxyethyl, methoxyethoxyethoxyethyl, 3-methoxybutyl, 2-phenoxyethyl, 3-phenoxypropyl, 2-methylthioethyl and 2-phenylthioethyl.

As the linking group comprising the methine chain having 1 to 9 carbon atom(s) optionally including a ring structure in the chain represented by Q in the above-mentioned general formula (1), a group represented by any of the following (Q-1) to (Q-11) is preferable since it is easily produced. The carbon number of the methine chain having 1 to 9 carbon atom(s) does not include the carbon atoms for the group(s) which substitutes the methine chain or the ring structure included in the methine chain (for example, the carbon atoms on the both terminals of the linking groups (Q-1) to (Q-11), and in the case when Z' or $R^{14}$ to $R^{19}$ include carbon atoms, the carbon atoms thereof).

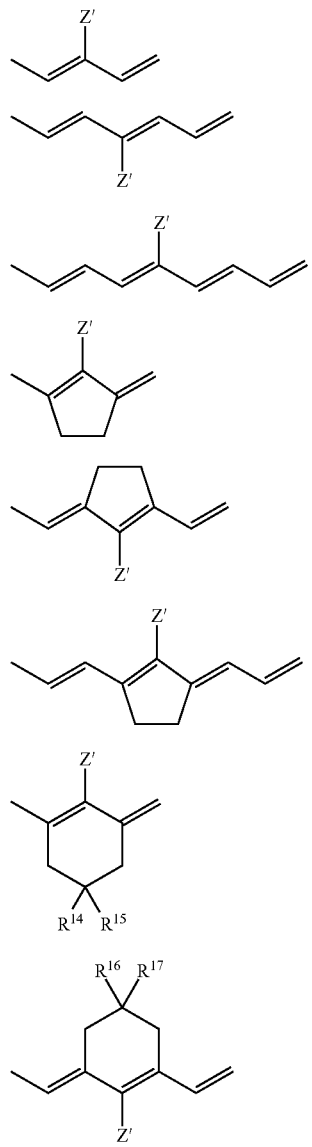
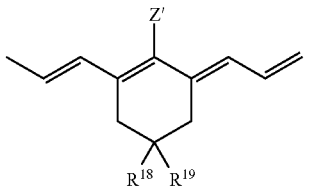
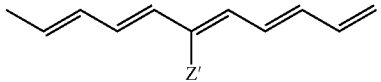

wherein
$R^{14}$, $R^{15}$, $R^{16}$, $R^{17}$, $R^{18}$, $R^{19}$ and Z' each independently represents a hydrogen atom, a hydroxyl group, a halogen atom, a cyano group, —NRR', an aryl group, an arylalkyl group or an alkyl group, wherein the —NRR', aryl group, arylalkyl group and alkyl group may be substituted with a hydroxyl group, a halogen atom, a cyano group or —NRR', and may be interrupted by —O—, —S—, —CO—, —COO—, —OCO—, —SO$_2$—, —NH—, —CONH—, —NHCO—, —N=CH— or —CH=CH—, and
R and R' each represents an aryl group, an arylalkyl group or an alkyl group.

Examples of the halogen atom, aryl group, arylalkyl or alkyl group represented by the above-mentioned $R^{14}$, $R^{15}$, $R^{16}$, $R^{17}$, $R^{18}$, $R^{19}$ and Z' may include the groups exemplified in the explanation on $R^1$ and the like, and examples of the aryl group, arylalkyl group or alkyl group represented by R and R' may include the groups exemplified in the explanation on $R^1$ and the like.

Examples of the anion represented by $An^{q-}$ in the above-mentioned general formula (1) may include organic sulfonate anions. The organic sulfonate anions are sulfonate anions having organic groups, and examples of the organic group may include alkyl groups such as methyl, ethyl, propyl, butyl and cyclohexyl; aryl groups such as phenyl and naphthyl, heterocyclic groups such as thienyl and pyrrolyl, and the like. The above-mentioned alkyl group, aryl group and heterocyclic group may be substituted with a halogen atom, a carboxyl group, a hydroxyl group, an alkyl group, an alkoxy group and the like. Furthermore, the above-mentioned organic sulfonate anion may be monovalent, divalent or trivalent.

Examples of the monovalent organic sulfonate anions may include organic sulfonate anions such as a methanesulfonate anion, a dodecylsulfonate anion, a benzenesulfonate anion, a toluenesulfonate anion, a trifluoromethanesulfonate anion, a naphthalenesulfonate anion, a diphenylamine-4-sulfonate anion, a 2-amino-4-methyl-5-chlorobenzenesulfonate anion, a 2-amino-5-nitrobenzenesulfonate anion, and sulfonate anions described in JP 10-235999A, JP 10-337959A, JP 11-102088, JP 2000-108510 A, JP 2000-168223A, JP 2001-209969A, JP 2001-322354A, JP 2006-248180A, JP 2006-297907A, JP 8-253705A, JP 2004-503379A, JP 2005-336150A, WO 2006/28006 and the like.

Examples of the divalent organic sulfonate anions may include a benzenedisulfonate anion, a naphthalene disulfonate anion, a naphthalene-1,5-disulfonate anion, a 9,10-diethoxyanthracene-2,6-sulfonate anion, a difluoromethanesulfonate anion, a tetrafluoroethanedisulfonate anion and the like.

Examples of the trivalent organic sulfonate anions may include a naphthalene-1,3,6-trisulfonate anion, a trifluoroethanetrisulfonate anion and the like.

Other examples of the monovalent anions may include halogen anions such as a chlorine anion, a bromine anion, an iodine anion and a fluorine anion; inorganic anions such as a perchlorate anion, a chlorinate anion, a thiocyanate anion, a hexafluorophosphate anion, a hexafluoroantimony anion and a tetrafluoroboron anion; organic phosphate anions such as an octylphosphate anion, a dodecylphosphate anion, an octadecylphosphate anion, a phenylphosphate anion, a nonylphenylphosphate anion and a 2,2'-methylenebis(4,6-di-tert-butylphenyl)phosphate anion; a bis(trifluoromethanesulfonyl)imidate anion, a bisperfluorobutanesulfonylimide anion, a perfluoro-4-ethylcyclohexanesulfonate anion, a tetrakis(pentafluorophenyl)borate anion, a tris(fluoroalkylsulfonyl)carbanion, a dibenzoyltartrate anion and the like. Furthermore, quencher anions having a function to deexcite (quenching) active molecules in an excite state, and quencher anions that are metal complex compounds such as ferrocene and ruthenocene each having an anionic group such as a carboxyl group, a phosphonate group and a sulfonate group on a cyclopentadienyl ring can also be used as necessary to the extent that the wavelength converting function of the present invention is not inhibited.

Examples of the above-mentioned quencher anion may include a quencher anion represented by the following general formula (5) or (6), a quencher anion represented by the following formula (7), (8), (9), (10), (11), (12), (13), (14), (15) or (16), and may also include anions described in JP 60-234892 A, JP 5-43814A, JP 5-305770A, JP 6-239028A, JP 9-309886A, JP 9-323478A, JP 10-45767A, JP 11-208118A, JP 2000-168237A, JP 2002-201373A, JP 2002-206061A, JP 2005-297407A, JP 7-96334B, WO 98/29257 and the like.

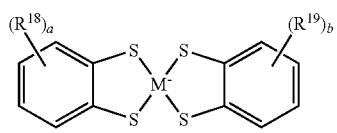

(5)

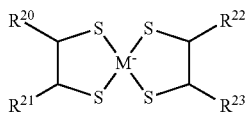

(6)

wherein M represents Fe, Co, Ni, Ti, Cu, Zn, Zr, Cr, Mo, Os, Mn, Ru, Sn, Pd, Rh, Pt or Ir, $R^{18}$ and $R^{19}$ each represents a halogen atom, an alkyl group having 1 to 8 carbon atom(s), an aryl group having 6 to 30 carbon atoms or —$SO_2$-G group, wherein G represents an alkyl group, an aryl group which may be substituted with halogen atom(s), a dialkylamino group, a diarylamino group, a piperidino group or a morpholino group, and a and b each independently represents a number of 0 to 4. Furthermore, $R^{20}$, $R^{21}$, $R^{22}$ and $R^{23}$ each independently represents an alkyl group, an alkylphenyl group, an alkoxyphenyl group or a halogenated phenyl group.

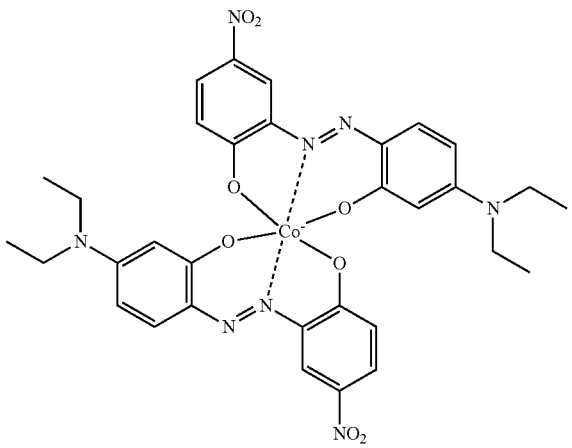

(7)

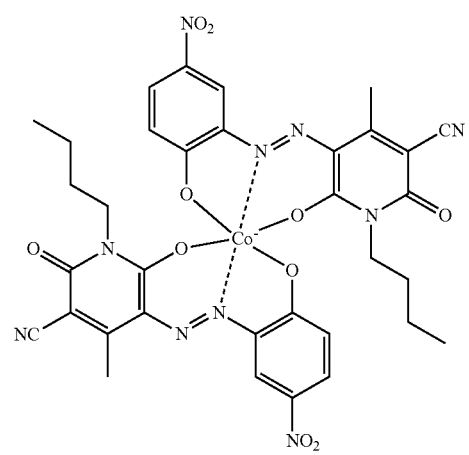

(8)

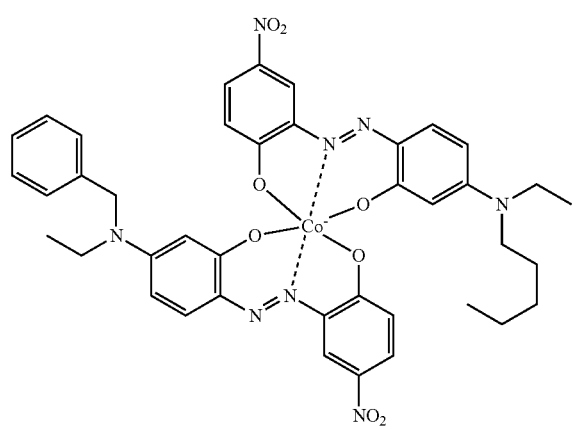

(9)

(10)
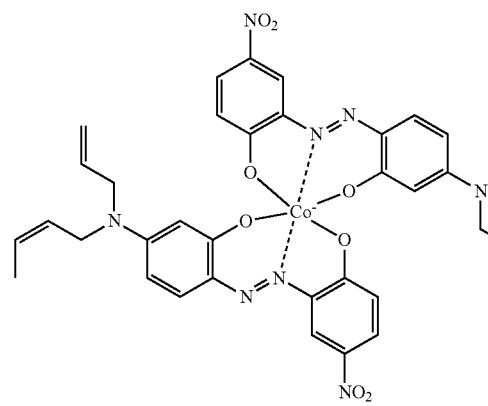

(11)
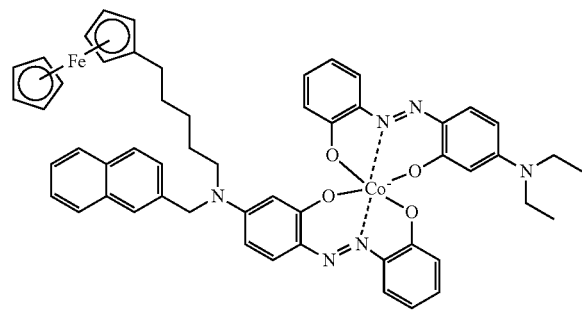

(12)
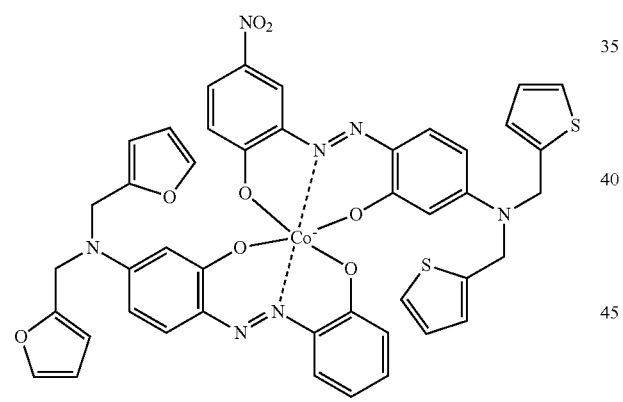

(13)
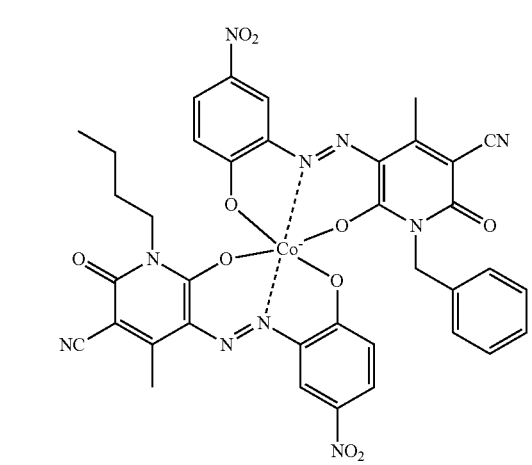

(14)
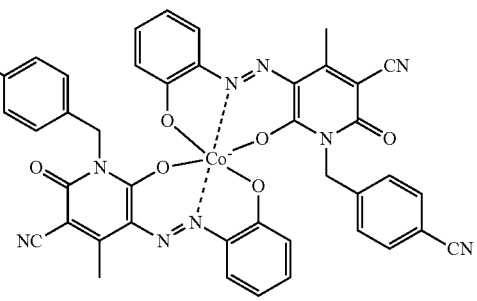

(15)
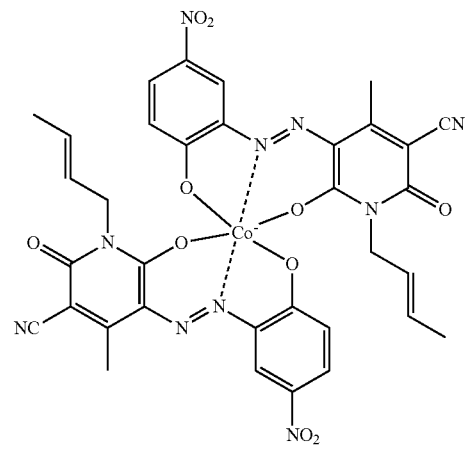

(16)
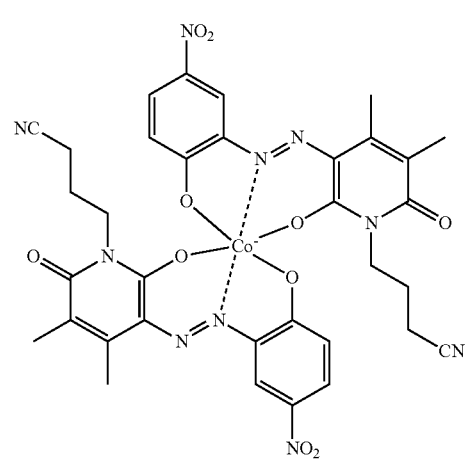

As the anion represented by $An^{q-}$ in the above-mentioned general formula (1), among the respective anions listed above, any of the following anions is preferable since obtainment of raw materials and production are easy: any of inorganic anions including halogen anions, hexafluorophosphate anion, tetrafluoroboron anion and perchlorate anion, and any of organic sulfonate anions including a methanesulfonate anion, a 1-butanesulfonate anion, a 1-hexanesulfonate anion, a 1-heptanesulfonate anion, an isethionate anion, a hydroxypropanesulfonate anion, a 2-aminoethanesulfonate anion, a p-toluenesulfonate anion, 1,3-benzenedisulfonate, 3-aminobenzenesulfonate, a 1-naphthol-8-sulfonate anion, a p-styrenesulfonate anion, an allylsulfonate anion, a methacryloxyisethionate anion, a methacryloxypropanesulfonate anion, a 2-acrylamide-2-methylpropanesulfonate anion, a p-toluenesulfonate anion, a 1,3-benzenedisulfonate, a 3-aminobenzenesulfonate, a 1-naphthol-8-sulfonate anion, a p-styrenesulfonate anion, an allylsulfonate anion, a methacryloxyisethionate anion, a methacryloxypropanesulfonate anion, a 2-acrylamide-2-methylpropanesulfonate anion, a trifluoromethanesulfonate anion, a benzenesulfonate anion, a naphthalenesulfonate anion, a naphthalenedisulfonate anion, a 1,8-naphtholsulfonate anion, a 3-sulfopropyl 2-methyl-2-propenoate anion, a p-dodecylbenzenesulfonate anion, a 2,6-naphthyldisulfonate anion and a bis(trifluoromethanesulfonyl)imidate anion.

Among the compounds represented by the above-mentioned (1) to (4), the compound represented by the above-mentioned general formula (1) is preferable since it is excellent in solubility, and compounds that satisfy at least one of any of the following conditions (i) to (vi) are more preferable respectively from the following viewpoints.

Compounds that satisfy the following condition (i): the colored composition has an excellent wavelength property.

Compounds that satisfy the following condition (ii): the half width in the visible light absorbing region of the colored composition is small, or the colored composition has high heat-resistance.

Compounds that satisfy the following condition (iii) or (vi): since the compounds are excellent in solubility, the colored composition and cured product are easily produced, and the colored composition has high stability.

Compounds that satisfy the following (iv) or (v): the compounds are preferable since the colored composition has high heat-resistance.

Furthermore, compounds represented by any of the above-mentioned (2) to (4) are preferable since the compounds sufficiently absorb a desired light in visible light wavelength region for the colored composition, and shows high transmittance in the wavelength region with no absorption.

(i) The methine chain that constitutes Q in the general formula (1) has 3 to 9 carbon atoms.

(ii) The ring A or ring A' in the general formula (1) has at least one group selected from a hydroxyl group, a halogen atom, a nitro group, a cyano group, —SO$_3$H, a carboxyl group, an amino group, an amide group, a ferrocenyl group, an aryl group having 6 to 30 carbon atoms, an arylalkyl group having 7 to 30 carbon atoms or an alkyl group having 1 to 8 carbon atom(s), provided that the aryl group having 6 to 30 carbon atoms, arylalkyl group having 7 to 30 carbon atoms and alkyl group having 1 to 8 carbon atom(s) may be substituted with a hydroxyl group, a halogen atom, a nitro group, a cyano group, —SO$_3$H, a carboxyl group, an amino group, an amide group or a ferrocenyl group, and may be interrupted by —O—, —S—, —CO—, —COO—, —OCO—, —SO$_2$—, —NH—, —CONH—, —NHCO—, —N=CH— or a double bond, provided that an unsubstituted alkyl group having 1 to 8 carbon atom(s) is excluded.

(iii) The compound represented by the general formula (1) has a left-right asymmetrical shape.

(iv) The ring A in the general formula (1) is a group selected from (b) to (m), or the ring A' is a group selected from (b') to (m').

(v) The ring A in the general formula (1) is (a), or the ring A' is (a'), and the ring C in (a) or the ring C' in (a') is a naphthalene ring, a phenanthrene ring or a pyridine ring.

(vi) The anion represented by An$^{q-}$ in the general formula (1) is an organic sulfonate anion.

Among the compounds that satisfy the above-mentioned condition (i), compounds wherein Q is a group represented by each of the above-mentioned (Q-1), (Q-2), (Q-6) and (Q-9) are further preferable from the viewpoints of easiness of synthesis and absorption wavelength.

Among the compounds that satisfy the above-mentioned condition (ii), compounds wherein the ring A or ring A' has at least one group selected from a halogen atom, a nitro group, a carboxyl group, a ferrocenyl group, an aryl group having 6 to 30 (specifically 6 to 12) carbon atoms, an arylalkyl group having 7 to 30 (specifically 7 to 15) carbon atoms or an alkyl group having 1 to 8 (specifically 1 to 4) carbon atom(s) are further preferable from the viewpoints of easiness of synthesis, solubility and absorption wavelength.

The aryl group having 6 to 30 carbon atoms, arylalkyl group having 7 to 30 carbon atoms and alkyl group having 1 to 8 carbon atom(s) may be substituted with a halogen atom, a nitro group, a carboxyl group or a ferrocenyl group, and may be interrupted by —O— or —CH=CH— (however, unsubstituted alkyl group having 1 to 8 carbon atom(s) is excluded).

Among the compounds that satisfy the above-mentioned condition (vi), compounds wherein the anion represented by An$^{q-}$ is a benzenesulfonate anion, a trifluoromethanesulfonate anion, a naphthalenesulfonate anion, a naphthalenedisulfonate anion, a bis(trifluoromethanesulfonyl)imidate anion, a 1,8-naphtholsulfonate anion, a 3-sulfopropyl 2-methyl-2-propenoate anion, a p-dodecylbenzenesulfonate anion or a 2,6-naphthyldisulfonate anion are further preferable from the viewpoints of heat-resistance and solubility.

Furthermore, in the groups selected from (a) to (m) in the above-mentioned Group I and the groups selected from (a') to (m') in Group II, the following groups are preferable.

Y and Y' are each preferably an alkyl group having 1 to 20 (specifically 1 to 5) carbon atom(s), an aryl group having 6 to 30 (specifically 6 to 12) carbon atoms, or an arylalkyl group having 7 to 30 (specifically 7 to 15) carbon atoms, which may be substituted with a halogen atom, a carboxyl group, a ferrocenyl group or a nitro group, and may be interrupted by —O—, —CH=CH— or —CO—.

r and r' are each preferably 0 to 2.

In the case when r and r' are each 1 or more, $R^1$ and $R^{1'}$ are each preferably a halogen atom, a nitro group, a carboxyl group, a ferrocenyl group, an unsubstituted alkyl group having 1 to 8 (specifically 1 to 4) carbon atom(s) or a halogen-substituted alkyl group having 1 to 8 (specifically 1 to 4) carbon atom(s).

$R^2$ and $R^{2'}$ are each preferably a hydrogen atom.

X and X' are each preferably an oxygen atom, a sulfur atom, —CR$^{51}$R$^{52}$— [specifically R$^{51}$ and R$^{52}$ are each an unsubstituted alkyl group having 1 to 8 (specifically 1 to 4) carbon atom(s), an arylalkyl group having 7 to 20 (specifically 7 to 15) carbon atoms] or a cycloalkane-1,1-diyl group having 3 to 6 carbon atoms.

Specific examples of the compound represented by the above-mentioned general formula (1) according to the present invention may include the following compounds No. 1-1 to 1-99. In the following exemplification, these compounds are indicated by cyanine cations in which anions are omitted.

Compound No. 1-1
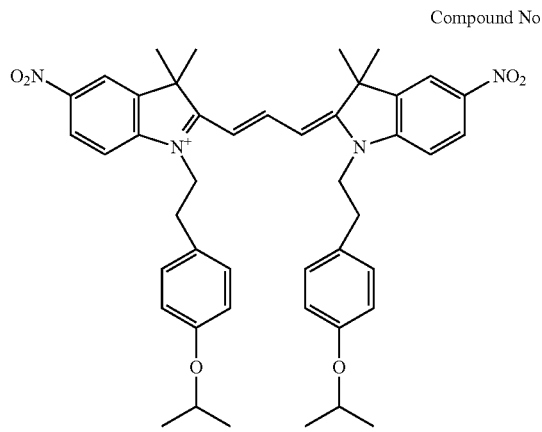
Compound No. 1-2
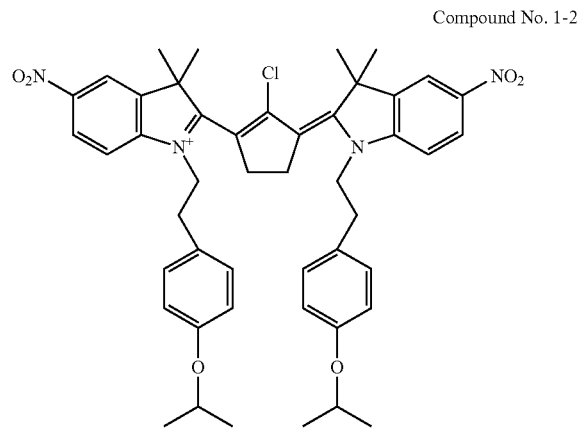
Compound No. 1-3
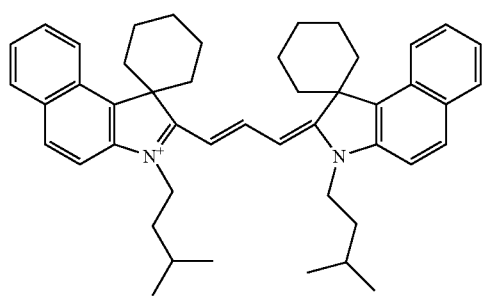
Compound No. 1-4
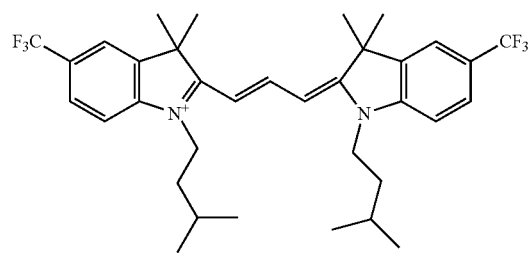
Compound No. 1-5
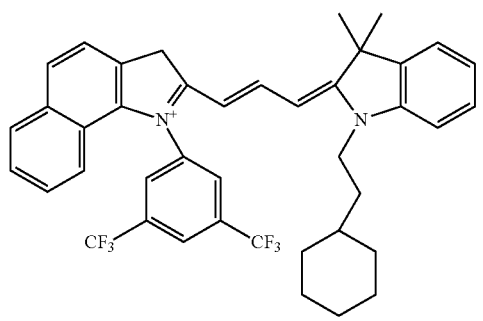
Compound No. 1-6
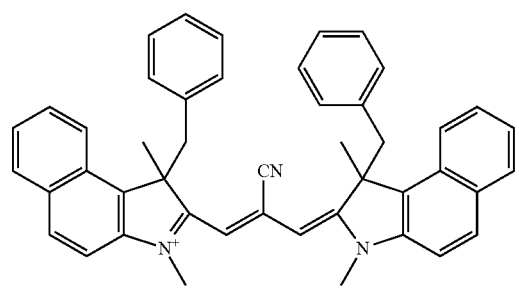
Compound No. 1-7
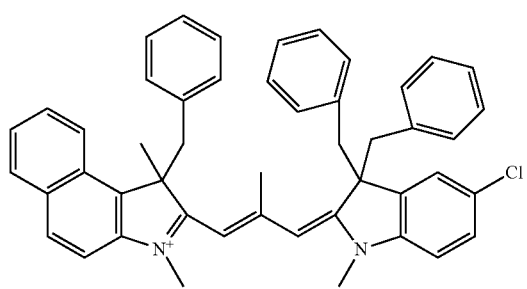
Compound No. 1-8
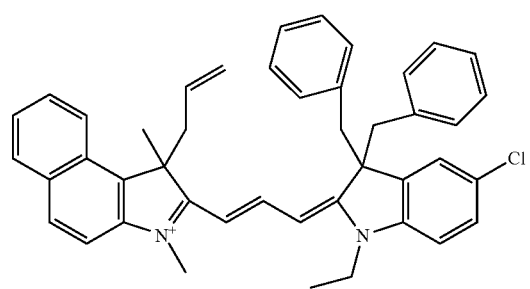

-continued
Compound No. 1-9
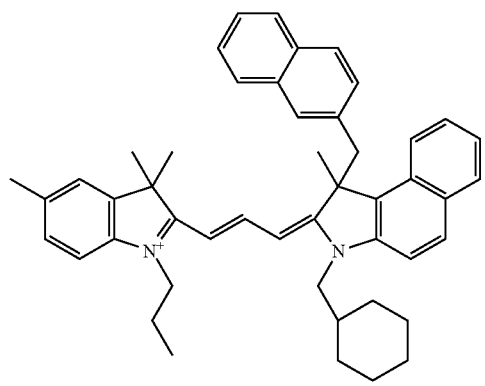
Compound No. 1-10
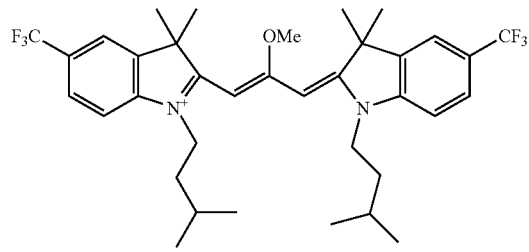
Compound No. 1-11
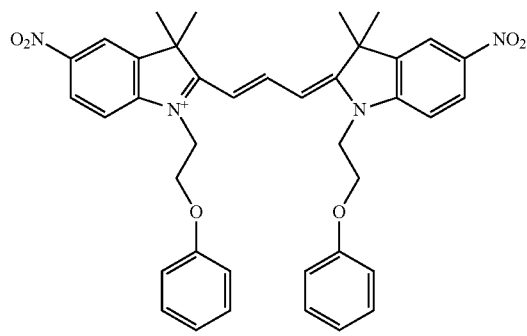
Compound No. 1-12
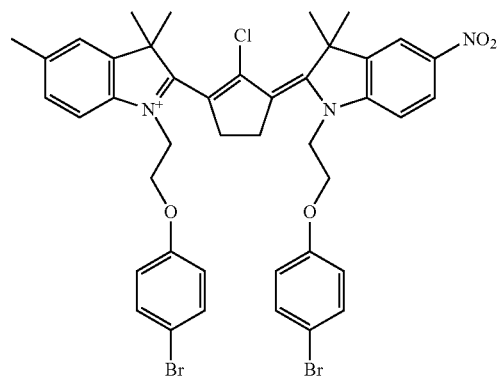
Compound No. 1-13
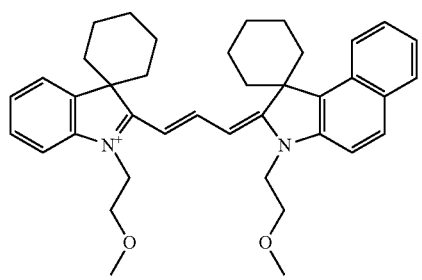
Compound No. 1-14
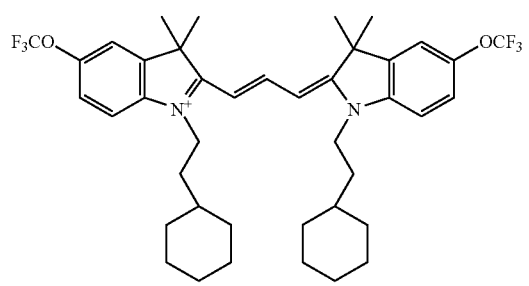
Compound No. 1-15
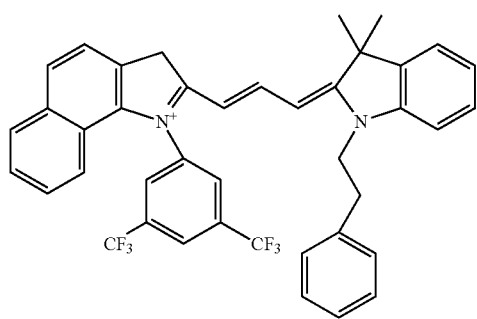
Compound No. 1-16
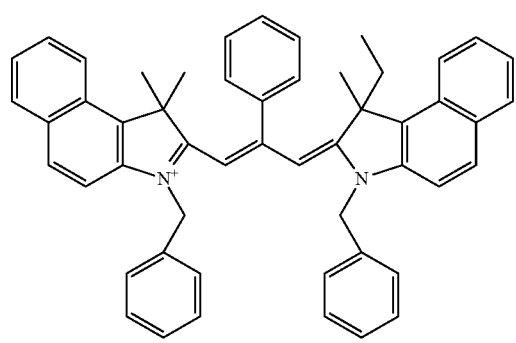

-continued
Compound No. 1-17
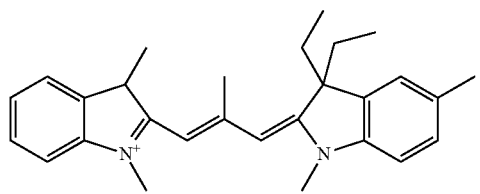
Compound No. 1-18
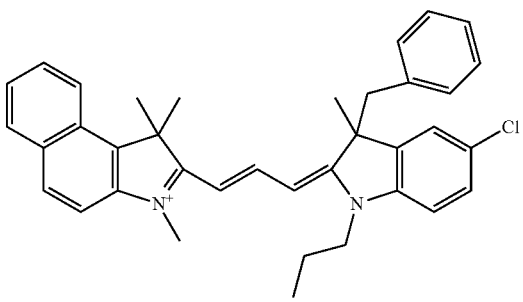
Compound No. 1-19
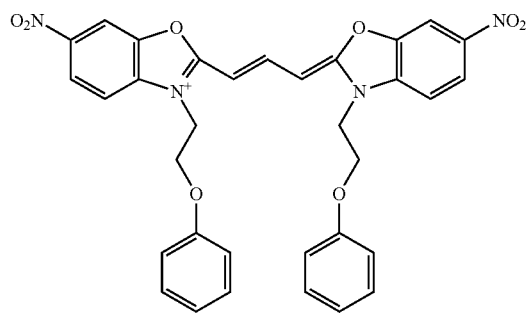
Compound No. 1-20
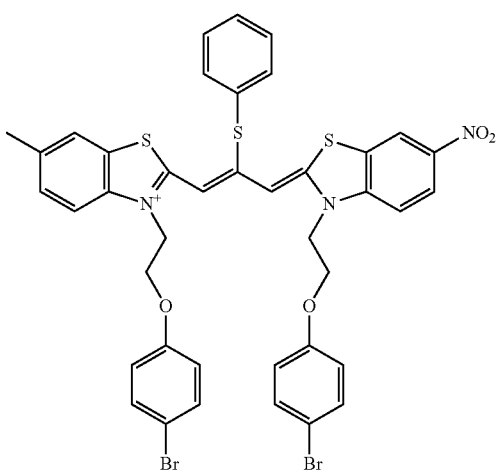
Compound No. 1-21
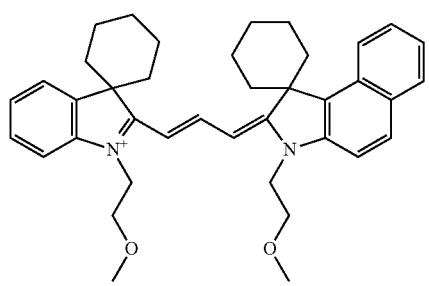
Compound No. 1-22
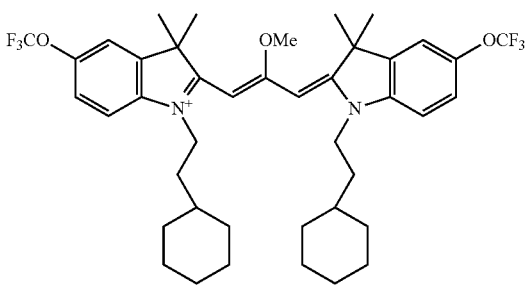
Compound No. 1-23
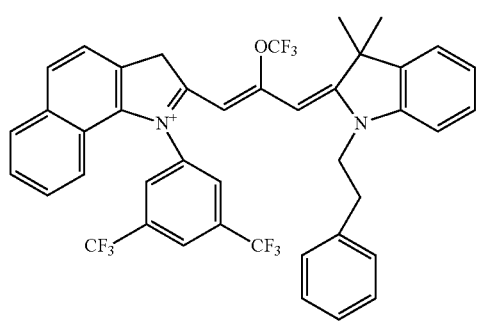
Compound No. 1-24
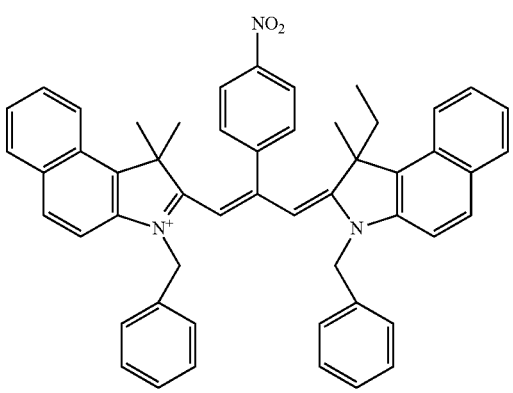

-continued
Compound No. 1-25
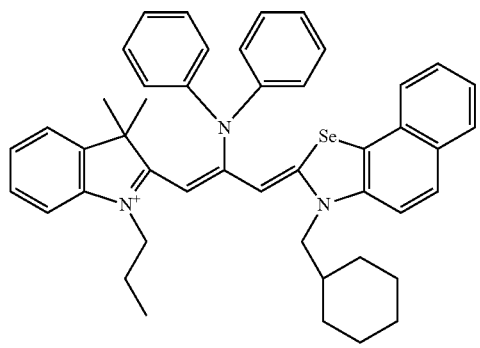
Compound No. 1-26
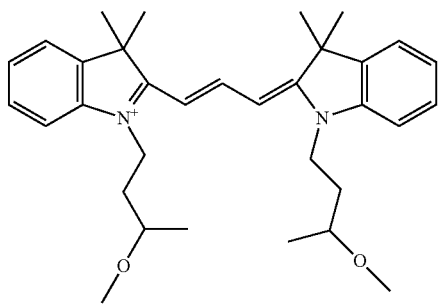
Compound No. 1-27
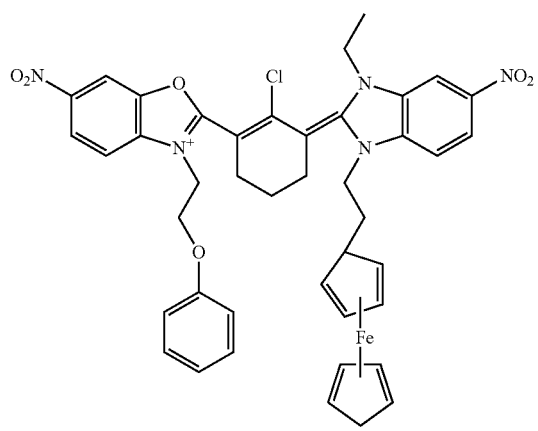
Compound No. 1-28
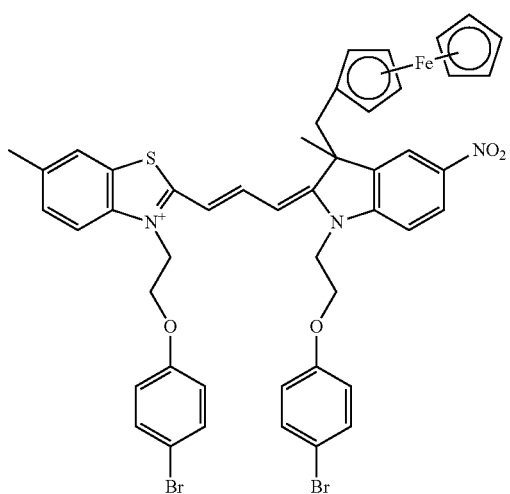
Compound No. 1-29
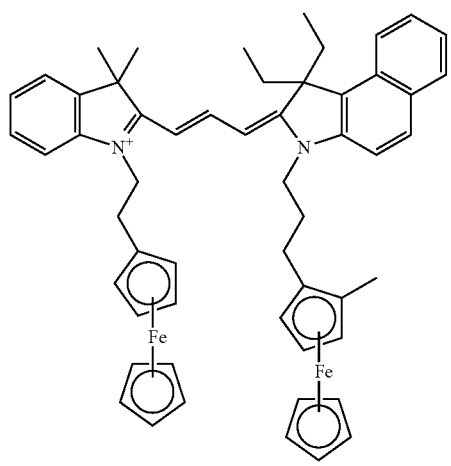
Compound No. 1-30
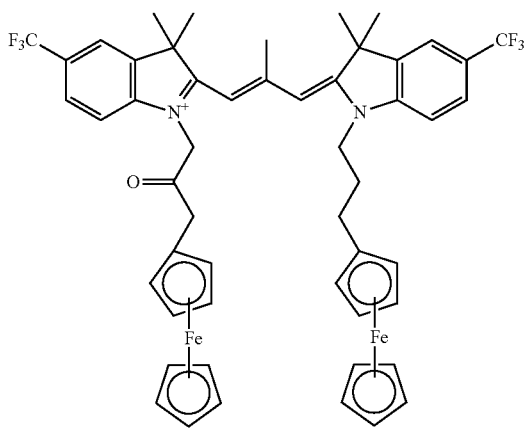

Compound No. 1-31
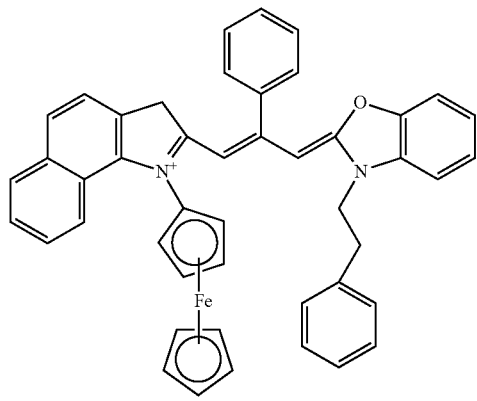
Compound No. 1-32
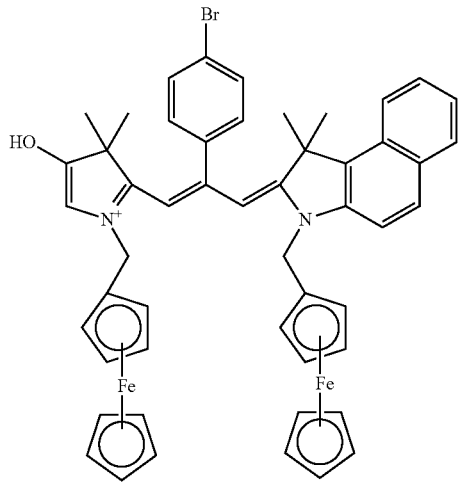
Compound No. 1-33
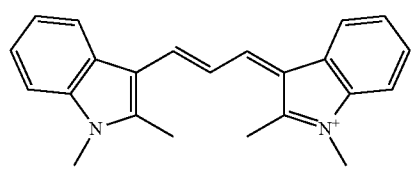
Compound No. 1-34
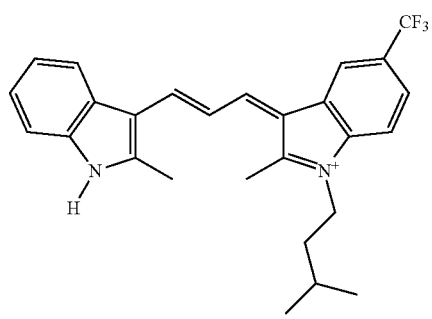
Compound No. 1-35
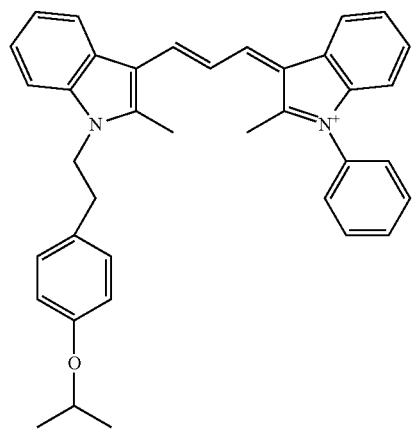
Compound No. 1-36
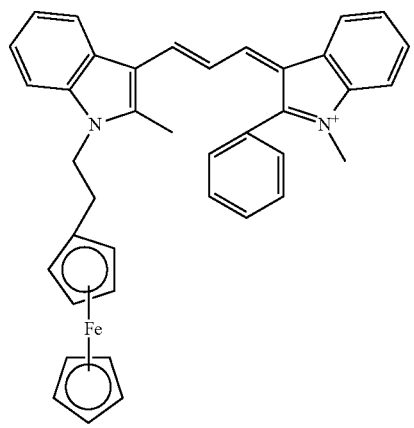
Compound No. 1-37
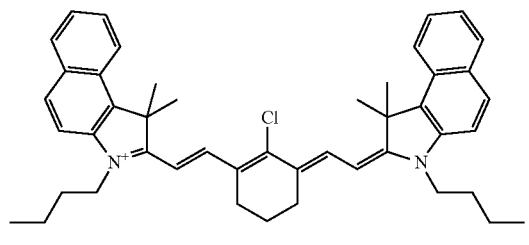
Compound No. 1-38
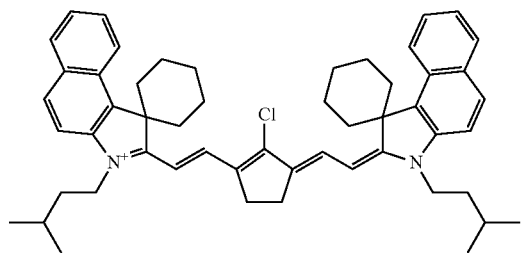

Compound No. 1-39
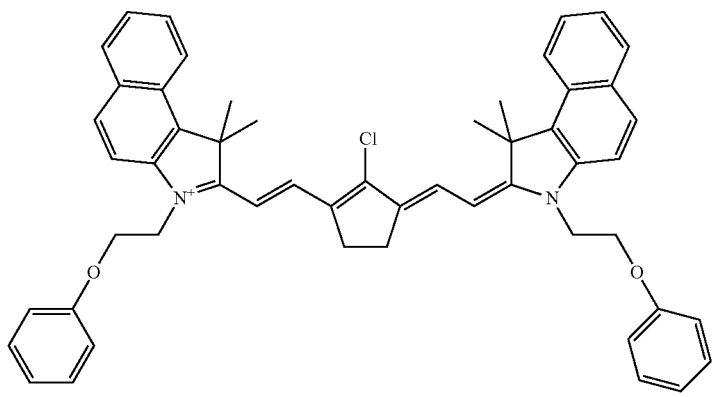
Compound No. 1-40
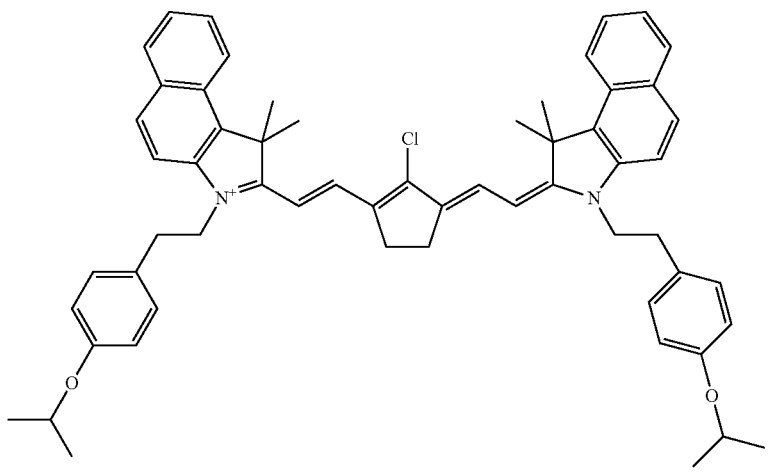
Compound No. 1-41
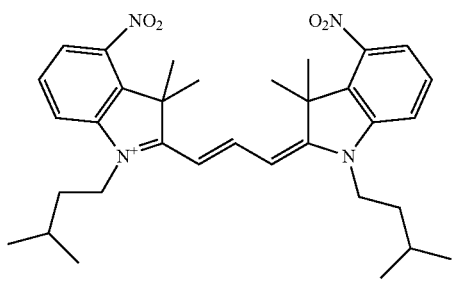
Compound No. 1-42
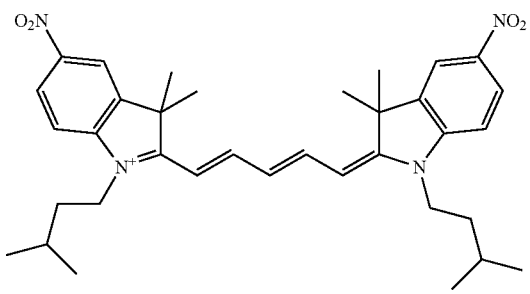
Compound No. 1-43
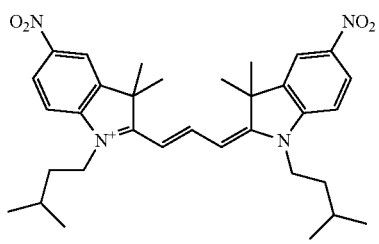
Compound No. 1-44
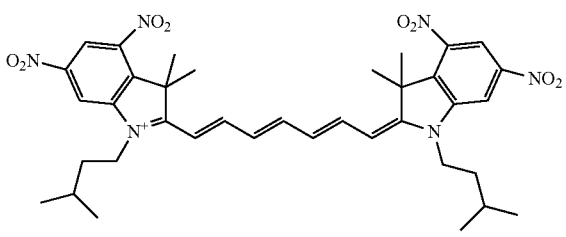

-continued
Compound No. 1-45
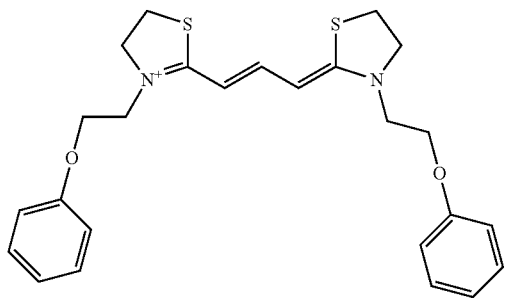
Compound No. 1-46
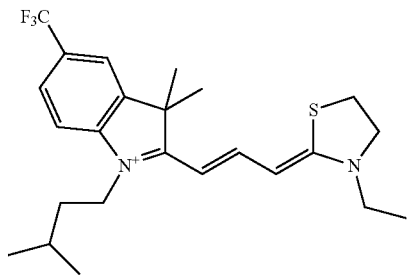
Compound No. 1-47
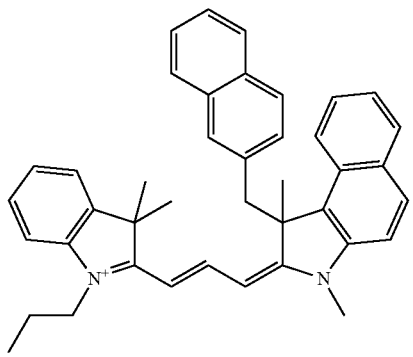
Compound No. 1-48
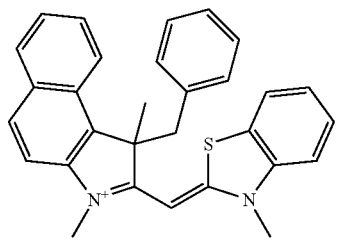
Compound No. 1-49
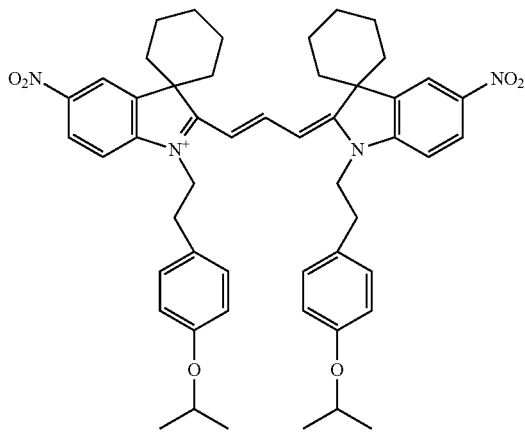
Compound No. 1-50
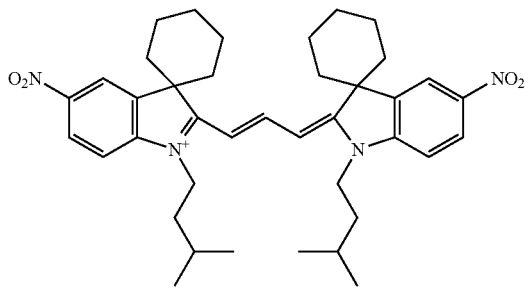
Compound No. 1-51
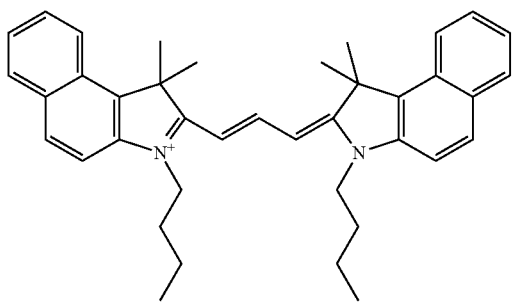
Compound No. 1-52
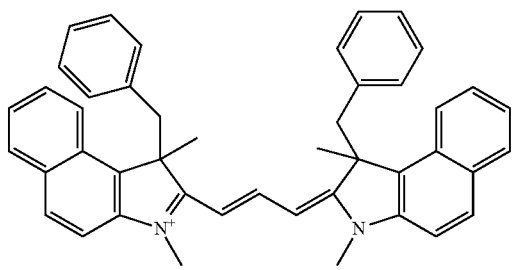

-continued
Compound No. 1-53
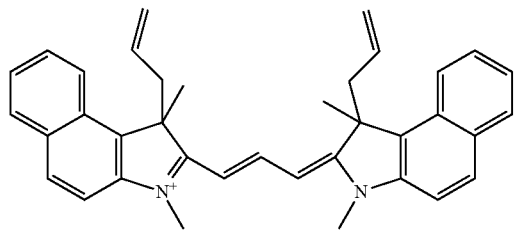
Compound No. 1-54
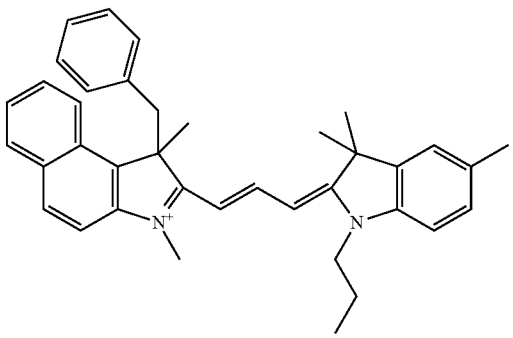
Compound No. 1-55
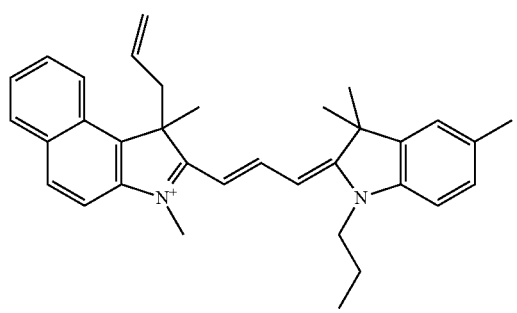
Compound No. 1-56
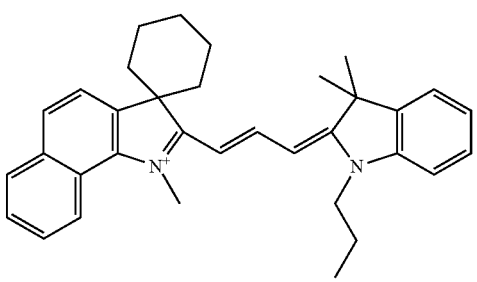
Compound No. 1-57
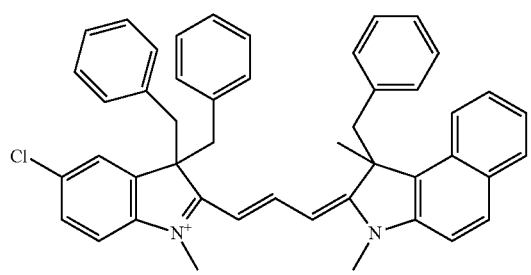
Compound No. 1-58
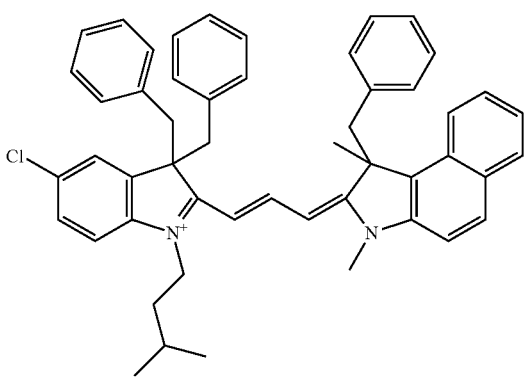
Compound No. 1-59
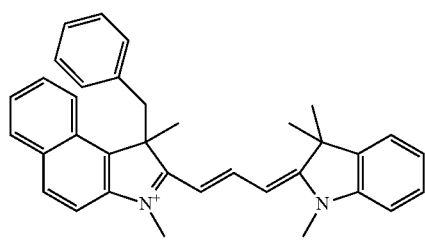
Compound No. 1-60
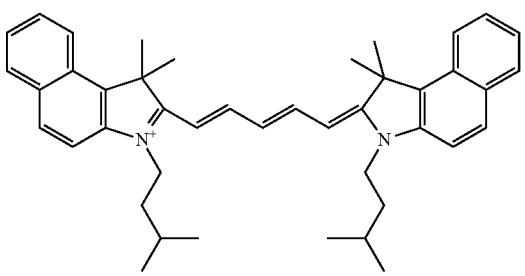

-continued
Compound No. 1-61
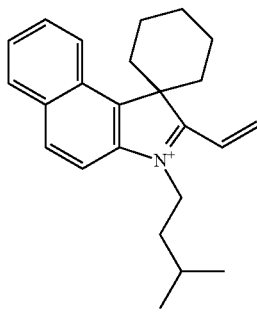
Compound No. 1-62
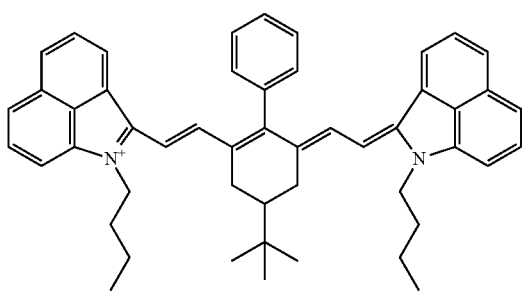
Compound No. 1-63
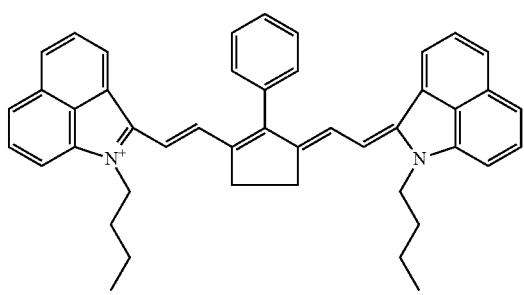
Compound No. 1-64
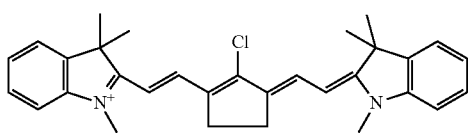
Compound No. 1-65
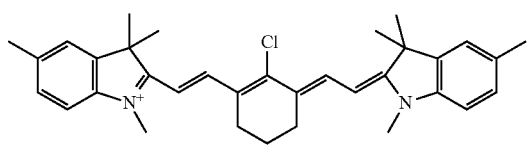
Compound No. 1-66
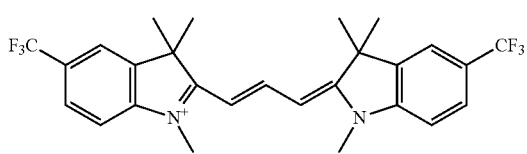
Compound No. 1-67
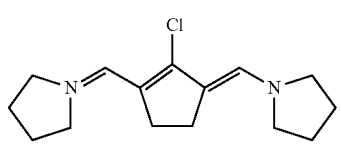
Compound No. 1-68
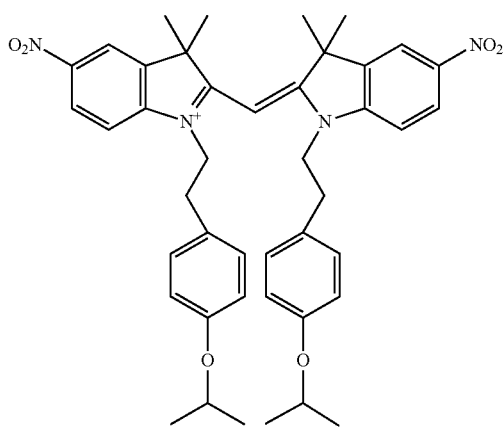
Compound No. 1-69
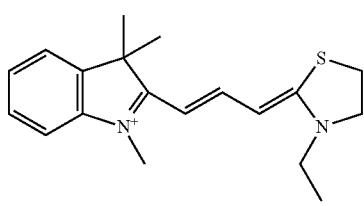
Compound No. 1-70
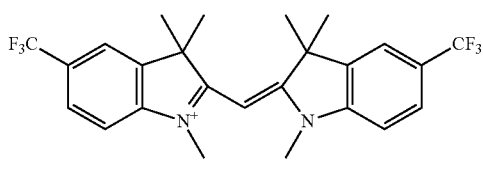
Compound No. 1-71
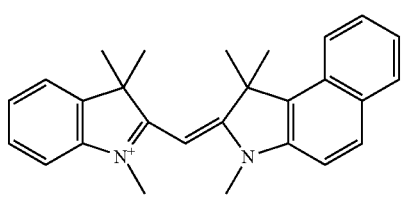

-continued
Compound No. 1-72
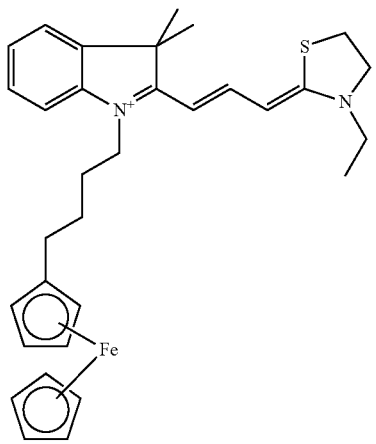
Compound No. 1-73
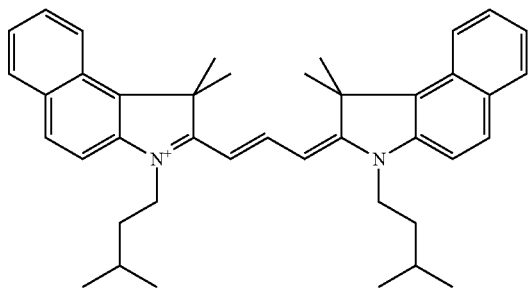
Compound No. 1-74
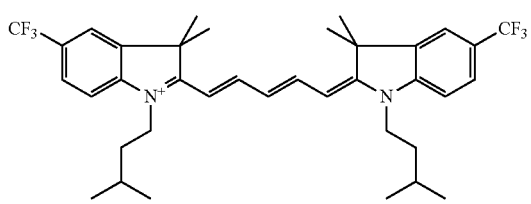
Compound No. 1-75
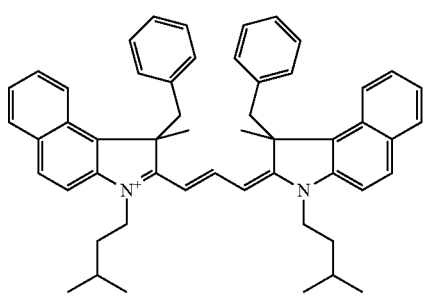
Compound No. 1-76
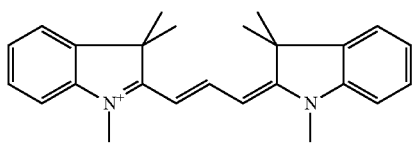
Compound No. 1-77
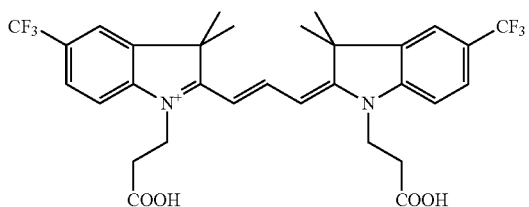
Compound No. 1-78
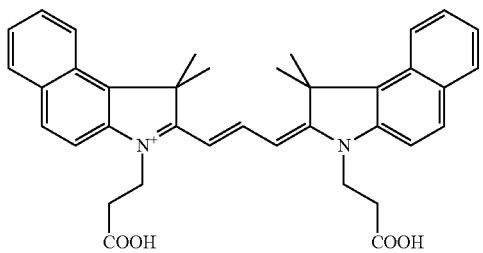
Compound No. 1-79
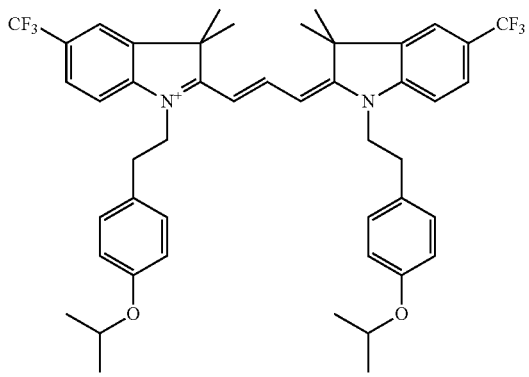

-continued
Compound No. 1-80
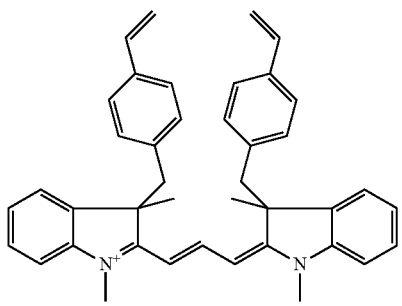
Compound No. 1-81
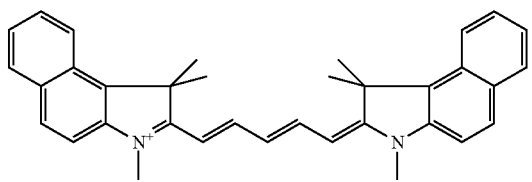
Compound No. 1-82
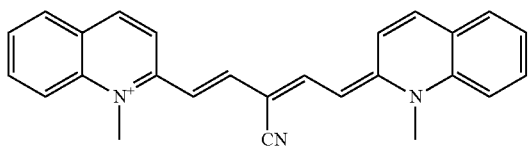
Compound No. 1-83
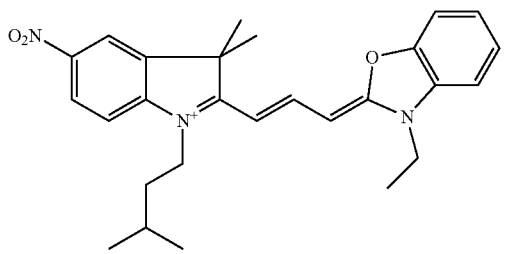
Compound No. 1-84
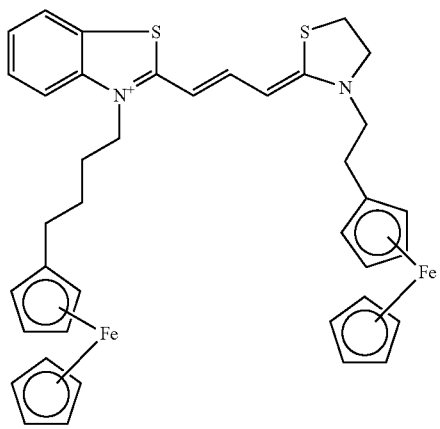
Compound No. 1-85
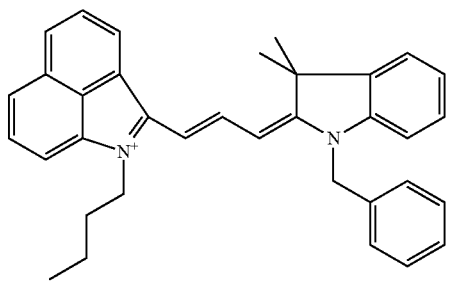
Compound No. 1-86
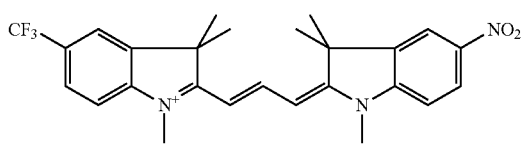
Compound No. 1-87
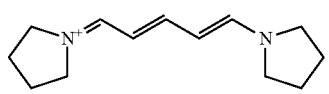
Compound No. 1-88
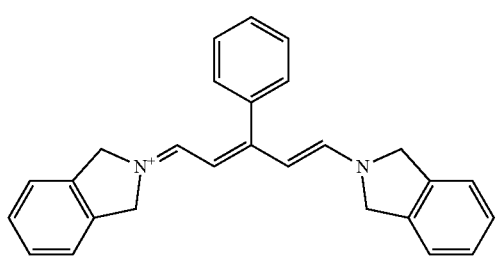
Compound No. 1-89
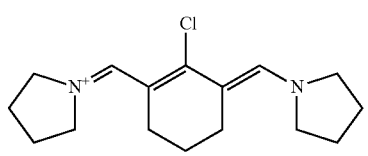

-continued
Compound No. 1-90
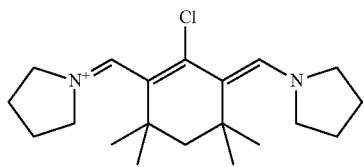
Compound No. 1-91
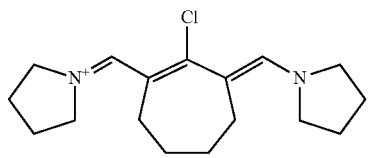
Compound No. 1-92
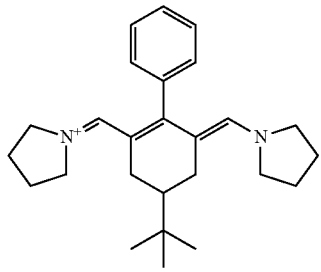
Compound No. 1-93
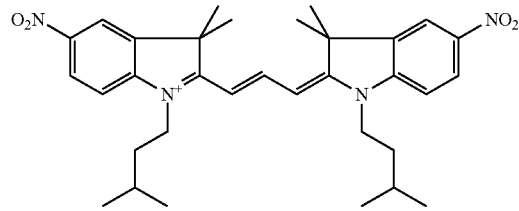
Compound No. 1-94
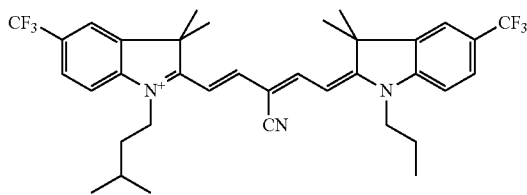
Compound No. 1-95
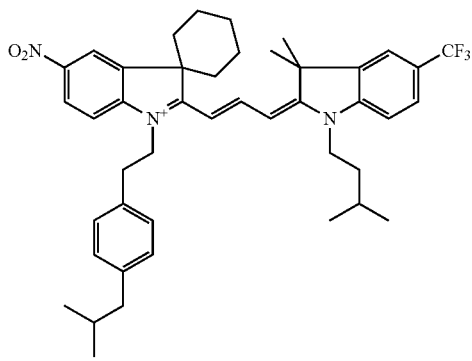
Compound No. 1-96
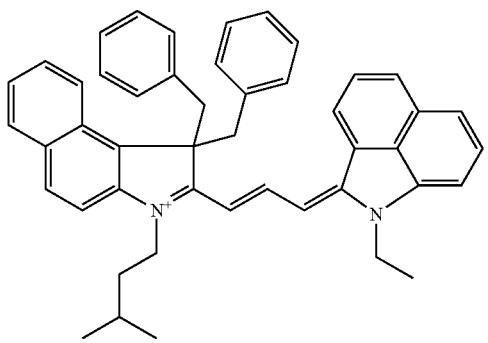
化合物 No. 1-97
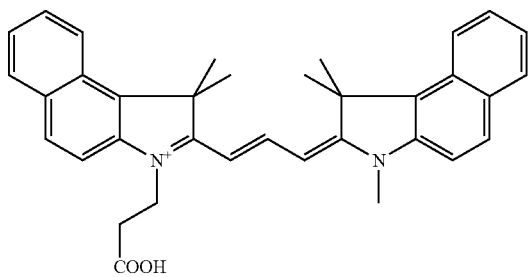
Compound No. 1-98
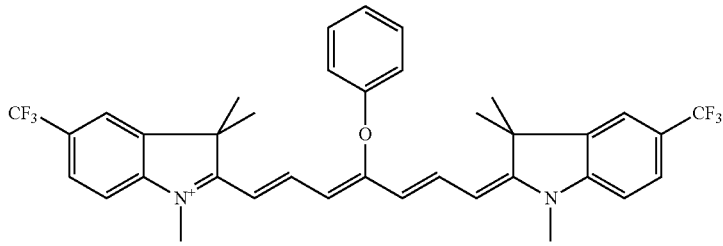

Compound No. 1-99
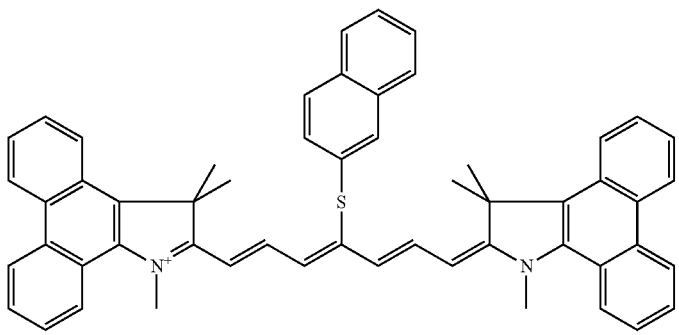
Specific examples of the compound represented by the above-mentioned general formula (2) according to the present invention may include the following compounds Nos. 2-1 to 2-70.
Compound No. 2-1
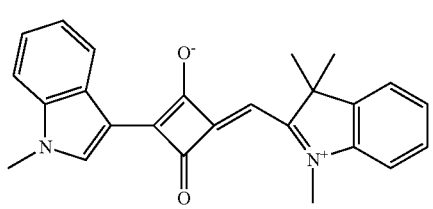
Compound No. 2-2
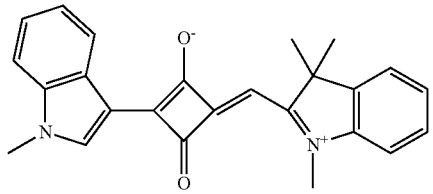
Compound No. 2-3
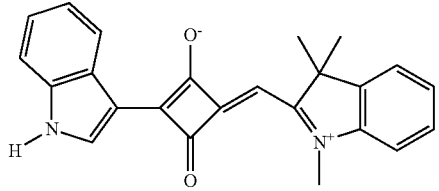
Compound No. 2-4
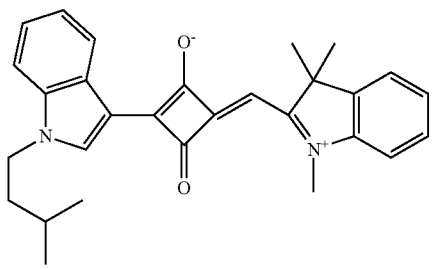
Compound No. 2-5
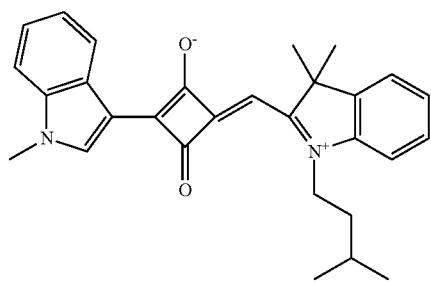
Compound No. 2-6
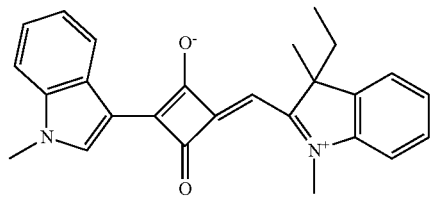
Compound No. 2-7
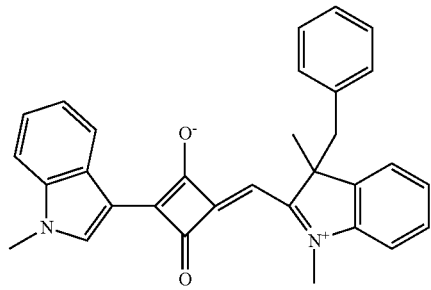
Compound No. 2-8
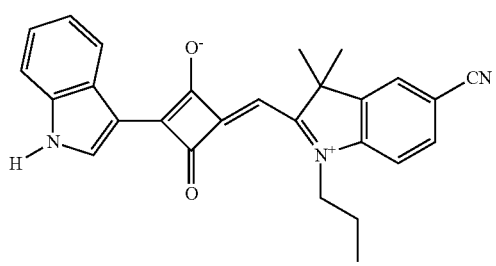

Compound No. 2-9
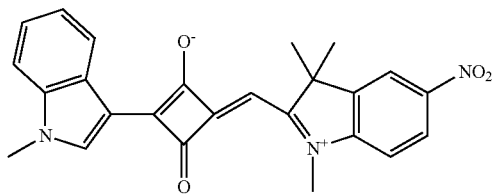
Compound No. 2-10
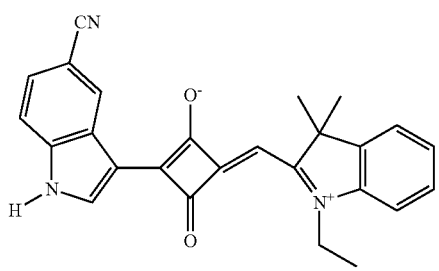
Compound No. 2-11
Compound No. 2-12
Compound No. 2-13
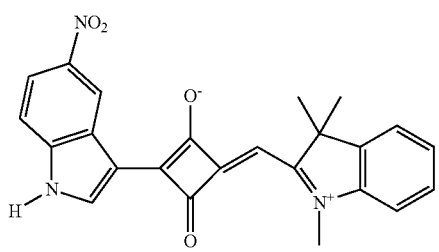
Compound No. 2-14
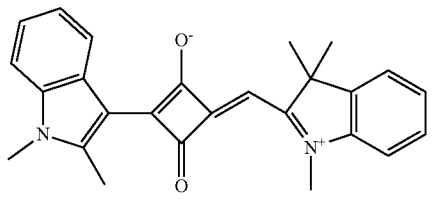
Compound No. 2-15
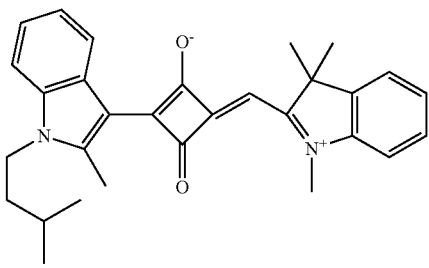
Compound No. 2-16
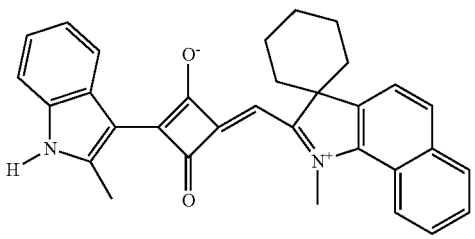
Compound No. 2-17
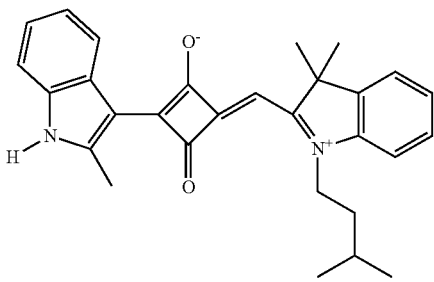
Compound No. 2-18
Compound No. 2-19
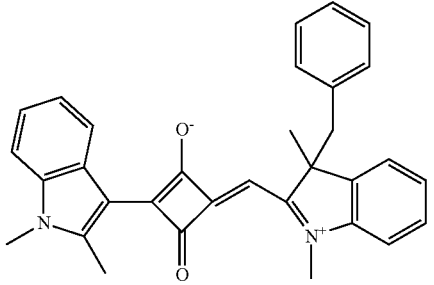

Compound No. 2-20
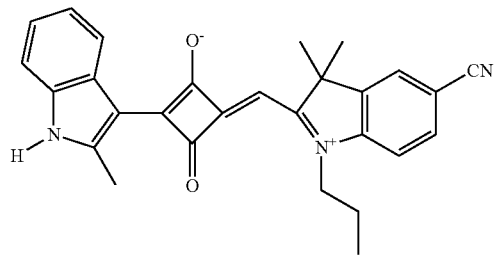
Compound No. 2-21
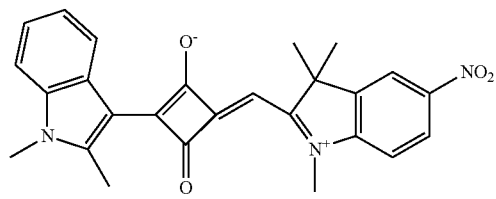
Compound No. 2-22
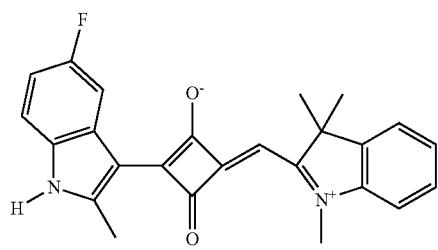
Compound No. 2-23
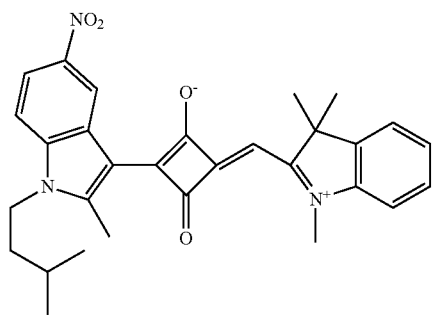
Compound No. 2-24
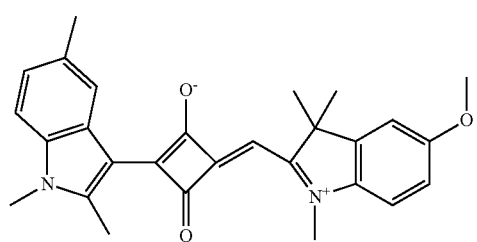
Compound No. 2-25
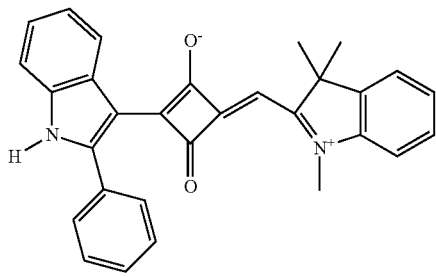
Compound No. 2-26
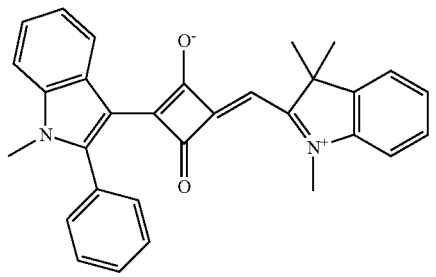
Compound No. 2-27
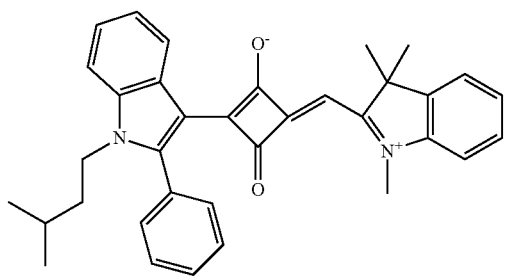
Compound No. 2-28
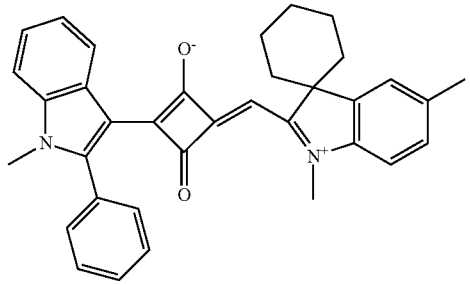
Compound No. 2-29
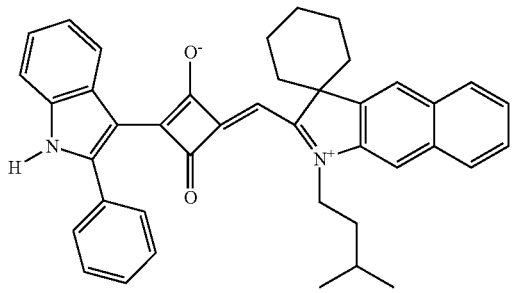

Compound No. 2-30
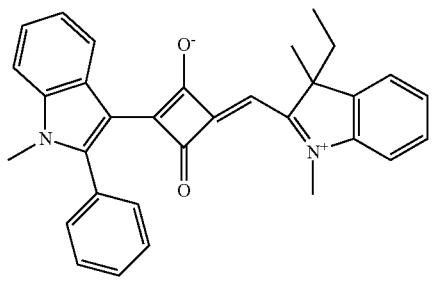
Compound No. 2-31
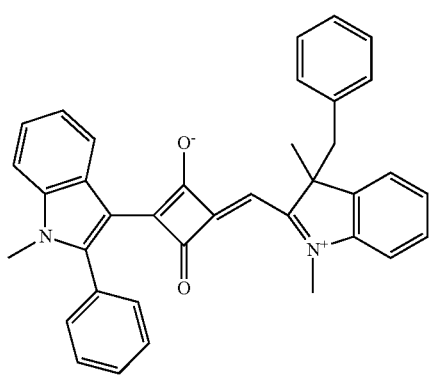
Compound No. 2-32
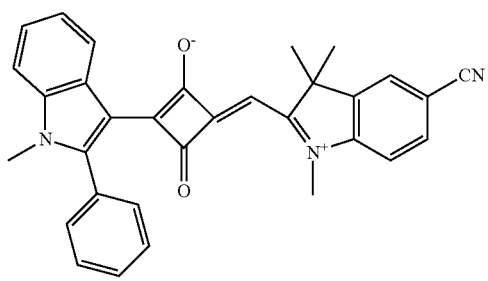
Compound No. 2-33
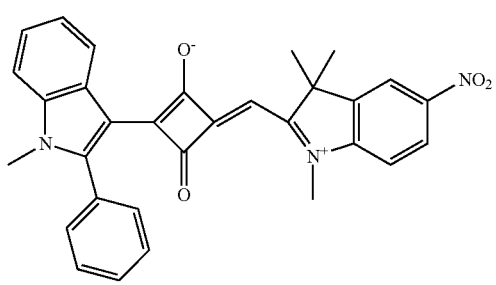
Compound No. 2-34
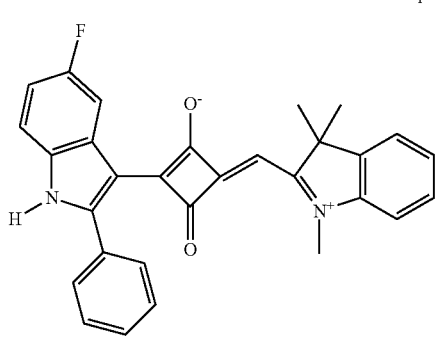
Compound No. 2-35
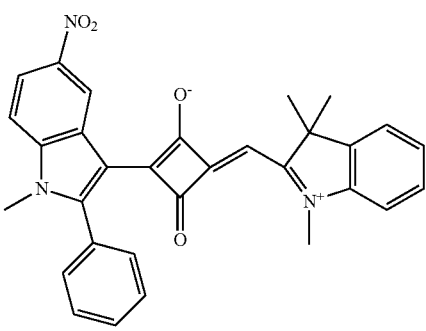
Compound No. 2-36
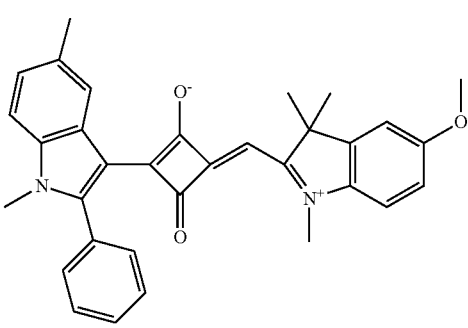
Compound No. 2-37
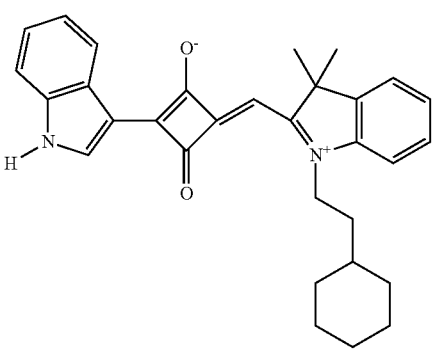
Compound No. 2-38
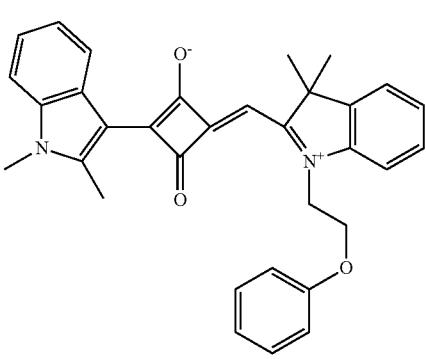

Compound No. 2-39
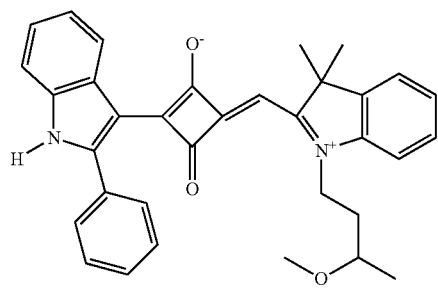
Compound No. 2-40
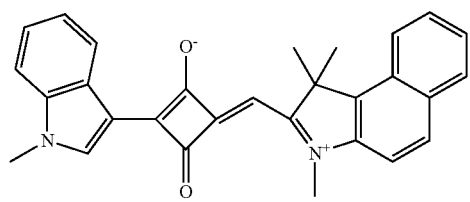
Compound No. 2-41
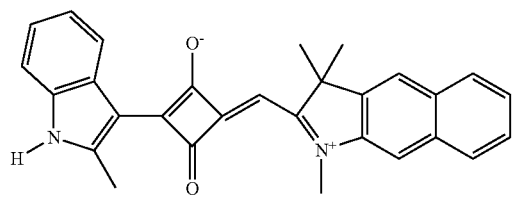
Compound No. 2-42
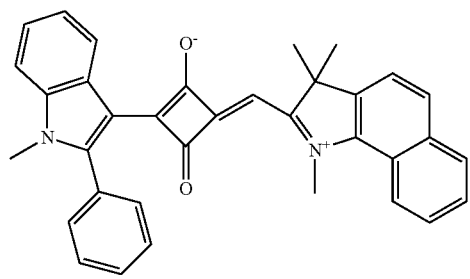
Compound No. 2-43
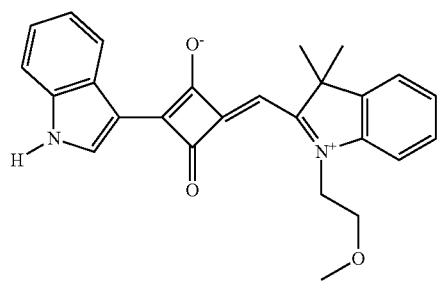
Compound No. 2-44
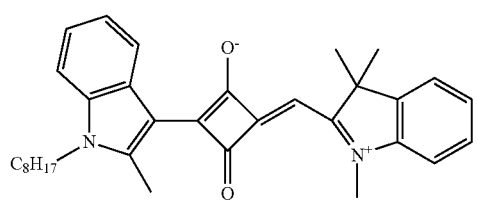
Compound No. 2-45
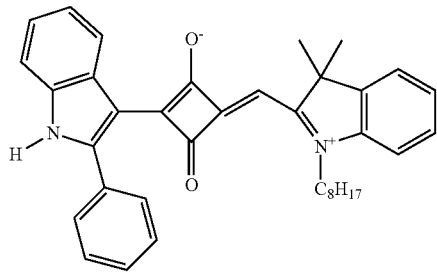
Compound No. 2-46
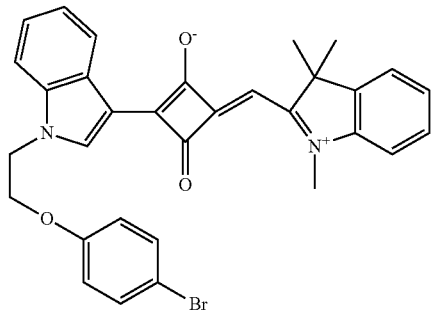
Compound No. 2-47
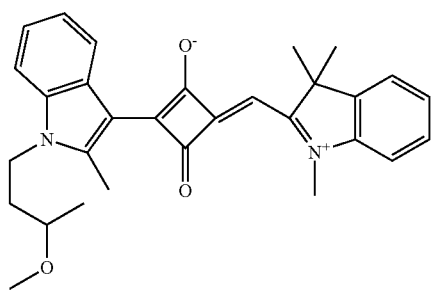
Compound No. 2-48
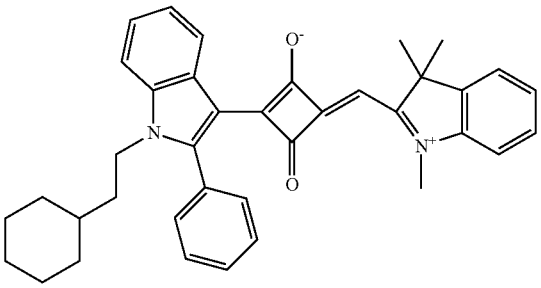
Compound No. 2-49
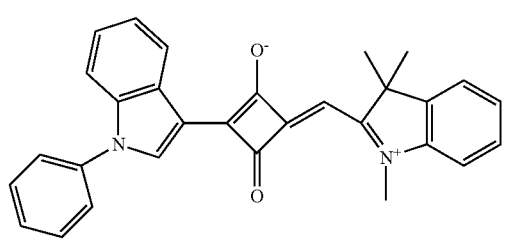

Compound No. 2-50
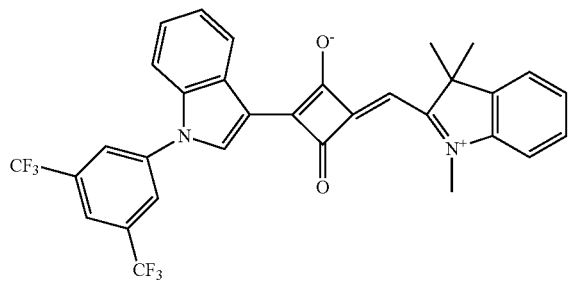
Compound No. 2-51
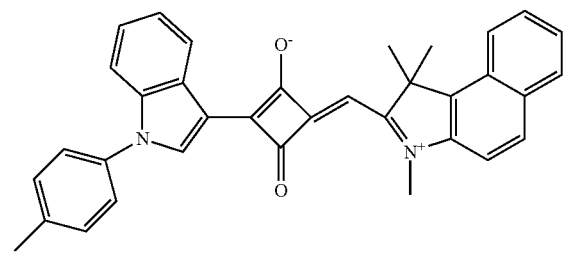
Compound No. 2-52
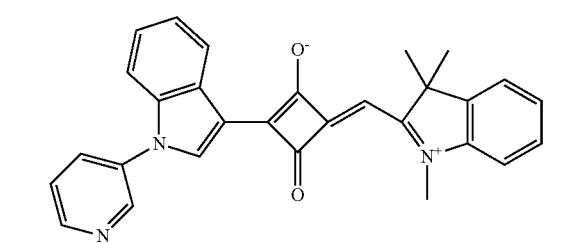
Compound No. 2-53
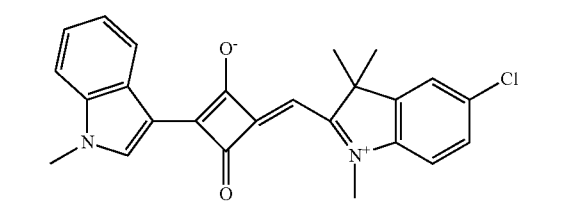
Compound No. 2-54
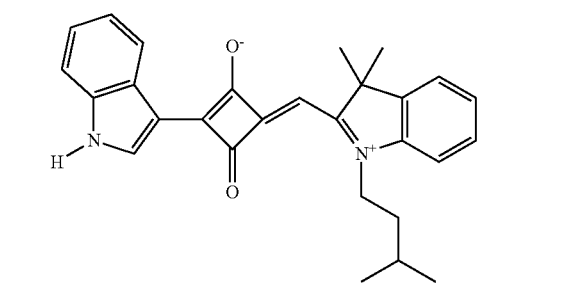
Compound No. 2-55
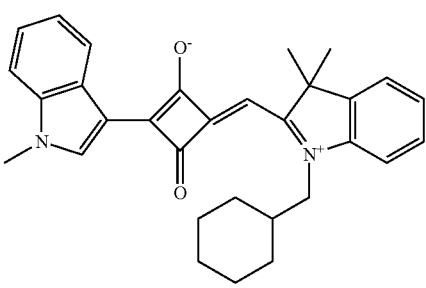
Compound No. 2-56
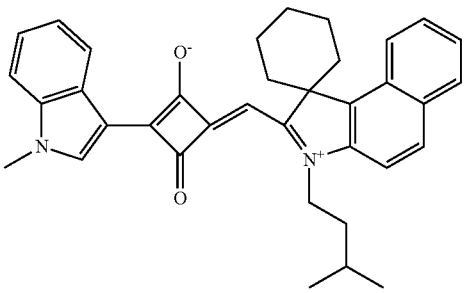
Compound No. 2-57
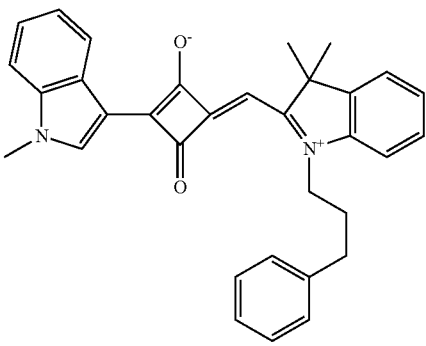
Compound No. 2-58
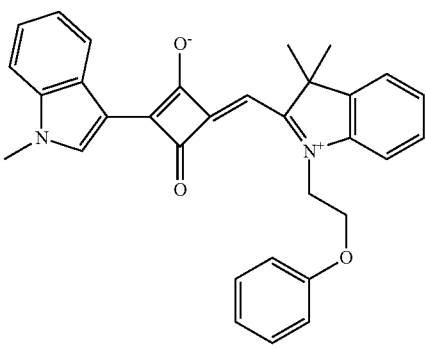
Compound No. 2-59
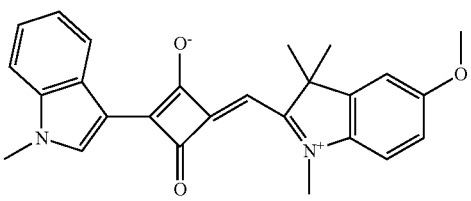

Compound No. 2-60
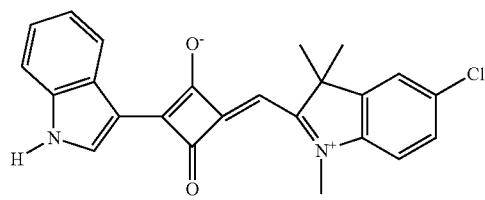
Compound No. 2-61
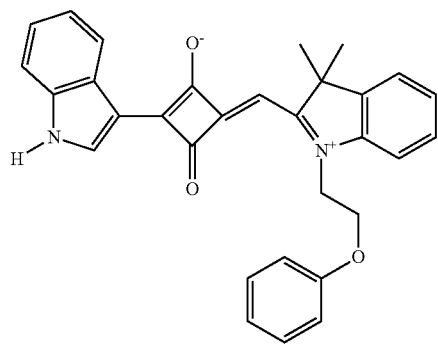
Compound No. 2-62
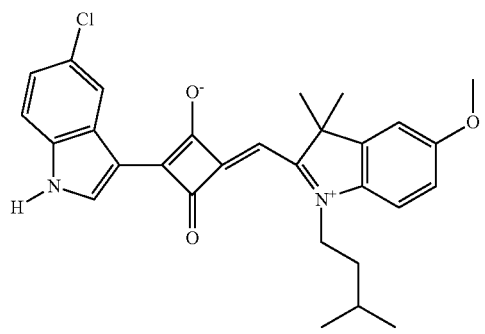
Compound No. 2-63
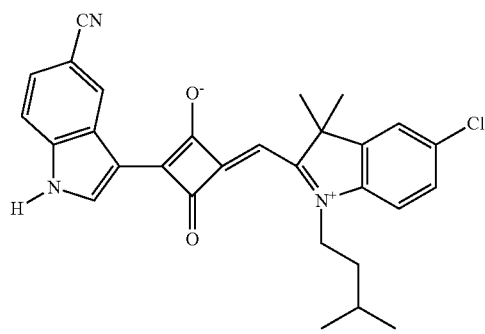
Compound No. 2-64
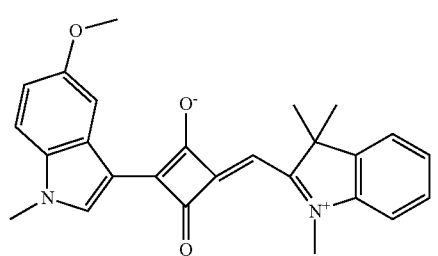
Compound No. 2-65
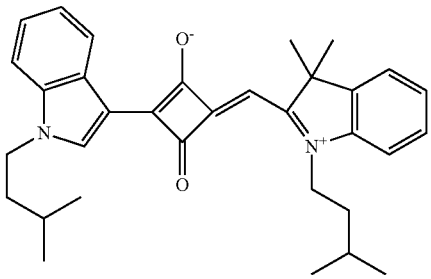
Compound No. 2-66
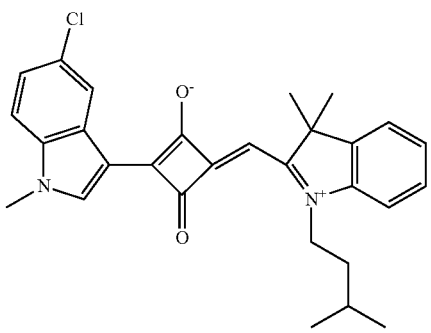
Compound No. 2-67
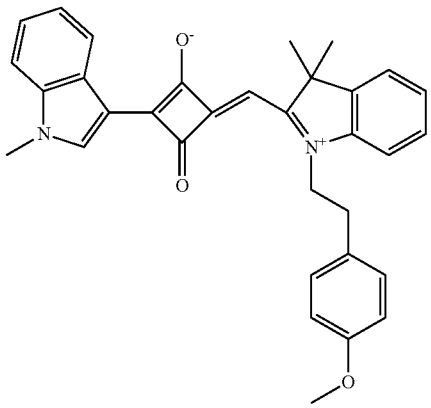
Compound No. 2-68
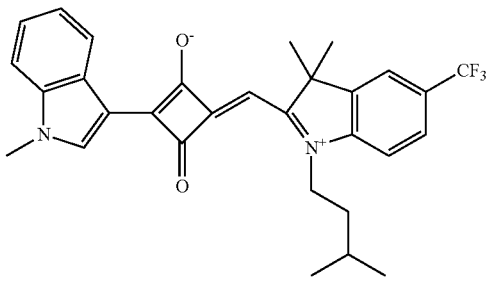

Compound No. 2-69
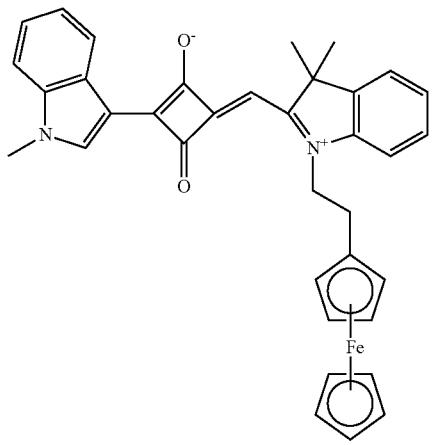
Compound No. 2-70
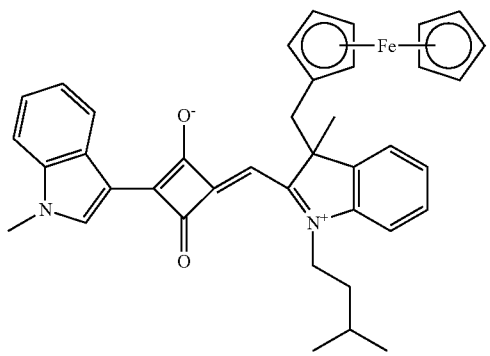
Specific examples of the compound represented by the above-mentioned general formula (3) according to the present invention may include the following compounds Nos. 3-1 to 3-23.
Compound No. 3-1
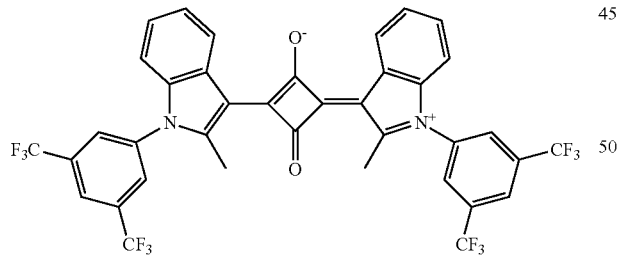
Compound No. 3-2
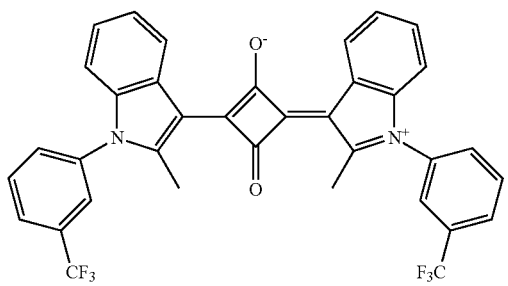
Compound No. 3-3
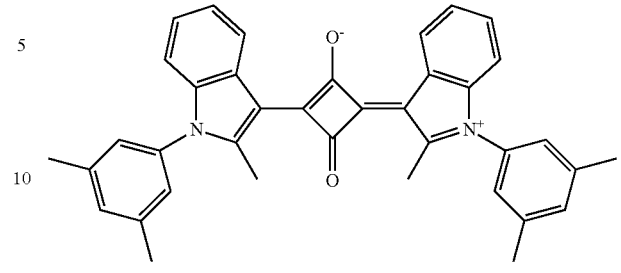
Compound No. 3-4
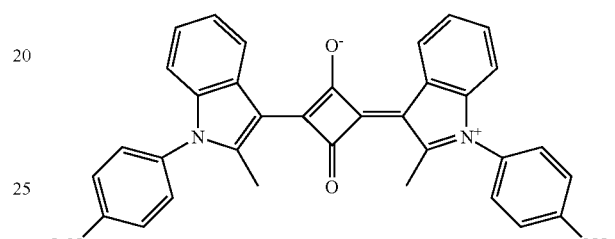
Compound No. 3-5
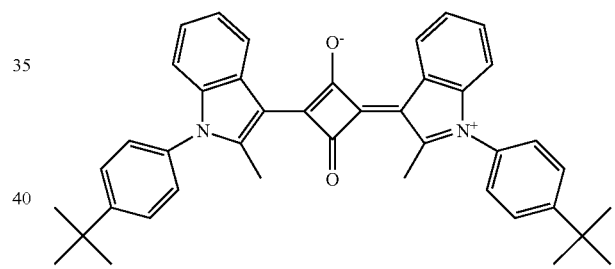
Compound No. 3-6
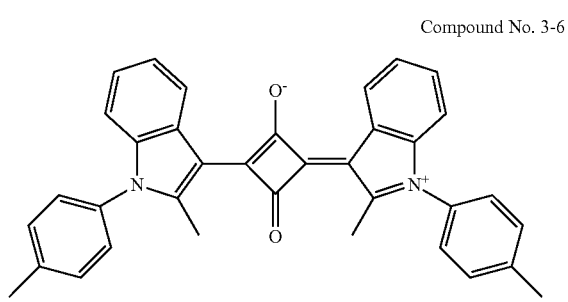
Compound No. 3-7
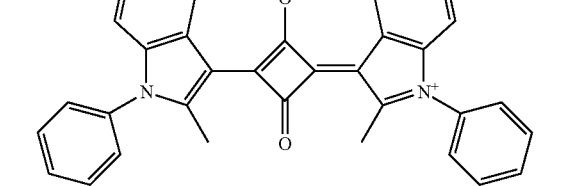

-continued
Compound No. 3-8
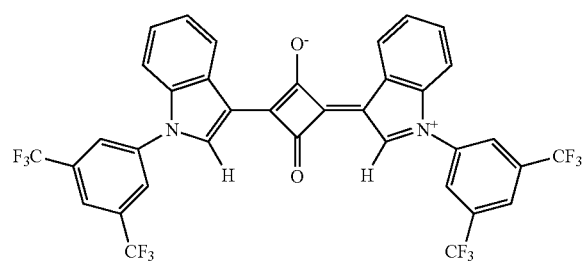
Compound No. 3-9
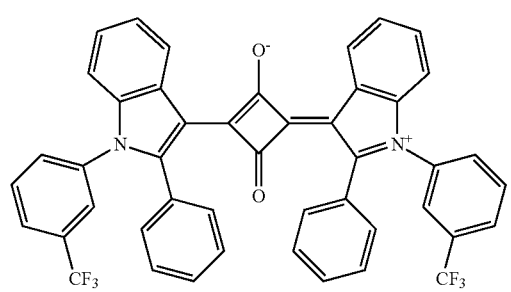
Compound No. 3-10
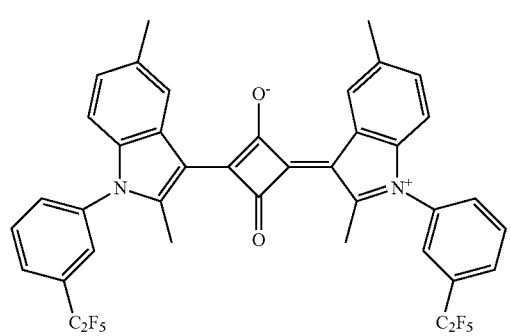
Compound No. 3-11
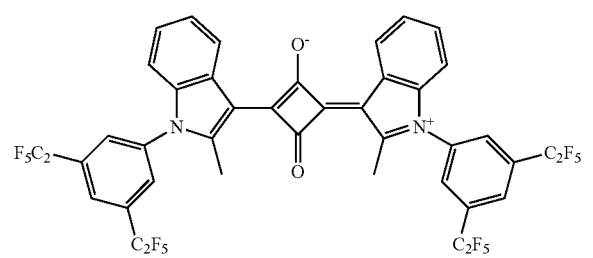
Compound No. 3-12
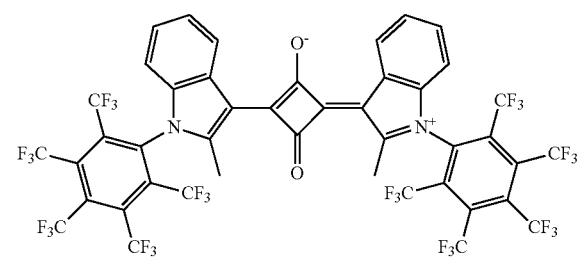
-continued
Compound No. 3-13
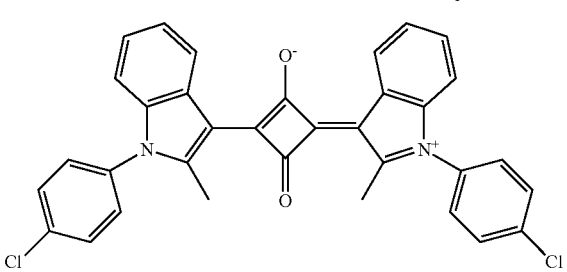
Compound No. 3-14
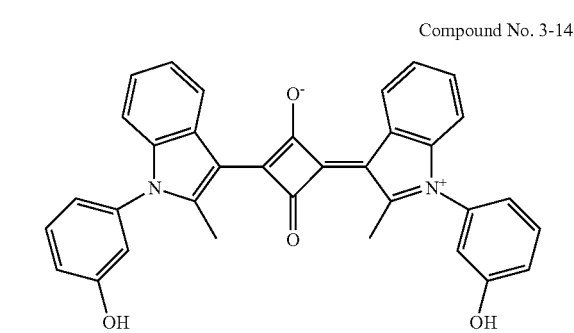
Compound No. 3-15
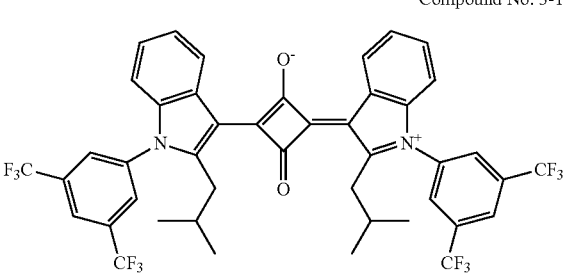
Compound No. 3-16
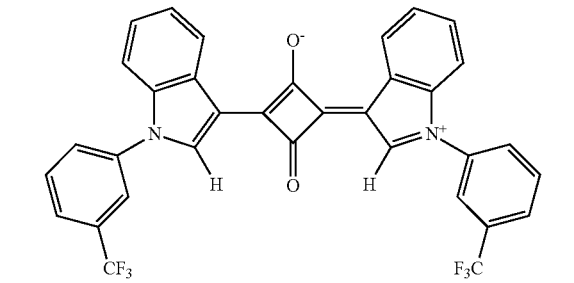
Compound No. 3-17
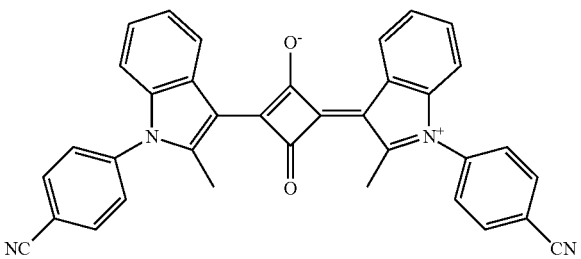

Compound No. 3-18
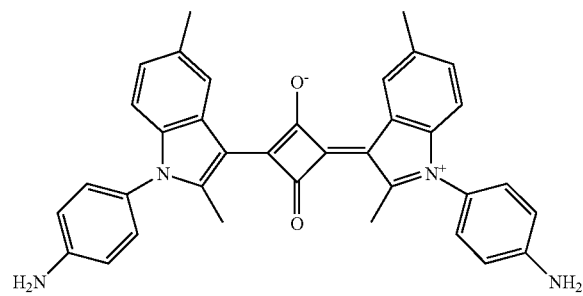
Compound No. 3-19
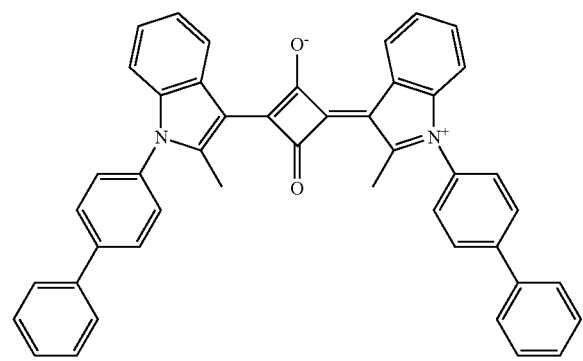
Compound No. 3-20
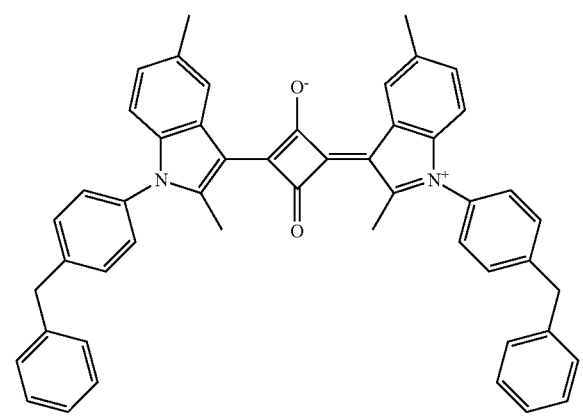
Compound No. 3-21
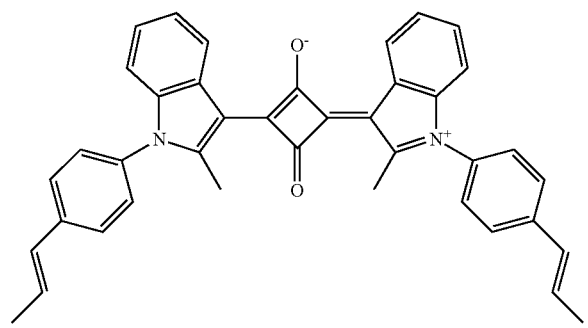
Compound No. 3-22
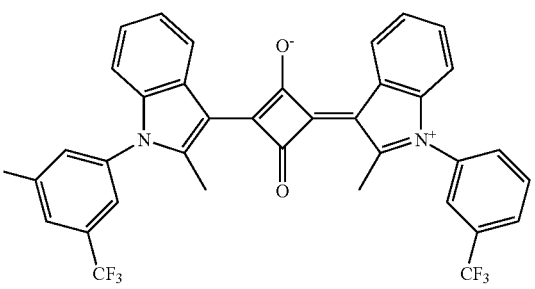
Compound No. 3-23
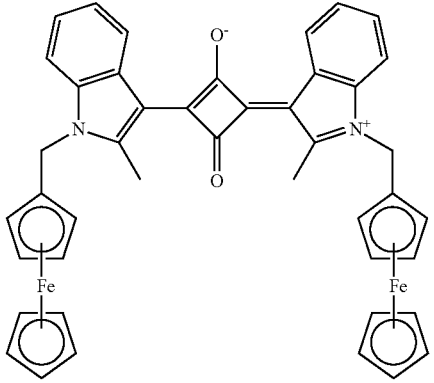
Specific examples of the compound represented by the above-mentioned general formula (4) according to the present invention may include the following compounds Nos. 4-1 to 4-40.
Compound No. 4-1
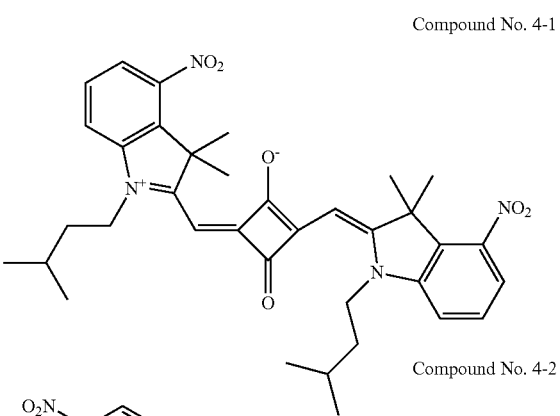
Compound No. 4-2
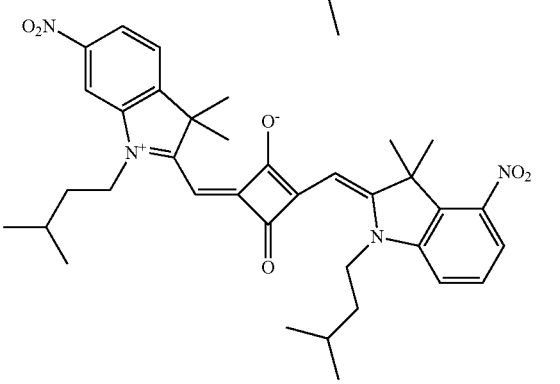

Compound No. 4-3
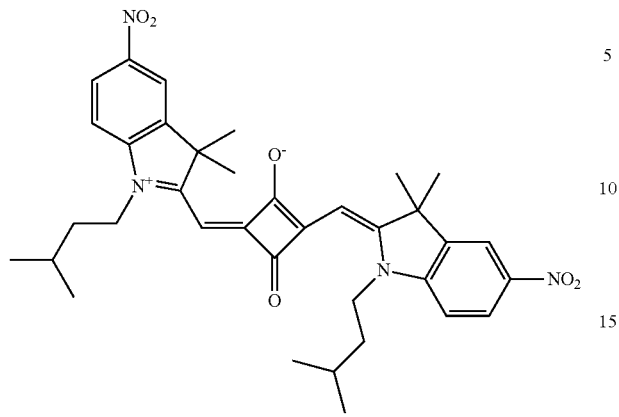
Compound No. 4-4
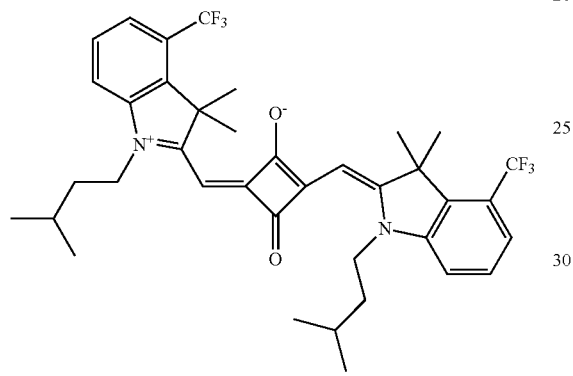
Compound No. 4-5
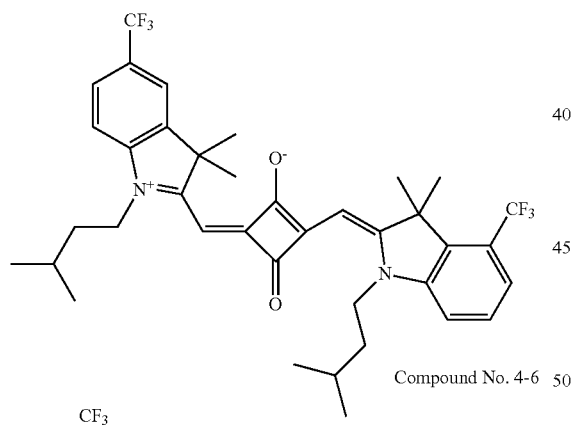
Compound No. 4-6
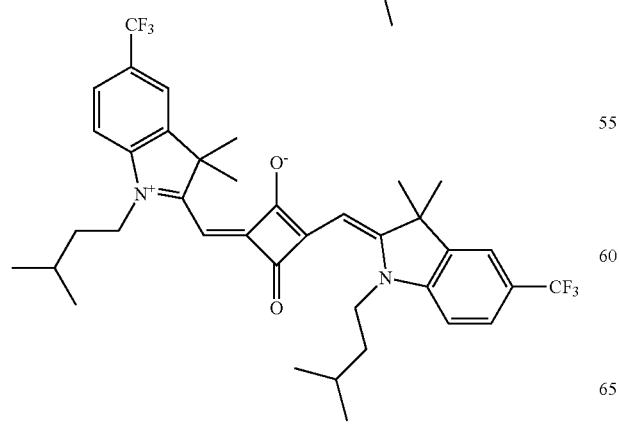
Compound No. 4-7
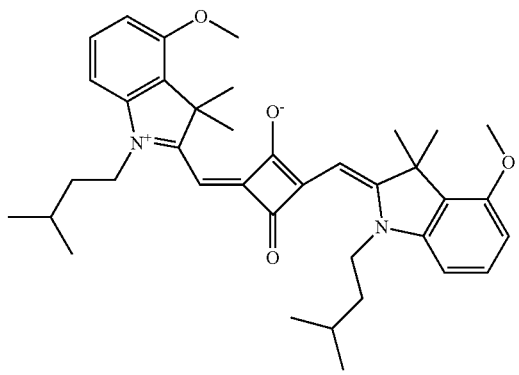
Compound No. 4-8
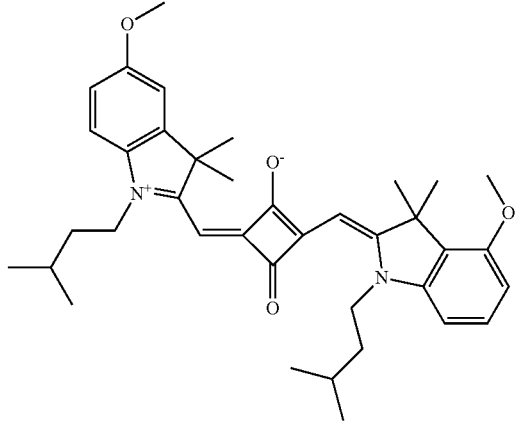
Compound No. 4-9
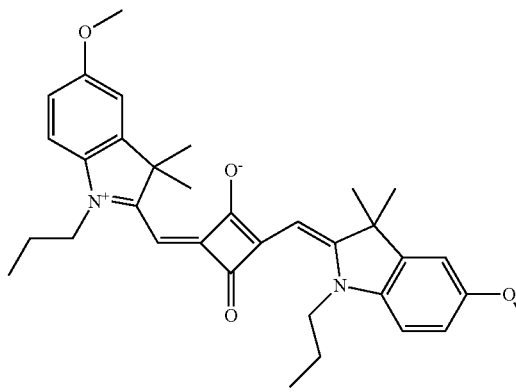
Compound No. 4-10
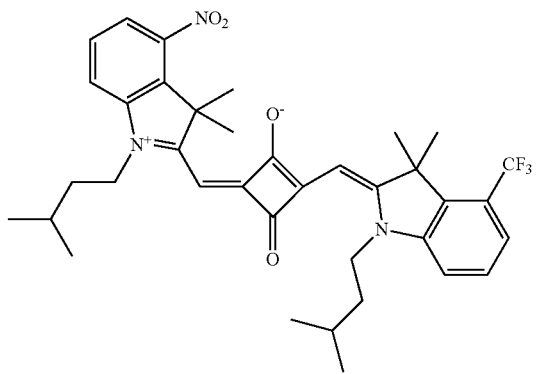

Compound No. 4-11
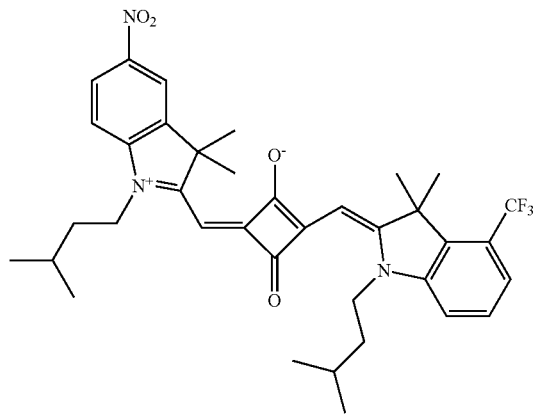
Compound No. 4-12
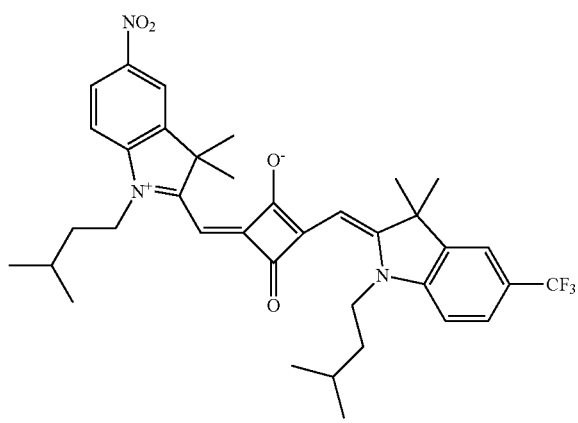
Compound No. 4-13
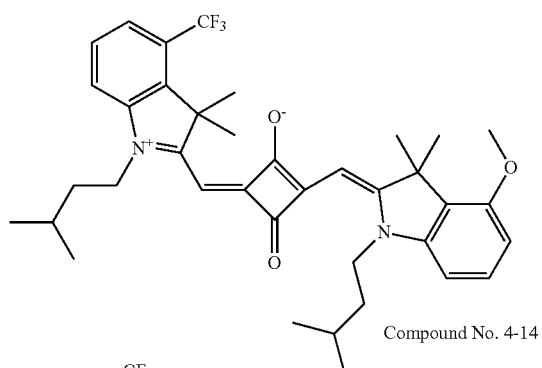
Compound No. 4-14
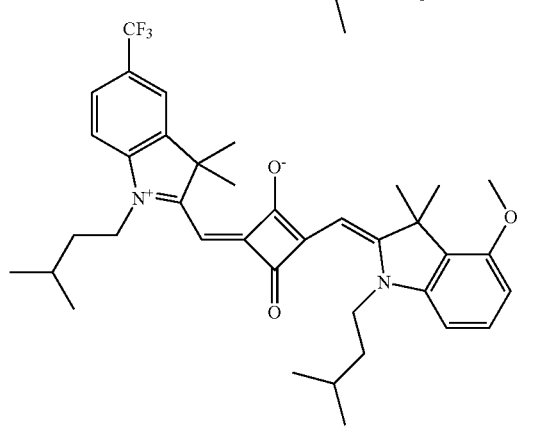
Compound No. 4-15
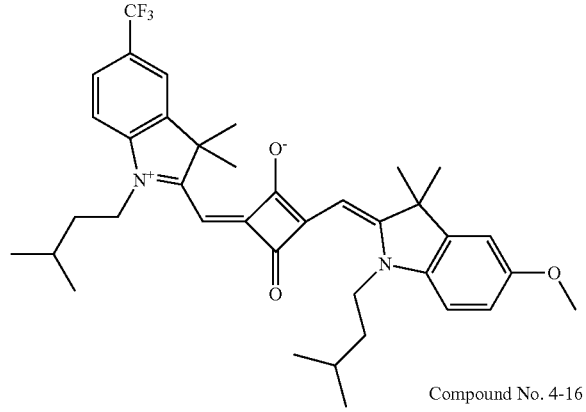
Compound No. 4-16
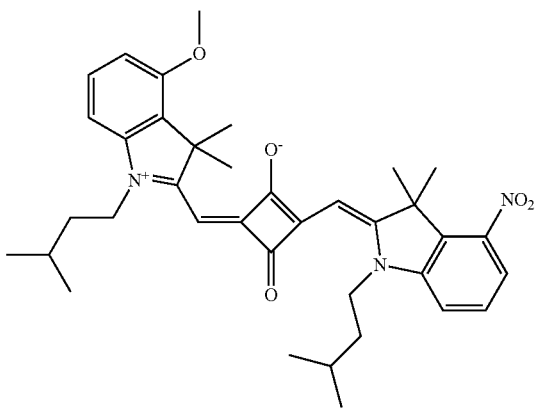
Compound No. 4-17
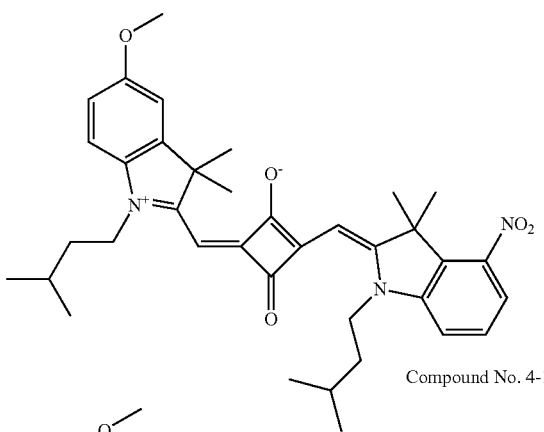
Compound No. 4-18
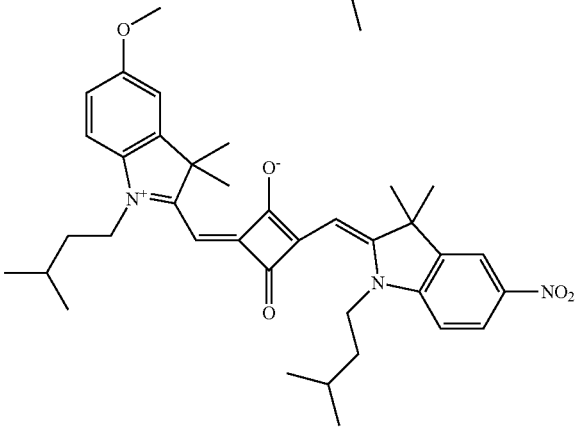

Compound No. 4-19
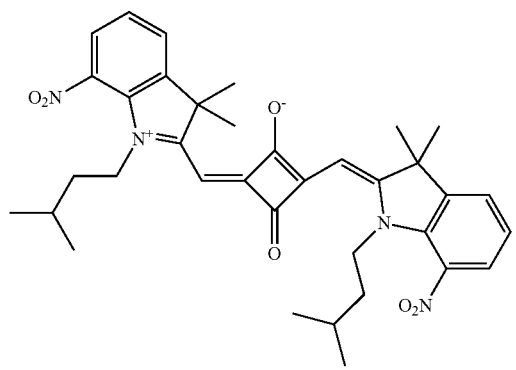
Compound No. 4-20
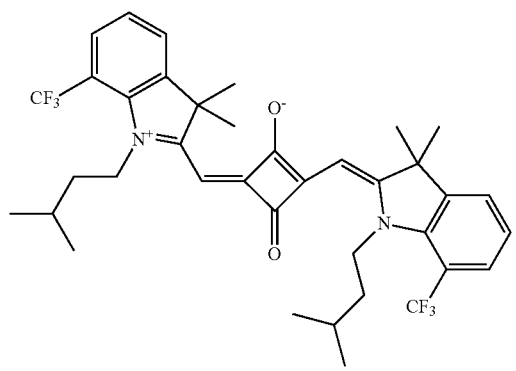
Compound No. 4-21
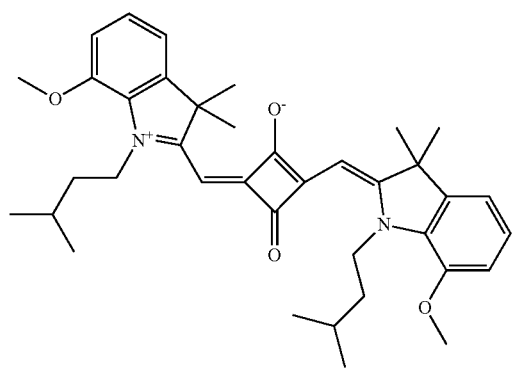
Compound No. 4-22
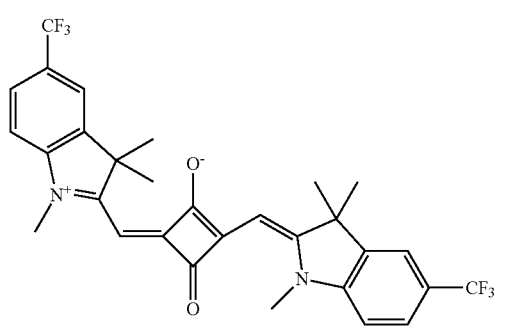
Compound No. 4-23
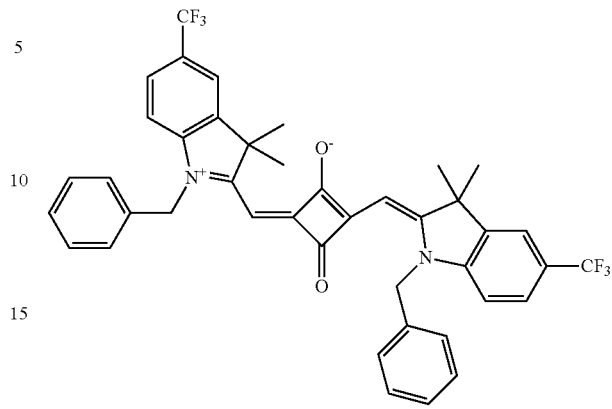
Compound No. 4-24
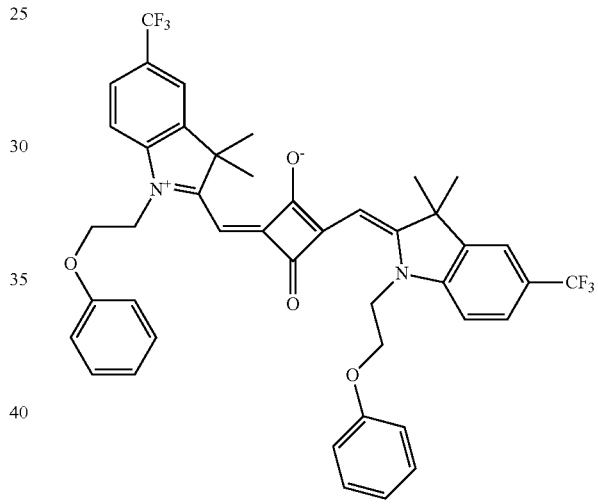
Compound No. 4-25
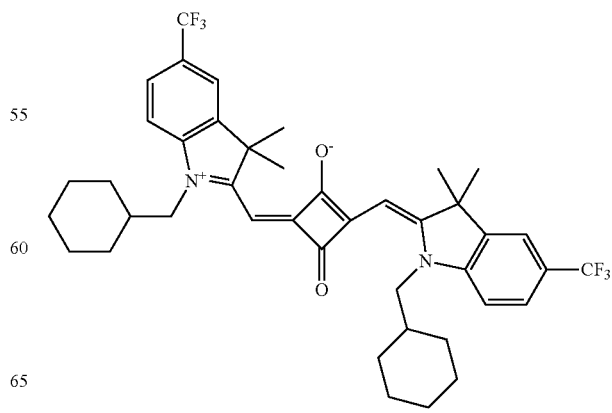

Compound No. 4-26
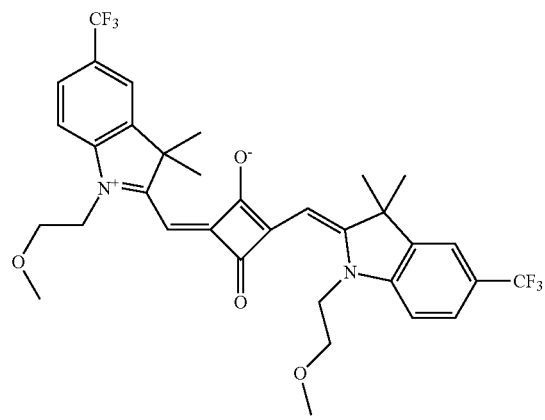
Compound No. 4-27
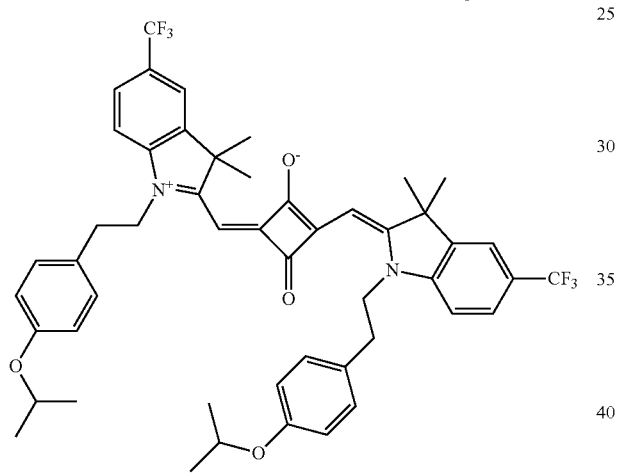
Compound No. 4-28
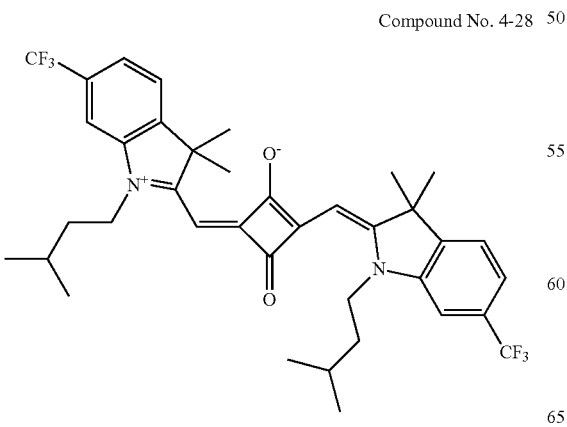
Compound No. 4-29
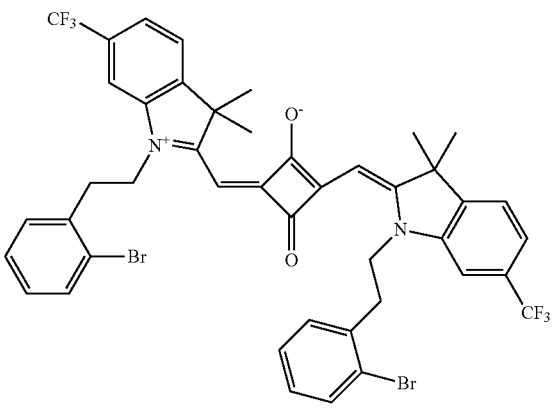
Compound No. 4-30
Compound No. 4-31

Compound No. 4-32
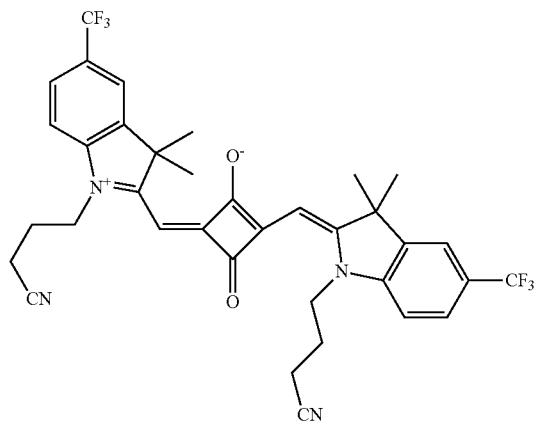
Compound No. 4-36
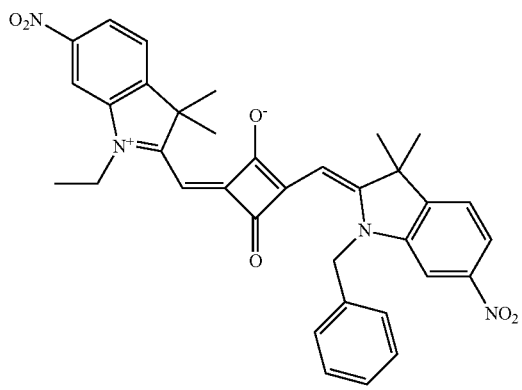
Compound No. 4-33
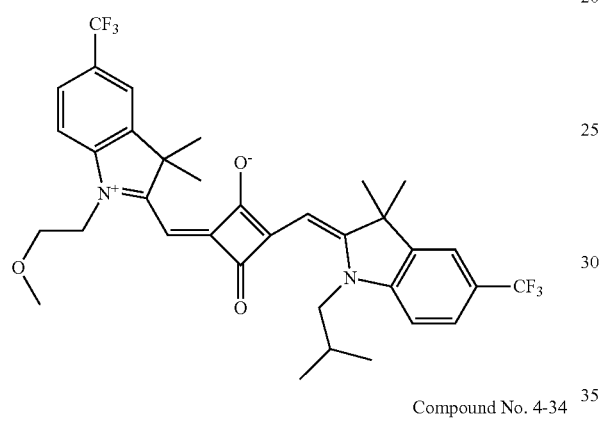
Compound No. 4-37
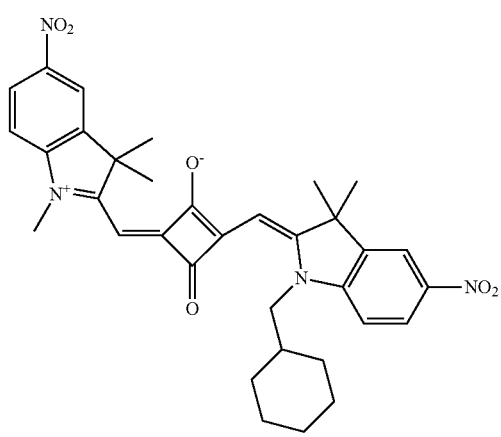
Compound No. 4-34
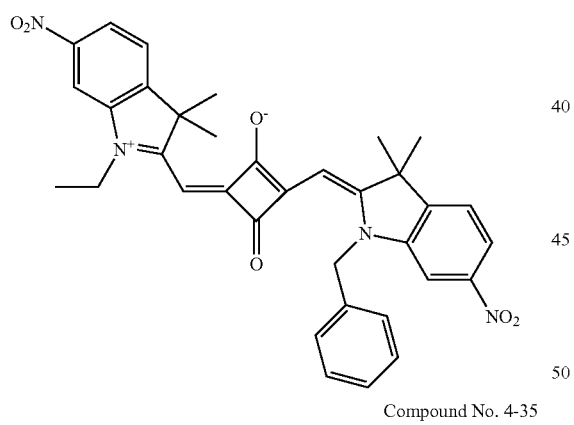
Compound No. 4-38
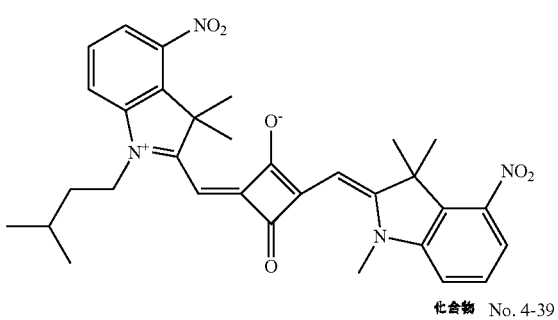
Compound No. 4-35
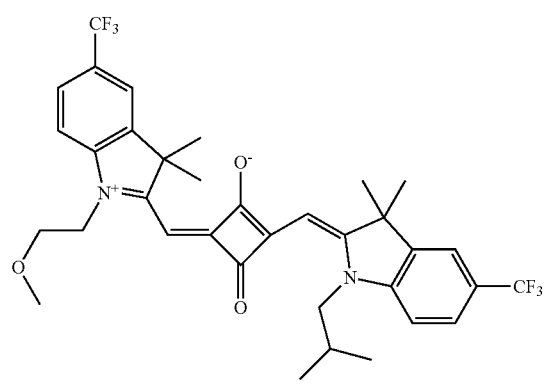
化合物 No. 4-39
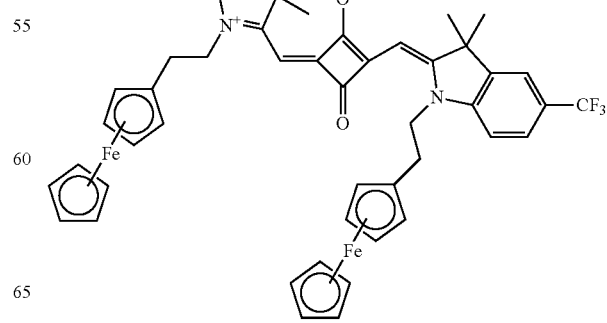

Compound No. 4-40

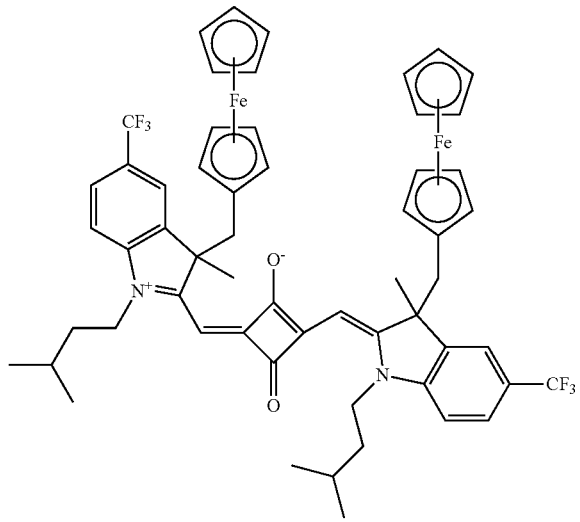

The methods for the production of the compounds represented by the above-mentioned general formulas (1) to (4) are not specifically limited, and the compounds can be obtained by methods utilizing well-known general reactions. Examples of the method for producing the compound represented by the above-mentioned general formula (1) may include a method including synthesizing by a reaction of a compound having a corresponding structure and an imine derivative, as exemplified by the route described in JP 2010-209191. Examples of the methods for the production of the compounds represented by the above-mentioned general formulas (2) to (4) may include a method including synthesizing by a reaction of a compound which will provides a ring structure having a corresponding structure and a square acid derivative, as exemplified by the routes described in JP 2004-315789A and JP 2007-19942A.

The dye (A) used in the colored composition of the present invention only needs to contain at least one kind of the compound represented by any of the above-mentioned general formulas (1) to (4), and a single dye or a combination of plural kinds can be used. Furthermore, it is possible to use a known dye besides the compounds represented by the above-mentioned general formulas (1) to (4). Examples of the known dye may include dyes such as azo dyes, anthraquinone dyes, indigoid dyes, triarylmethane dyes, xanthene dyes, alizarin dyes, acridine dyes, stilbene dyes, thiazole dyes, naphthol dyes, quinoline dyes, nitro dyes, indamine dyes, oxazine dyes, phthalocyanine dyes and cyanine dyes, and the like, and these may be used by mixing plural dyes.

In the dye (A) of the present invention, the content of the compounds represented by the above-mentioned general formulas (1) to (4) is preferably 50 to 100 mass %, more preferably 70 to 100 mass %. When the content of the compounds represented by the above-mentioned general formulas (1) to (4) is less than 50 mass %, the solubility in solvents may be decreased, or the heat-resistance may be decreased.

It is preferable that the above-mentioned dye (A) gives a maximum absorption wavelength (λmax) of preferably 430 to 700 nm, more preferably 430 to 610 nm, and further preferably 480 to 600 nm, to a coating. When the maximum absorption wavelength (λmax) of the coating is lower than 430 nm, light of the intended wavelength is not absorbed, and thus the effect of the present invention may not be exerted, whereas when the maximum absorption wavelength is more than 700 nm, the heat-resistance may be lowered.

In the colored composition of the present invention, the content of the dye (A) of the present invention is preferably 0.01 to 50 mass %, more preferably 0.1 to 30 mass % in the colored composition of the present invention. In the case when the content of the dye (A) is less than 0.01 mass %, a color of a desired concentration may not be obtained in the cured product of the present invention, whereas when the content is more than 50 mass %, precipitation of the dye (A) may occur in the colored composition.

<Polymerizable Compound having Ethylenically Unsaturated Bond (B)>

The above-mentioned polymerizable compound having an ethylenically unsaturated bond (B) is not specifically limited, and those having been conventionally used in photosensitive compositions can be used, and examples may include unsaturated aliphatic hydrocarbons such as ethylene, propylene, butylene, isobutylene, vinyl chloride, vinylidene chloride, vinylidene fluoride and tetrafluoroethylene; unsaturated polybasic acids such as (meth)acrylic acid, α-chloroacrylic acid, itaconic acid, maleic acid, citraconic acid, fumaric acid, himic acid, crotonic acid, isocrotonic acid, vinyl acetate, allyl acetate, cinnamic acid, sorbic acid, mesaconic acid, mono[2-(meth)acryloyoxyethyl]succinate, mono[2-(meth)acryloyoxyethyl]phthalate, mono(meth)acrylates of polymers having a carboxy group and a hydroxyl group on the both terminals such as ω-carboxypolycaprolactone mono(meth)acrylate, hydroxyethyl (meth)acrylate maleate, hydroxypropyl(meth)acrylate maleate, dicyclopentadiene maleate or multifunctional (meth)acrylates having one carboxyl group and two or more (meth)acryloyl groups; esters of unsaturated monobasic acids and polyhydric alcohols or polyhydric phenols such as 2-hydroxyethyl(meth)acrylate, 2-hydroxypropyl (meth)acrylate, glycidyl(meth)acrylate, the following compounds No. 121 to No. 124, methyl(meth)acrylate, butyl (meth)acrylate, isobutyl(meth)acrylate, t-butyl(meth) acrylate, cyclohexyl(meth)acrylate, n-octyl(meth)acrylate, isooctyl(meth)acrylate, isononyl(meth)acrylate, stearyl (meth)acrylate, lauryl(meth)acrylate, methoxyethyl(meth) acrylate, dimethylaminomethyl(meth)acrylate, dimethylaminoethyl(meth)acrylate, aminopropyl(meth)acrylate, dimethylaminopropyl(meth)acrylate, ethoxyethyl(meth) acrylate, poly(ethoxy)ethyl(meth)acrylate, butoxyethoxyethyl(meth)acrylate, ethyl hexyl(meth)acrylate, phenoxyethyl (meth)acrylate, tetrahydrofuryl(meth)acrylate, vinyl(meth) acrylate, allyl(meth)acrylate, benzyl(meth)acrylate, ethylene glycol di(meth)acrylate, diethylene glycol di(meth)acrylate, triethylene glycol di(meth)acrylate, polyethylene glycol di(meth)acrylate, propylene glycol di(meth)acrylate, 1,4-butanediol di(meth)acrylate, 1,6-hexanediol di(meth)acrylate, trimethylolethane tri(meth)acrylate, trimethylolpropane tri (meth)acrylate, dipentaerythritol penta(meth)acrylate, dipentaerythritol hexa(meth)acrylate, pentaerythritol tetra(meth) acrylate, pentaerythritol tri(meth)acrylate, tricyclodecanedimethylol di(meth)acrylate, tri[(meth)acryloylethyl]isocyanurate and polyester(meth)acrylate oligomer; metal salts of unsaturated polybasic acids such as zinc (meth)acrylate and magnesium (meth)acrylate; acid anhydrides of unsaturated polybasic acids such as maleic anhydride, itaconic anhydride, citraconic anhydride, methyltetrahydrophthalic anhydride, tetrahydrophthalic anhydride, trialkyltetrahydrophthalic anhydride, 5-(2,5-dioxotetrahydrofuryl)-3-methyl-3-cyclohexene-1,2-dicarboxylic anhydride, trialkyltetrahydrophthalic anhydride-maleic anhydride additive, dodecenyl succinic anhydride and methylhimic anhydride; amides of unsaturated monobasic acids and polyvalent amines such as (meth)acrylamide, methylene bis-(meth)acrylamide, diethylenetriamine tris(meth)acrylamide, xylylene bis(meth)acrylamide, α-chloroacrylamide and N-2-hydroxyethyl (meth)acrylamide; unsaturated aldehydes such as acrolein; unsaturated nitriles such as (meth)acrylonitrile, α-chloroacrylonitrile, vinylidene cyanide and allyl cyanide; unsaturated aromatic compounds such as styrene, 4-methylstyrene, 4-ethylstyrene, 4-methoxystyrene, 4-hydroxystyrene, 4-chlorostyrene, divinylbenzene, vinyltoluene, vinylbenzoic acid, vinylphenol, vinylsulfonic acid, 4-vinylbenzenesulfonic acid, vinylbenzyl methyl ether and vinylbenzyl glycidyl ether; unsaturated ketones such as methyl vinyl ketone; unsaturated amine compounds such as vinylamine, allylamine, N-vinylpyrrolidone and vinylpiperidine; vinyl alcohols such as allyl alcohol and crotyl alcohol; vinyl ethers such as vinyl methyl ether, vinyl ethyl ether, n-butyl vinyl ether, isobutyl vinyl ether and allyl glycidyl ether; unsaturated imides such as maleimide, N-phenylmaleimide and N-cyclohexylmaleimide; indenes such as indene and 1-methylindene; aliphatic conjugate dienes such as 1,3-butadiene, isoprene and chloroprene; macromonomers having mono(meth)acryloyl groups on the terminals of polymer molecule chains such as polystyrene, polymethyl(meth)acrylate, poly-n-butyl(meth)acrylate and polysiloxane; vinylurethane compounds of vinyl chloride, vinylidene chloride, divinyl succinate, diallyl phthalate, triallyl phosphate, triallyl isocyanurate, vinylthioether, vinylimidazole, vinyloxazoline, vinylcarbazole, vinylpyrrolidone, vinylpyridine, hydroxyl group-containing vinyl monomers and polyisocyanate compounds, vinylepoxy compounds of hydroxyl group-containing vinyl monomers and polyepoxy compounds, reaction products of hydroxyl group-containing multifunctional acrylates such as pentaerythritol triacrylate and dipentaerythritol pentaacrylate and multifunctional isocyanates such as trylene diisocyanate and hexamethylene diisocyanate, multifunctional acrylates having an acid value, which are reaction products of hydroxyl group-containing multifunctional acrylates such as pentaerythritol triacrylate and dipentaerythritol pentaacrylate and dibasic acid anhydrides such as succinic anhydride, phthalic anhydride and tetrahydrophthalic anhydride.

These polymerizable compounds can be used alone or by mixing two or more kinds, and in the case when two or more kinds are mixed and used, those may be co-polymerized in advance and used as a copolymer.

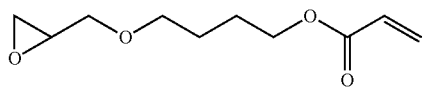
Compound No. 121

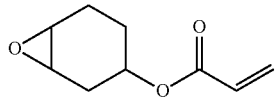
Compound No. 122

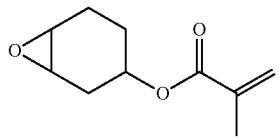
Compound No. 123

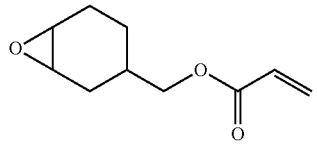
Compound No. 124

Furthermore, when (B') a polymerizable compound having an ethylenically unsaturated bond, which has alkali-developability (hereinafter also referred to as (B') an alkali-developable compound having an ethylenically unsaturated bond) is used as the above-mentioned polymerizable compound having an ethylenically unsaturated bond (B) in the colored composition of the present invention, the colored photosensitive composition of the present invention becomes a colored alkali-developable photosensitive composition. Examples of the alkali-developable compound having an ethylenically unsaturated bond (B') may include (meth)acrylic acid, (meth)acrylic acid esters such as methyl(meth)acrylate, ethyl(meth)acrylate, propyl(meth)acrylate, isopropyl(meth)acrylate, butyl(meth)acrylate, isobutyl(meth)acrylate, t-butyl(meth)acrylate, benzyl(meth)acrylate, phenyl(meth)acrylate, cyclohexyl(meth)acrylate, phenoxyethyl(meth)acrylate, 2-ethylhexyl(meth)acrylate, isobornyl(meth)acrylate, 2-hydroxyethyl(meth)acrylate, tetrahydrofurfuryl(meth)acrylate and the like; N-vinylpyrrolidone; styrenes such as styrene and derivatives thereof, α-methylstyrene and the like; acrylamides such as (meth)acrylamide, methylol(meth)acrylamide, alkoxymethylol(meth)acrylamide, diacetone(meth)acrylamide and the like; other vinyl compounds such as (meth)acrylonitrile, ethylene, propylene, butylene, vinyl chloride, vinyl acetate and the like, macromonomers such as polymethyl methacrylate macromonomers, polystyrene macromonomers and the like, monomethacrylates having tricyclodecane backbones, copolymers using N-phenylmaleimide, methacryloyloxymethyl-3-ethyloxetane or the like, with (meth)acrylic acid, and copolymers of (meth)acrylic acid obtained by reacting these with isocyanate compounds having an unsaturated bond such as KARENZ MOI and AOI manufactured by Showa Denko K. K., and resins obtained by reacting epoxy group(s) of epoxy compound with unsaturated monobasic acids and further reacting with polybasic acid anhydrides, wherein the epoxy compounds may include novolak-type epoxy compounds such as phenol and/or cresol novolak epoxy resins, novolak epoxy resins having biphenyl backbones or naphthalene backbones, bisphenol A novolak-type epoxy compounds and dicyclopentadiene novolak-type epoxy compounds, polyphenylmethane-type epoxy resins having multifunctional epoxy groups, the epoxy compound represented by the following general formula (I), and the like. These monomers can be used by one kind alone, or by mixing two or more kinds. Furthermore, it is preferable that the above-mentioned alkali-developable compound having an ethylenically unsaturated bond contains an unsaturated group by 0.2 to 1.0 equivalent amount.

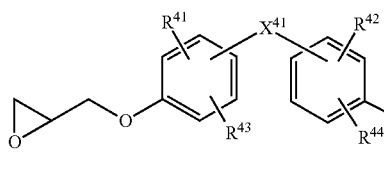 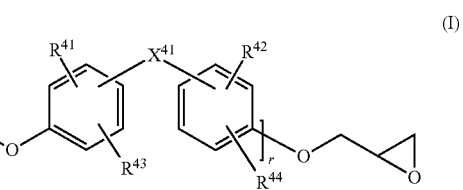

(I)

wherein $X^{41}$ represents a direct bond, a methylene group, an alkylidene group having 1 to 4 carbon atom(s), an alicyclic hydrocarbon group having 3 to 20 carbon atoms, —O—, —S—, —SO$_2$—, —SS—, —SO—, —CO—, —OCO— or a substituent represented by each of the following formulas X1 to X3, wherein the alkylidene group may be substituted with halogen atom(s), $R^{41}$, $R^{42}$, $R^{43}$ and $R^{44}$ each independently represents a hydrogen atom, an alkyl group having 1 to 5 carbon atom(s), an alkoxy group having 1 to 8 carbon atom(s), an alkenyl group having 2 to 5 carbon atoms or a halogen atom, wherein the above-mentioned alkyl group, alkoxy group and alkenyl group may be substituted with halogen atom(s), and r is an integer of 0 to 10.

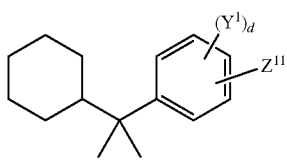

X1 wherein $Z^{11}$ represents a hydrogen atom, or a phenyl group or a cycloalkyl group having 3 to 10 carbon atom(s), which may be substituted with an alkyl group or alkoxy group having 1 to 10 carbon atom(s), $Y^1$ represents an alkyl group having 1 to 10 carbon atom(s), an alkoxy group having 1 to 10 carbon atom(s), an alkenyl group having 2 to 10 carbon atoms or a halogen atom, wherein the above-mentioned alkyl group, alkoxy group and alkenyl group may be substituted with halogen atom(s), and d is an integer of 0 to 5.

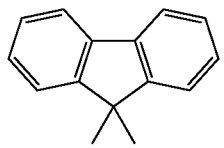

X2

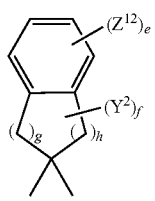

X3 wherein $Y^2$ and $Z^{12}$ each independently represents an alkyl group having 1 to 10 carbon atoms optionally substituted with halogen atom(s), an aryl group having 6 to 20 carbon atoms optionally substituted with halogen atom(s), an aryloxy group having 6 to 20 carbon atoms optionally substituted with halogen atom(s), an arylthio group having 6 to 20 carbon atoms optionally substituted with halogen atom(s), an aryalkenyl group having 6 to 20 carbon atoms optionally substituted with halogen atom(s), an arylalkyl group having 7 to 20 carbon atoms optionally substituted with halogen atom(s), a heterocyclic group having 2 to 20 carbon atoms optionally substituted with halogen atom(s), or a halogen atom, wherein the methylene group in the alkyl group and arylalkyl group may be interrupted by an unsaturated bond, —O— or —S—, $Z^{12}$ may form a ring with the adjacent $Z^{12}$, e represents a number of 0 to 4, f represents a number of 0 to 8, g represents a number of 0 to 4, and h represents a number of 0 to 4, wherein the sum of the numbers of g and h is 2 to 4.

Examples of the above-mentioned unsaturated monobasic acid that is reacted with the epoxy group(s) of the above-mentioned epoxy compound may include acrylic acid, methacrylic acid, crotonic acid, cinnamic acid, sorbic acid, hydroxyethyl methacrylate maleate and the like. Examples may include hydroxyethyl acrylate maleate, hydroxypropyl methacrylate maleate, hydroxypropyl acrylate maleate, dicyclopentadiene maleate and the like.

Furthermore, examples of the above-mentioned polybasic acid anhydride that is reacted after reacting the above-mentioned unsaturated monobasic acid may include biphenyltetracarboxylic dianhydride, tetrahydrophthalic anhydride, succinic anhydride, maleic anhydride, trimellitic anhydride, pyromellitic anhydride, 2,2'-3,3'-benzophenonetetracarboxylic anhydride, ethylene glycol bisanhydrotrimellitate, glycerol trisanhydrotrimellitate, hexahydrophthalic anhydride, methyltetrahydrophthalic anhydride, nadic anhydride, methylnadic anhydride, trialkyltetrahydrophthalic anhydride, hexahydrophthalic anhydride, 5-(2,5-dioxotetrahydrofuryl)-3-methyl-3-cyclohexene-1,2-dicarboxylic anhydride, trialkyltetrahydrophthalic anhydride-maleic anhydride additive, dodecenylsuccinic anhydride, methylhimic anhydride and the like.

The epoxy compound, unsaturated monobasic acid, and polybasic acid anhydride are preferably used in the following molar ratios. The epoxy compound and the unsaturated monobasic acid are preferably used in such a molar ratio that results in the formation of an epoxy adduct having 0.1 to 1.0 carboxyl group of the unsaturated monobasic acid added per epoxy group of the epoxy compound. The polybasic acid anhydride is preferably used in such a molar ratio as to provide 0.1 to 1.0 acid anhydride structure per hydroxyl group of the resulting epoxy adduct.

The reactions of the epoxy compound, unsaturated monobasic acid, and polybasic acid anhydride are carried out in a usual manner.

In order to adjust the acid value to thereby improve the developability of the colored alkali-developable photosensitive composition of the present invention, a monofunctional or multifunctional epoxy compound can further be used together with the above-mentioned alkali-developable compound having an ethylenically unsaturated bond. The above-mentioned alkali-developable compound having an ethylenically unsaturated bond preferably has an acid value of the solid content within the range of 5 to 120 mg KOH/g, and it is preferable that the use amount of the monofunctional or multifunctional epoxy compound is selected so as to satisfy the above-mentioned acid value.

Examples of the above-mentioned monofunctional epoxy compound may include glycidyl methacrylate, methyl glycidyl ether, ethyl glycidyl ether, propyl glycidyl ether, isopropyl glycidyl ether, butyl glycidyl ether, isobutyl glycidyl ether, t-butyl glycidyl ether, pentyl glycidyl ether, hexyl glycidyl ether, heptyl glycidyl ether, octyl glycidyl ether, nonyl glycidyl ether, decyl glycidyl ether, undecyl glycidyl ether, dodecyl glycidyl ether, tridecyl glycidyl ether, tetradecyl glycidyl ether, pentadecyl glycidyl ether, hexadecyl glycidyl ether, 2-ethylhexyl glycidyl ether, allyl glycidyl ether, propargyl glycidyl ether, p-methoxyethyl glycidyl ether, phenyl glycidyl ether, p-methoxyglycidyl ether, p-butylphenol glycidyl ether, cresyl glycidyl ether, 2-methylcresyl glycidyl ether, 4-nonylphenyl glycidyl ether, benzyl glycidyl ether, p-cumylphenyl glycidyl ether, trityl glycidyl ether, 2,3-epoxypropyl methacrylate, epoxylated soybean oil, epoxylated linseed oil, glycidyl butyrate, vinylcyclohexane monoxide, 1,2-epoxy-4-vinylcyclohexane, styrene oxide, pinene oxide, methylstyrene oxide, cyclohexene oxide, propylene oxide, the above-mentioned compounds No. 122 and No. 123, and the like.

As the above-mentioned multifunctional epoxy compound, it is preferable to use one or more kinds selected from the group consisting of bisphenol-type epoxy compounds and glycidyl ethers, since a colored alkali-developable photosensitive composition having finer properties can be obtained. As the bisphenol-type epoxy compound, the epoxy compound represented by the above-mentioned general formula (I) can be used, and for example, bisphenol-type epoxy compounds such as hydrogenated bisphenol-type epoxy compounds can also be used. Examples of the above-mentioned glycidyl ethers may include ethylene glycol diglycidyl ether, propylene glycol diglycidyl ether, 1,4-butanediol diglycidyl ether, 1,6-hexanediol diglycidyl ether, 1,8-octanediol diglycidyl ether, 1,10-decanediol diglycidyl ether, 2,2-dimethyl-1,3-propanediol diglycidyl ether, diethylene glycol diglycidyl ether, triethylene glycol diglycidyl ether, tetraethylene glycol diglycidyl ether, hexaethylene glycol diglycidyl ether, 1,4-cyclohexanedimethanol diglycidyl ether, 1,1,1-tri(glycidyloxymethyl)propane, 1,1,1-tri(glycidyloxymethyl)ethane, 1,1,1-tri(glycidyloxymethyl)methane, 1,1,1-tetra(glycidyloxymethyl)methane and the like.

In addition, novolak-type epoxy compounds such as phenol novolak-type epoxy compounds, biphenyl novolak-type epoxy compounds, cresol novolak-type epoxy compounds, bisphenol A novolak-type epoxy compounds and dicyclopentadiene novolak-type epoxy compounds; alicyclic epoxy compounds such as 3,4-epoxy-6-methylcyclohexylmethyl-3,4-epoxy-6-methylcyclohexane carboxylate, 3,4-epoxycyclohexylmethyl-3,4-epoxycyclohexane carboxylate and 1-epoxyethyl-3,4-epoxycyclohexane; glycidyl esters such as diglycidyl phthalate, diglycidyl tetrahydrophthalate and glycidyl dimerate; glycidylamines such as tetraglycidyldiaminodiphenylmethane, triglycidyl-p-aminophenol and N,N-diglycidylaniline; heterocyclic epoxy compounds such as 1,3-diglycidyl-5,5-dimethylhydantoin and triglycidyl isocyanurate; dioxide compounds such as dicyclopentadiene dioxide; naphthalene-type epoxy compounds, triphenylmethane-type epoxy compounds, dicyclopentadiene-type epoxy compounds, and the like can be used.

Among the above-mentioned polymerizable compounds having an ethylenically unsaturated bond (B) (including the above-mentioned alkali-developable compound having an ethylenically unsaturated bond (B')), unsaturated aliphatic hydrocarbons, unsaturated polybasic acids, multifunctional acrylates having an acid value and (meth)acrylic acid esters are preferable, and unsaturated aliphatic hydrocarbons and unsaturated polybasic acids are more preferable, from the viewpoints of compatibility, alkali-developability and heat-resistance.

In the colored composition of the present invention, it is preferable that the content of the above-mentioned polymerizable compound having an ethylenically unsaturated bond (B) (including the above-mentioned alkali-developable compound having an ethylenically unsaturated bond (B')) is 30 to 99 mass %, specifically 60 to 95 mass % in the colored composition of the present invention. When the content of the above-mentioned polymerizable compound having an ethylenically unsaturated bond (B) is less than 30 mass %, the cured product has insufficient kinetic strength, and thus cracks may be generated, and developing failure may occur in the case when the compound has alkali-developability, whereas when the content is more than 99 mass %, curing by exposure to light becomes insufficient, and thus tacks may be generated, and in the case when the compound has alkali-developability, the developing time becomes longer, and film defect may occur by the alkali on the cured part.

<Photopolymerization Initiator (C)>

As the above-mentioned photopolymerization initiator (C), a conventionally-known compound can be used, and examples may include benzophenone, phenyl biphenyl ketone, 1-hydroxy-1-benzoylcyclohexane, benzoin, benzyl dimethyl ketal, 1-benzyl-1-dimethylamino-1-(4'-morpholinobenzoyl)propane, 2-morpholyl-2-(4'-methylmercapto) benzoylpropane, thioxanthone, 1-chloro-4-propoxythioxanthone, isopropylthioxanthone, diethylthioxanthone, ethylanthraquinone, 4-benzoyl-4'-methyldiphenylsulfide, benzoin butyl ether, 2-hydroxy-2-benzoylpropane, 2-hydroxy-2-(4'-isopropyl)benzoylpropane, 4-butylbenzoyltrichloromethane, 4-phenoxybenzoyldichloromethane, benzoyl methyl formate, 1,7-bis(9'-acrydinyl)heptane, 9-n-butyl-3,6-bis(2'-morpholinoisobutyroyl)carbazole, 2-methyl-4,6-bis(trichloromethyl)-s-triazine, 2-phenyl-4,6-bis(trichloromethyl)-s-triazine, 2-naphthyl-4,6-bis(trichloromethyl)-s-triazine, 2,2-bis(2-chlorophenyl)-4,5,4',5'-tetraphenyl-1-2'-biimidazole, 4,4-azobisisobutyronitrile, triphenylphosphine, camphorquinone, benzoyl peroxide and the like. Examples of commercially available products may include N-1414, N-1717, N-1919, PZ-408, NCI-831, NCI-930 (manufactured by ADEKA Corporation), IRGACURE369, IRGACURE907, IRGACURE OXE 01, IRGACURE OXE 02 (manufactured by BASF), and the like.

Among the above-mentioned photopolymerization initiators (C), 2-morpholyl-2-(4'-methylmercapto)benzoylpropane and 9-n-butyl-3,6-bis(2'-morpholinoisobutyroyl)carbazole are preferable, and 2-morpholyl-2-(4'-methylmercapto) benzoylpropane is more preferable, from the viewpoint of sensitivity.

In the colored composition of the present invention, it is preferable that the content of the above-mentioned photopolymerization initiator (C) is 0.1 to 30 mass %, specifically 0.5 to 10 mass % in the colored composition of the present invention. When the content of the above-mentioned photopolymerization initiator (C) is less than 0.1 mass %, curing by exposing to light may become insufficient, whereas when the content is more than 30 mass %, the initiator (C) may precipitate in the resin composition.

<Inorganic Pigment and/or Organic Pigment (D)>

An inorganic pigment and/or an organic pigment (D) may further be incorporated in the colored composition of the present invention. These pigments can be used alone or by mixing two or more kinds.

As the above-mentioned inorganic pigment and/or organic pigment (D), for example, inorganic pigments or organic pigments such as nitroso compounds, nitro compounds, azo compounds, diazo compounds, xanthene compounds, quinoline compounds, anthraquinone compounds, coumarin compounds, phthalocyanine compounds, isoindolinone compounds, isoindoline compounds, quinacridone compounds, anthanthrone compounds, perynone compounds, perylene compounds, diketopyrolopyrrole compounds, thioindigo compounds, dioxazine compounds, triphenylmethane compounds, quinophthalone compounds and naphthalenetetracarboxylic acid; metal complex compounds such as azo dyes and cyanine dyes; rake pigments; carbon blacks such as carbon blacks obtained by a furnace process, a channel process or a thermal process, or acetylene black, Ketjen black or lamp black; the above-mentioned carbon blacks that have been adjusted and coated with an epoxy resin, the above-mentioned carbon blackes that have undergone a dispersion treatment in advance with a resin in a solvent and absorbed 20 to 200 mg/g of the resin, the above-mentioned carbon blacks that have undergone an acidic or alkaline surface treatment, the above-mentioned carbon blacks having an average particle size of 8 nm or more and a DBP oil absorption amount of 90 ml/100 g or less, and the above-mentioned carbon blacks having a total oxygen amount calculated from CO and $CO_2$ in the volatile components at 950° C. of 9 mg or more per 100 $m^2$ of the surface area of the carbon black; graphite, graphitized carbon black, active carbon, carbon fibers, carbon nanotubes, carbon microcoils, carbon nanohorns, carbon aerogels and fullerene; aniline black, Pigment Black 7 and titanium black; hydrophobic resins, chromium oxide green, Milori blue, cobalt green, cobalt blue, manganese-based pigments, ferrocyanides, phosphate ultramarine blue, Prussian blue, ultramarine, cerulean blue, piridian, emerald green, lead sulfate, yellow lead, zinc yellow, Bengal red (red iron oxide (III)), cadmium red, synthetic iron black and amber can be used. These pigments can be used alone or by mixing plural numbers.

As the above-mentioned inorganic pigment and/or organic pigment (D), commercially available pigments can also be used, and examples may include Pigment Red 1, 2, 3, 9, 10, 14, 17, 22, 23, 31, 38, 41, 48, 49, 88, 90, 97, 112, 119, 122, 123, 144, 149, 166, 168, 169, 170, 171, 177, 179, 180, 184, 185, 192, 200, 202, 209, 215, 216, 217, 220, 223, 224, 226, 227, 228, 240 and 254; Pigment Orange 13, 31, 34, 36, 38, 43, 46, 48, 49, 51, 52, 55, 59, 60, 61, 62, 64, 65 and 71; Pigment Yellow 1, 3, 12, 13, 14, 16, 17, 20, 24, 55, 60, 73, 81, 83, 86, 93, 95, 97, 98, 100, 109, 110, 113, 114, 117, 120, 125, 126, 127, 129, 137, 138, 139, 147, 148, 150, 151, 152, 153, 154, 166, 168, 175, 180 and 185; Pigment Green 7, 10 and 36; Pigment Blue 15, 15:1, 15:2, 15:3, 15:4, 15:5, 15:6, 22, 24, 56, 60, 61, 62 and 64; Pigment Violet 1, 19, 23, 27, 29, 30, 32, 37, 40 and 50, and the like.

In the colored composition of the present invention, the content of the above-mentioned inorganic pigment and/or organic pigment (D) is preferably 0 to 350 parts by mass, more preferably 0 to 250 parts by mass with respect to 100 parts by mass of the above-mentioned polymerizable compound having an ethylenically unsaturated bond (B). In the case when the content goes beyond 350 parts by mass, it is not preferable since the light transmittance of the cured product and color filter for a display device using the colored composition of the present invention, specifically the colored alkali-developable photosensitive composition, is decreased, and thus the luminance of the display device is decreased.

<Solvent (E)>

A solvent (E) can further be added to the colored composition of the present invention. Examples of the solvent may generally include solvents that can dissolve or disperse the above-mentioned respective components (the dye (A) of the present invention, and the like) as necessary, such as ketones such as methyl ethyl ketone, methyl amyl ketone, diethyl ketone, acetone, methyl isopropyl ketone, methyl isobutyl ketone, cyclohexanone and 2-heptanone; ether solvents such as ethyl ether, dioxane, tetrahydrofuran, 1,2-dimethoxyethane, 1,2-diethoxyethane and dipropylene glycol dimethyl ether; ester solvents such as methyl acetate, ethyl acetate, n-propyl acetate, isopropyl acetate, n-butyl acetate, cyclohexyl acetate, ethyl lactate, dimethyl succinate and texanol; cellosolve solvents such as ethylene glycol monomethyl ether and ethylene glycol monoethyl ether; alcohol solvents such as methanol, ethanol, iso- or n-propanol, iso- or n-butanol and amyl alcohol; ether ester solvents such as ethylene glycol monomethyl acetate, ethylene glycol monoethyl acetate, propylene glycol-1-monomethyl ether-2-acetate (PGMEA), dipropylene glycol monomethyl ether acetate, 3-methoxybutyl acetate and ethoxyethyl propionate; BTX solvents such as benzene, toluene and xylene; aliphatic hydrocarbon solvents such as hexane, heptane, octane and cyclohexane; terpene hydrocarbon oils such as turpentine oil, D-limonene and pinene; paraffin solvents such as mineral spirit, SWASOL #310 (Cosmo Matsuyama Oil Co., Ltd.) and SOLVESSO #100 (Exxon Chemical Company); halogenated aliphatic hydrocarbon solvents such as carbon tetrachloride, chloroform, trichloroethylene, methylene chloride and 1,2-dichloroethane; halogenated aromatic hydrocarbon solvents such as chlorobenzene; carbitol solvents, aniline, triethylamine, pyridine, acetate, acetonitrile, carbon disulfide, N,N-dimethylformamide, N,N-dimethylacetamide, N-methylpyrrolidone, dimethylsulfoxide, water, and the like, and these solvents can be used by one kind or as a mixed solvent of two or more kinds. Among these, ketones, ether ester solvents and the like are preferable. Especially, propylene glycol-1-monomethyl ether-2-acetate, cyclohexanone and the like are preferable since they give fine compatibility between a resist and a photopolymerization initiator in a photosensitive composition.

In the colored composition of the present invention, it is preferable that the use amount of the above-mentioned solvent (E) is such that the concentration of the composition except for the solvent (E) would become 5 to 30 mass %, and in the case when the use amount is lower than 5 mass %, it is not preferable since it is difficult to thicken the film thickness and thus light of a desired wavelength cannot be sufficiently absorbed, whereas when the use amount exceeds 30 mass %, it is not preferable since the storage property of the composition is decreased and the viscosity is increased due to the precipitation of the composition, and thus handling is decreased.

An inorganic compound can further be incorporated in the colored composition of the present invention. Examples of the inorganic compound may include metal oxides such as nickel oxide, iron oxide, iridium oxide, titanium oxide, zinc oxide, magnesium oxide, calcium oxide, potassium oxide, silica and alumina; layered clay minerals, Milori blue, calcium carbonate, magnesium carbonate, cobalt systems, manganese systems, glass powder, mica, talc, kaolin, ferrocyanides, various metal sulfates, sulfides, selenides, aluminum silicate, calcium silicate, aluminum hydroxide, platinum, gold, silver, copper and the like. Among these, titanium oxide, silica, layered clay mineral, silver and the like are preferable. In the colored composition of the present invention, the content of the inorganic compound is preferably 0.1 to 50 parts by mass, more preferably 0.5 to 20 parts by mass with respect to 100 parts by mass of the above-mentioned polymerizable compound having an ethylenically unsaturated bond (B). These inorganic compounds can be used by one kind or two or more kinds.

These inorganic compounds are used as, for example, fillers, antireflective agents, conductant agents, stabilizers, flame retarders, agents for improving mechanical strength, agents for absorbing special wavelength, ink repellants and the like.

In the colored composition of the present invention, in the case when the pigment and/or inorganic compound is/are used, a dispersing agent can be added. The dispersing agent may be any one as long as it can disperse and stabilize color materials and inorganic compounds. As the dispersing agent, commercially available dispersing agents such as BYK series manufactured by BYK-Chemie GmbH can be used. Preferably used are polymer dispersing agents composed of polyesters, polyethers or polyurethanes having basic functional groups, and dispersing agents having a nitrogen atom as a basic functional group, wherein the functional group having a nitrogen atom is an amine and/or a quartenary salt thereof, and having an amine value of 1 to 100 mgKOH/g.

Furthermore, where necessary, conventionally-used additives such as thermal polymerization inhibitors such as p-anisole, hydroquinone, pyrocatechol, t-butylcatechol and phenothiazine; plasticizers; adhesion promoters; fillers; defoaming agents; leveling agents; surface adjusting agents; antioxidants; ultraviolet absorbers; dispersion aids; flocculation inhibitors; catalysts; effect promoters; crosslinking agents; and thickeners can be added to the colored composition of the present invention.

In the colored composition of the present invention, although the content of optional components other than the dye (A), polymerizable compound having an ethylenically unsaturated bond (B) and photopolymerization initiator (C) (however, the inorganic pigment and/or organic pigment (D), and the solvent (E) are excluded) is suitably selected depending on the purpose of use thereof and not specifically limited, the content is preferably 50 parts by mass or less in total with respect to 100 parts by mass of the above-mentioned polymerizable compound having an ethylenically unsaturated bond (B).

Furthermore, it is also possible to improve the property of the cured product formed of the colored composition of the present invention, by using other organic polymer together with the above-mentioned polymerizable compound having an ethylenically unsaturated bond (B). Examples of the above-mentioned organic polymer may include polystyrene, polymethyl methacrylate, methyl methacrylate-ethyl acrylate copolymers, poly(meth)acrylic acid, styrene-(meth)acrylic acid copolymers, (meth)acrylic acid-methyl methacrylate copolymers, ethylene-vinyl chloride copolymers, ethylene-vinyl copolymers, polyvinyl chloride resins, ABS resins, nylon 6, nylon 66, nylon 12, urethane resins, polycarbonate polyvinyl butyral, cellulose esters, polyacrylamide, saturated polyesters, phenolic resins, phenoxy resins, polyamideimide resins, polyamic acid resins, epoxy resins and the like, of which polystyrene, (meth)acrylic acid-methyl methacrylate copolymers and epoxy resins are preferable.

In the case when the other organic polymer is used, the use amount thereof is preferably 10 to 500 parts by mass with respect to 100 parts by mass of the above-mentioned polymerizable compound having an ethylenically unsaturated bond (B).

In the colored composition of the present invention, monomers having an unsaturated bond, chain transfer agents, sensitizers, surfactants, silane coupling agents, melamines and the like can further be used in combination.

Examples of the above-mentioned monomer having an unsaturated bond may include 2-hydroxyethyl acrylate, 2-hydroxypropyl acrylate, isobutyl acrylate, n-octyl acrylate, isooctyl acrylate, isononyl acrylate, steryl acrylate, methoxyethyl acrylate, dimethylaminoethyl acrylate, zinc acrylate, 1,6-hexanediol diacrylate, trimethylolpropane triacrylate, 2-hydroxyethyl methacrylate, 2-hydroxypropyl methacrylate, butyl methacrylate, t-butyl methacrylate, cyclohexyl methacrylate, trimethylolpropane trimethacrylate, dipentaerythritol pentaacrylate, dipentaerythritol hexaacrylate, pentaerythritol tetraacrylate, pentaerythritol triacrylate, bisphenol A diglycidyl ether (meth)acrylate, bisphenol F diglycidyl ether (meth)acrylate, bisphenol Z diglycidyl ether (meth)acrylate, tripropylene glycol di(meth)acrylate and the like.

As the above-mentioned chain transfer agents and sensitizers, sulfur atom-containing compounds are generally used. Examples may include mercapto compounds such as thioglycolic acid, thiomalic acid, thiosalicylic acid, 2-mercaptopropionic acid, 3-mercaptopropionic acid, 3-mercaptobutyric acid, N-(2-mercaptopropionyl)glycine, 2-mercaptonicotine acid, 3-[N-(2-mercaptoethyl)carbamoyl]propionic acid, 3-[N-(2-mercaptoethyl)amino]propionic acid, N-(3-mercaptopropionyl)alanine, 2-mercaptoethanesulfonic acid, 3-mercaptopropanesulfonic acid, 4-mercaptobutanesulfonic acid, dodecyl(4-methylthio)phenyl ether, 2-mercaptoethanol, 3-mercapto-1,2-propanediol, 1-mercapto-2-propanol, 3-mercapto-2-butanol, mercaptophenol, 2-mercaptoethylamine, 2-mercaptoimidazole, 2-mercaptobenzimidazole, 2-mercapto-3-pyridinol, 2-mercaptobenzothiazole, mercaptoacetatic acid, trimethylolpropane tris(3-mercaptopropionate) and pentaerythritol tetrakis(3-mercaptopropionate), disulfide compounds obtained by oxidizing the mercapto compounds, alkyl iodide compounds such as iodo acetate, iodo propionate, 2-iodoethanol, 2-iodoethanesulfonic acid and 3-iodopropanesulfonic acid, aliphatic multifunctional thiol compounds such as trimethylolpropane tris(3-mercaptoisobutyrate), butanediol bis(3-mercaptoisobutyrate), hexanedithiol, decanedithiol, 1,4-dimethylmercaptobenzene, butanediol bisthiopropionate, butanediol bisthioglycolate, ethylene glycol bisthioglycolate, trimethylolpropane tristhioglycolate, butanediol bisthiopropionate, trimethylolpropane tristhiopropionate, trimethylolpropane tristhioglycolate, pentaerythritol tetraldsthiopropionate, pentaerythritol tetrakisthioglycolate, trishydroxyethyl tristhiopropionate, the following compound No. 125 and trimercaptopropionic acid tris(2-hydroxyethyl)isocyanurate, KARENZ MT BD1, PE1 and NR1 manufactured by Showa Denko K. K., and the like.

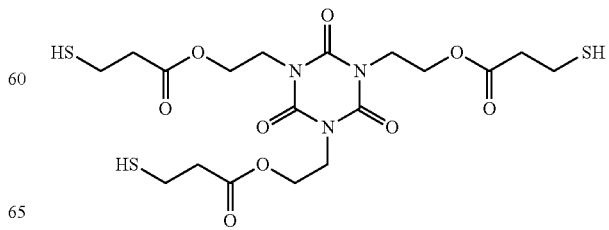

Compound No. 125

As the above-mentioned surfactants, surfactants such as fluorine surfactants such as perfluoroalkylphosphate esters and perfluoroalkylcarboxylate salts, anionic surfactants such as alkali salts of higher aliphatic acids, alkylsulfonates salts and alkylsulfate salts, cationic surfactants such as higher amine halogenate salts and quaternary ammonium salts, non-ionic surfactants such as polyethylene glycol alkyl ethers, polyethylene glycol aliphatic acid esters, sorbitan aliphatic acid esters and aliphatic acid monoglycerides, amphoteric surfactants, and silicone surfactants can be used, and these may be used in combination.

As the above-mentioned silane coupling agents, for example, silane coupling agents manufactured by Shin-Etsu Chemical Co., Ltd. can be used, and among these, KBE-9007, KBM-502, KBE-403 and the like, and silane coupling agents having an isocyanate group, a methacryloyl group or an epoxy group are preferably used.

Examples of the above-mentioned melamine compounds may include compounds in which whole or a part of (at least two) active methylol groups ($CH_2OH$ groups) in nitrogen compounds are alkyl-etherified such as (poly)methylolmelamine, (poly)methylolglycoluril, (poly)methylolbenzoguanamine and (poly)methylolurea. Examples of the alkyl groups that constitute the alkyl ethers may include a methyl group, an ethyl group or a butyl group, and the alkyl groups may be the same or different from each other. Furthermore, the methylol groups that are not alkyl-etherified may be self-condensed in one molecule, or may be condensed between two molecules to thereby form an oligomer component. Specifically, hexamethoxymethylmelamine, hexabutoxymethylmelamine, tetramethoxymethylglycoluril, tetrabutoxymethylglycoluril and the like can be used. Among these, alkyl-etherified melamines such as hexamethoxymethylmelamine and hexabutoxymethylmel amine are preferable.

The colored composition of the present invention can be applied to support bases such as soda glass, quartz glass, semiconductor substrates, metals, paper and plastics by known means such as a spin coater, a roll coater, a bar coater, a die coater, a curtain coater, various printings and immersion. Alternatively, the colored composition of the present invention can also be applied once to a support base such as a film and then transferred to other support base, and the method for the application is not limited.

Furthermore, as a light source of active light used for curing the colored composition of the present invention, a light source that emits light at a wavelength of 300 to 450 nm can be used, and for example, ultrahigh pressure mercury, mercury vapor arc, carbon arc, xenon arc and the like can be used.

Furthermore, a laser direct drawing process that forms an image directly from digital information from a computer or the like by using laser light as a light source for exposing without using a mask is useful since not only producibility but also resolution and position accuracy can be improved. As the laser light therefor, light at a wavelength of 340 to 430 nm is preferably used. However, laser lights that emit light in the visible and infrared region such as argon ion laser, helium-neon laser, YAG laser and semiconductor laser are also used. In the cases when these lasers are used, a sensitizing pigment that absorbs the visible to infrared region is added.

The colored composition of the present invention (or a cured product thereof) can be used for various uses such as photocurable coating materials or varnishes, photocurable adhesives, printed substrates, or color filters in liquid crystal display panels for color display in color TV sets, PC monitors, handheld terminals, digital cameras and the like, color filters for CCD image sensors, electrode materials for plasma display panels, powder coatings, printing inks, printing plates, adhesives, dental compositions, resins for stereolithography, gel coats, photoresists for electronics, resists for electrical plating, etching resists, both liquid and dried films, solder resists, resists for producing color filters for uses in various displays or for forming structures in the production steps of plasma display panels, electroluminescent display devices and LCDs, compositions for enclosing electric and electronic parts, solder resists, magnetic recording materials, minute mechanical parts, waveguides, light switches, masks for plating, etching masks, color test systems, glass fiber cable coatings, stencils for screen printing, materials for producing three-dimensional objects by stereolithography, materials for holographic recording, image recording materials, fine electronic circuits, decoloring materials, decoloring materials for image recording materials, decoloring materials for image recording materials using microcapsules, photoresist materials for printed wiring boards, photoresist materials for UV and visible laser direct image systems, photoresist materials for use in formation of dielectric layers in sequential lamination of printed circuit substrates or protective films, and the uses are not specifically limited.

The colored composition of the present invention (specifically, the colored alkali-developable photosensitive composition) is used for the purpose of forming pixels of color filters, and is specifically useful as a colored photosensitive composition for forming color filters for display devices for image display devices such as liquid crystal display panels.

Furthermore, the color filter for a display device of the present invention may have optical elements of red, green, blue, orange, purple and black besides the cured product of the present invention.

The above-mentioned color filter for a display device is preferably formed by (1) a step of forming a coating film of the colored composition of the present invention (specifically, the colored alkali-developable photosensitive composition) on a basal plate, (2) a step of irradiating the coating film with active light through a mask having a predetermined pattern shape, (3) a step of developing the exposed coating film by a developer liquid (specifically, an alkali developer liquid), and (4) a step of heating the developed film. Furthermore, the colored composition of the present invention is also useful as a colored composition for an inkjet process and a transfer process, which do not include a step of developing.

The production of the color filter used for a liquid crystal display panel or the like can be prepared by combining patterns of two or more colors by repetitively conducting the steps of the above-mentioned (1) to (4) by using the colored composition of the present invention or other colored composition.

EXAMPLES

Hereinafter the present invention will further be explained in detail with referring to Examples, but the present invention is not deemed to be limited by these Examples.

Example

Preparation of Colored Alkali-Developable Photosensitive Composition

<Step 1> Preparation of Alkali-Developable Photosensitive Composition No. 1

30.33 g of ACA Z250 (manufactured by Daicel-Cytec Company Ltd.) and 11.04 g of ARONIX M-450 (manufactured by Toagosei Co., Ltd.) as the component (B), 1.93 g of IRGACURE 907 (manufactured by BASF) as the component (C), 36.60 g of PGMEA and 20.08 g of cyclohexanone as the component (E), and 0.01 g of FZ2122 (manufactured by Dow Corning Toray Co., Ltd.) as other component were mixed and stirred until the insoluble substances disappeared to thereby give alkali-developable photosensitive composition No. 1.

<Step 2> Preparation of Dye Solution 1.90 g of dimethylacetamide was added to 0.10 g of the compound described in the following [Table 1A] or [Table 1B] as the component (A). The compound was dissolved by stirring to thereby give a dye solution.

<Step 3> Preparation of Colored Alkali-Developable Photosensitive Composition 5.0 g of alkali-developable photosensitive composition No. 1 obtained in Step 1 and 2.0 g of the dye solution obtained in Step 2 were mixed and stirred until the mixture became homogeneous to thereby give the colored alkali-developable photosensitive composition of the present invention.

Evaluation Examples 1-1 to 1-47

Evaluation of Absorption Wavelength Property

The colored alkali-developable photosensitive compositions obtained in Example were each applied to a glass basal plate under conditions of 410 rpm×7 sec, and dried on a hot plate at 90° C. for 90 seconds. The obtained coating film was exposed to light of 150 mJ/cm² from a ultrahigh pressure mercury lamp. The maximum absorption wavelength (λmax) of the exposed film was measured to evaluate the absorption wavelength property. The results are shown in the following [Table 1A] and [Table 1B].

TABLE 1A

| | (A) | | |
|---|---|---|---|
| Evaluation Example | Compound No. | Anion | λ max/nm |
| 1-1 | 1-1 | $ClO_4^-$ | 588 |
| 1-2 | 1-4 | $PF_6^-$ | 552 |
| 1-3 | 1-4 | EST5 | 553 |
| 1-4 | 1-4 | $Tf_2N^-$ | 550 |
| 1-5 | 1-4 | $MsO^-$ | 551 |
| 1-6 | 1-4 | $TsO^-$ | 552 |
| 1-7 | 1-49 | $Tf_2N^-$ | 596 |
| 1-8 | 1-60 | $ClO_4^-$ | 596 |
| 1-9 | 1-66 | $PF_6^-$ | 582 |
| 1-10 | 1-69 | $PF_6^-$ | 491 |
| 1-11 | 2-5 | — | 590 |
| 1-12 | 2-68 | — | 596 |
| 1-13 | 3-1 | — | 591 |
| 1-14 | 4-6 | — | 639 |
| 1-15 | 1-1 | $Tf_2N^-$ | 586 |
| 1-16 | 1-1 | 1,8-naphtholsulfonate anion | 589 |
| 1-17 | 1-4 | ELEMINOL | 552 |
| 1-18 | 1-4 | 3-sulfopropyl 2-methyl-2-propenoate anion | 550 |
| 1-19 | 1-4 | 1,3-benzenesulfonate anion | 550 |
| 1-20 | 1-4 | $BF_4^-$ | 550 |
| 1-21 | 1-4 | $Tf_2N^-$ | 551 |
| 1-22 | 1-4 | p-dodecylbenzenesulfonate anion | 551 |
| 1-23 | 1-4 | TA-1 | 549 |
| 1-24 | 1-42 | $ClO_4^-$ | 697 |
| 1-25 | 1-42 | $Tf_2N^-$ | 681 | continued to [Table 1B]

TABLE 1B

| 1-26 | 1-43 | $ClO_4^-$ | 580 |
|---|---|---|---|
| 1-27 | 1-43 | $Tf_2N^-$ | 579 |
| 1-28 | 1-43 | 2,6-naphthyldisulfonate anion | 580 |
| 1-29 | 1-50 | $Tf_2N^-$ | 589 |
| 1-30 | 1-60 | $Tf_2N^-$ | 693 |
| 1-31 | 1-66 | 3-sulfopropyl 2-methyl-2-propenoate anion | 548 |
| 1-32 | 1-66 | ELEMINOL | 549 |
| 1-33 | 1-67 | $PF_6^-$ | 494 |
| 1-34 | 1-72 | $PF_6^-$ | 493 |
| 1-35 | 1-73 | $ClO_4^-$ | 595 |
| 1-36 | 1-73 | $TsO^-$ | 596 |
| 1-37 | 1-73 | $Tf_2N^-$ | 595 |
| 1-38 | 1-74 | $BF_4^-$ | 642 |
| 1-39 | 1-75 | $PF_6^-$ | 606 |
| 1-40 | 1-76 | $TsO^-$ | 551 |
| 1-41 | 1-76 | $Tf_2N^-$ | 551 |
| 1-42 | 1-76 | 3-sulfopropyl 2-methyl-2-propenoate anion | 554 |
| 1-43 | 1-77 | $Tf_2N^-$ | 548 |
| 1-44 | 1-78 | $I^-$ | 596 |
| 1-45 | 1-78 | $Tf_2N^-$ | 594 |
| 1-46 | 1-79 | $PF_6^-$ | 557 |
| 1-47 | 1-80 | $PF_6^-$ | 565 |

EST5:

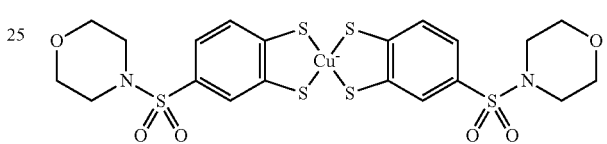

MsO—: mesyloxy anion
TsO—: tosyloxy anion
$Tf_2N$—: bis(trifluoromethanesulfonyl)imide anion
ELEMINOL: JS-20 (manufactured by Sanyo Chemical Industries, Ltd.)
TA-1: the quencher anion represented by the formula (7)

It is apparent from the results in the above-mentioned [Table 1A] and [Table 1B] that the colored alkali-developable photosensitive composition of the present invention using the compound represented by any of the above-mentioned general formulas (1) to (4) as a dye has a preferable wavelength property.

Evaluation Examples 2-1 to 2-35

Evaluation of Heat-Resistance

Among the exposed films obtained in the above-mentioned Evaluation Examples 1-1 to 1-47, the films described in the following [Table 2] were each baked at 230° C. for 30 minutes. With the absorbance of the exposed film in the maximum absorption wavelength (λmax) being 100, the closer to 100 the absorbance of the baked film was, the higher heat-resistance was considered to be given to the film. The relative values of the absorbance are shown in the following [Table 2].

TABLE 2

| | (A) | | Relative value |
|---|---|---|---|
| Evaluation Example | Compound No. | Anion | 230° C., 30 min |
| 2-1 | 1-1 | $ClO_4^-$ | 99.0 |
| 2-2 | 1-4 | $PF_6^-$ | 98.9 |
| 2-3 | 1-4 | EST5 | 98.9 |
| 2-4 | 1-4 | $Tf_2N^-$ | 99.2 |
| 2-5 | 1-4 | $MsO^-$ | 96.1 |

TABLE 2-continued

| Evaluation Example | Compound No. | (A) Anion | Relative value 230° C., 30 min |
|---|---|---|---|
| 2-6 | 1-4 | TsO⁻ | 98.7 |
| 2-7 | 1-49 | Tf$_2$N⁻ | 97.3 |
| 2-8 | 1-66 | PF$_6$⁻ | 97.5 |
| 2-9 | 1-69 | PF$_6$⁻ | 98.8 |
| 2-10 | 2-5 | — | 93.3 |
| 2-11 | 2-68 | — | 88.7 |
| 2-12 | 4-6 | — | 89.5 |
| 2-13 | 1-1 | Tf$_2$N⁻ | 99.4 |
| 2-14 | 1-1 | 1,8-naphtholsulfonate anion | 99.7 |
| 2-15 | 1-4 | ELEMINOL | 97.7 |
| 2-16 | 1-4 | 3-sulfopropyl 2-methyl-2-propenoate anion | 97.2 |
| 2-17 | 1-4 | 1,3-benzenesulfonate anion | 99.7 |
| 2-18 | 1-4 | Tf$_2$N⁻ | 99.6 |
| 2-19 | 1-4 | TA-1 | 96.1 |
| 2-20 | 1-42 | ClO$_4$⁻ | 97.4 |
| 2-21 | 1-42 | Tf$_2$N⁻ | 94.0 |
| 2-22 | 1-43 | ClO$_4$⁻ | 83.5 |
| 2-23 | 1-43 | Tf$_2$N⁻ | 99.8 |
| 2-24 | 1-43 | 2,6-naphthyldisulfonate anion | 93.3 |
| 2-25 | 1-50 | Tf$_2$N⁻ | 98.9 |
| 2-26 | 1-66 | 3-sulfopropyl 2-methyl-2-propenoate anion | 98.1 |
| 2-27 | 1-72 | PF$_6$⁻ | 97.0 |
| 2-28 | 1-73 | ClO$_4$⁻ | 92.1 |
| 2-29 | 1-73 | TsO⁻ | 96.1 |
| 2-30 | 1-73 | Tf$_2$N⁻ | 88.2 |
| 2-31 | 1-75 | PF$_6$⁻ | 99.3 |
| 2-32 | 1-76 | TsO⁻ | 99.9 |
| 2-33 | 1-76 | Tf$_2$N⁻ | 99.9 |
| 2-34 | 1-76 | 3-sulfopropyl 2-methyl-2-propenoate anion | 99.8 |
| 2-35 | 1-79 | PF$_6$⁻ | 95.9 |

It is apparent from the results in the above-mentioned [Table 2] that the colored alkali-developable photosensitive composition of the present invention using the compound represented by any of the above-mentioned general formulas (1) to (4) as a dye has high heat-resistance.

From the above-mentioned results, the colored alkali-developable photosensitive composition of the present invention using the compound represented by any of the abovementioned general formulas (1) to (4) as a dye has preferable wavelength property and is excellent in heat-resistance. Therefore, the colored alkali-developable photosensitive composition of the present invention is useful for a color filter for a display device.

The invention claimed is:

1. A colored photosensitive composition consisting essentially of (A) a dye containing at least one kind of compound represented by any of the following general formulas (1) and (2), (B) a polymerizable compound having an ethylenically unsaturated bond, and (C) a photopolymerization initiator:
wherein
A represents a group selected from (a) to (m) in the following Group I,
A' represents a group selected from (a') to (m') in the following Group II,
Q represents any of the following (Q-1) to (Q-11):

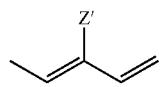
(Q-1)

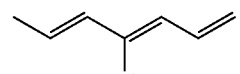
(Q-2)

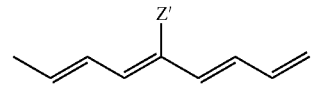
(Q-3)

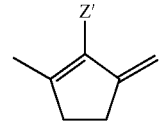
(Q-4)

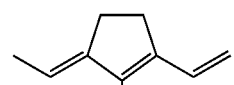
(Q-5)

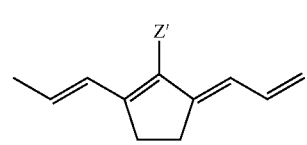
(Q-6)

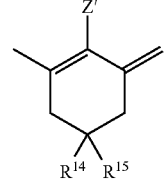
(Q-7)

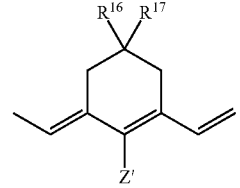
(Q-8)

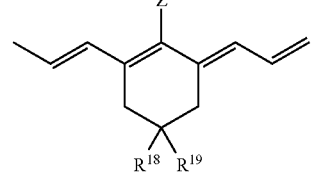
(Q-9)

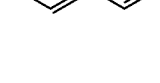
(Q-10)

(Q-11)

wherein $R^{14}$, $R^{15}$, $R^{16}$, $R^{17}$, $R^{18}$, $R^{19}$ and Z' each independently represents a hydrogen atom, a hydroxyl group, a halogen atom, a cyano group, —NRR', an aryl group, an arylalkyl group or an alkyl group, wherein the —NRR', aryl group, arylalkyl group and alkyl group may be substituted with a hydroxyl group, a halogen atom, a cyano group or —NRR', and may be interrupted by —O—, —S—, —CO—, —COO—, —OCO—, —SO$_2$—, —NH—, —CONH—, —NHCO—, —N=CH— or —CH=CH—, R and R' each represents an aryl group, an arylalkyl group or an alkyl group, An$^{q-}$ represents an anion having a valency of q, wherein q represents an integer of 1 to 3, and p represents a coefficient for retaining the charge neutral, wherein (2)

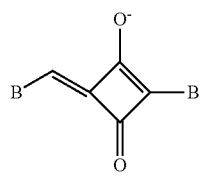

B represents a group selected from (a) to (m) of the following Group I,

Group I (a)

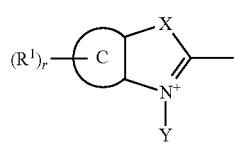

(b)

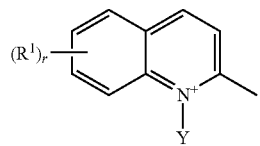

(c)

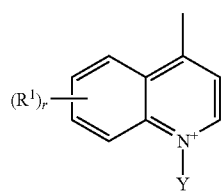

(d)

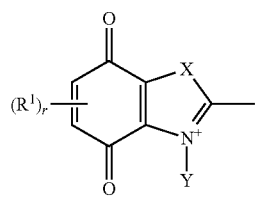

(e)

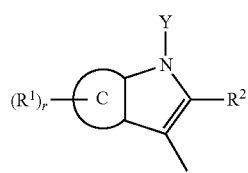

-continued (f)

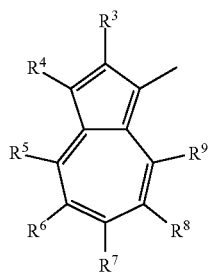

(g)

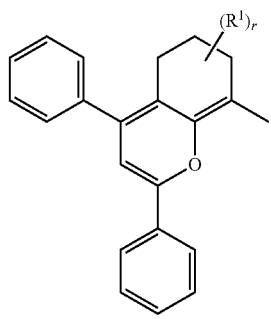

(h)

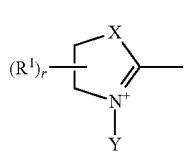

(i)

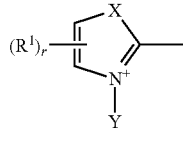

(j)

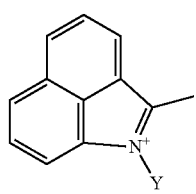

(k)

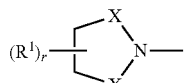

(l)

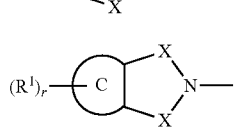

(m)

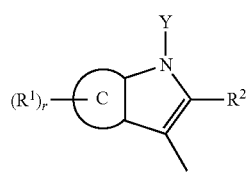

Group II (a')

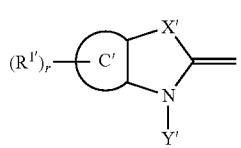

(b') 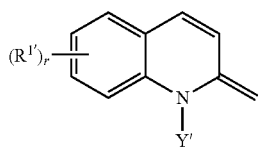

(c') 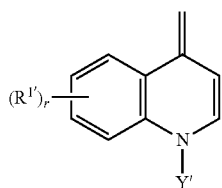

(d') 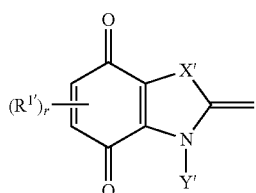

(e') 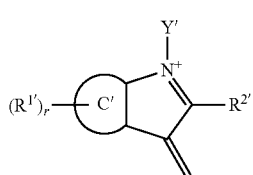

(f') 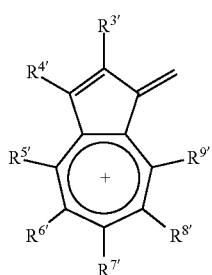

(g') 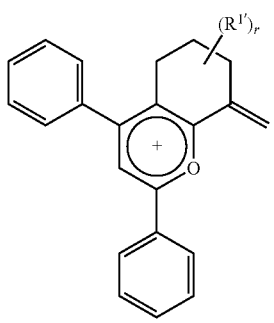

(h') 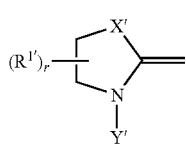

(i') 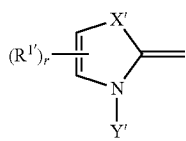

(j') 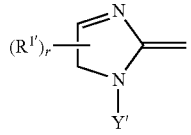

(k') 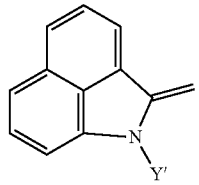

(l') 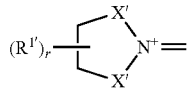

(m') 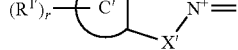

wherein
ring C and ring C' each represents a benzene ring, a naphthalene ring, a phenanthrene ring or a pyridine ring,
$R^1$ and $R^{1'}$ each represents a hydroxyl group, a halogen atom, a nitro group, a cyano group, —$SO_3H$, a carboxyl group, an amino group, an amide group, a ferrocenyl group, an aryl group having 6 to 30 carbon atoms, an arylalkyl group having 7 to 30 carbon atoms or an alkyl group having 1 to 8 carbon atom(s),
wherein the aryl group having 6 to 30 carbon atoms, arylalkyl group having 7 to 30 carbon atoms and alkyl group having 1 to 8 carbon atom(s) may be substituted with a hydroxyl group, a halogen atom, a nitro group, a cyano group, —$SO_3H$, a carboxyl group, an amino group, an amide group or a ferrocenyl group, and may be interrupted by —O—, —S—, —CO—, —COO—, —OCO—, —$SO_2$—, —NH—, —CONH—, —NHCO—, —N=CH— or a double bond,
$R^2$ to $R^9$ and $R^{2'}$ to $R^{9'}$ each represents a similar group to that for $R^1$ and $R^{1'}$ or a hydrogen atom,
X and X' represents an oxygen atom, a selenium atom, —$CR^{51}R^{52}$—, a cycloalkane-1,1-diyl group having 3 to 6 carbon atoms, —NH— or —$NY^2$—,
wherein $R^{51}$ and $R^{52}$ each represents a similar group to that for $R^1$ and $R^{1'}$ or a hydrogen atom,
Y, Y' and $Y^2$ each represents a hydrogen atom, or an alkyl group having 1 to 20 carbon atom(s), an aryl group having 6 to 30 carbon atoms or an arylalkyl group having 7 to 30 carbon atoms, which may be substituted with a hydroxyl group, a halogen atom, a cyano group, a carboxyl group, an amino group, an amide group, a ferrocenyl group, —$SO_3H$ or a nitro group,
wherein the methylene group in the alkyl group, aryl group and arylalkyl group in Y, Y' and $Y^2$ may be interrupted by —O—, —S—, —CO—, —COO—, —OCO—, —$SO_2$—, —NH—, —CONH—, —NHCO—, —N=CH— or —CH=CH—, and
r and r' each represents 0 or a number of possible substitution in (a) to (e), (g) to (j), (l), (m), (a') to (e'), (g') to (j'), (l') and (m'),
wherein the ring A and ring A' represent (a) or (a'), and the alkyl moiety of an aryl alkyl group is interrupted by —O— when Y and Y' are an arylalkyl group having 7 to 30 carbon atoms, wherein the dye (A) is a compound that is represented by the general formula (1) and further satisfy at least one of any of the following conditions (i) to (iii), or a compound represented by (2):
(i) the ring A or ring A' in the general formula (1) has at least one group selected from a halogen atom, a nitro group, and a ferrocenyl group;
(ii) the ring A in the general formula (1) is a group selected from (d) to (m), or the ring A' is a group selected from (d') to (m'); and
(iii) the anion represented by $An^{q-}$ in the general formula (1) is an organic sulfonate anion selected from the group consisting of: a methanesulfonate anion, a 1-butanesulfonate anion, a 1-hexanesulfonate anion, a 1-heptanesulfonate anion, an isethionate anion, a hydroxypropanesulfonate anion, a 2-aminoethanesulfonate anion, 1,3-benzenedisulfonate, a 1-naphthol-8-sulfonate anion, a p-styrenesulfonate anion, an allylsulfonate anion, a methacryloxyisethionate anion, a methacryloxypropanesulfonate anion, a 2-acrylamide-2-methylpropanesulfonate anion, a 1,3-benzenedisulfonate, a 1-naphthol-8-sulfonate anion, a p-styrenesulfonate anion, an allylsulfonate anion, a methacryloxyisethionate anion, a methacryloxypropanesulfonate anion, a 2-acrylamide-2-methylpropanesulfonate anion, a trifluoromethanesulfonate anion, a naphthalenedisulfonate anion, a 1,8-naphtholsulfonate anion, a 3-sulfopropyl 2-methyl-2-propenoate anion, a p-dodecylbenzenesulfonate anion, a 2,6-naphthyldisulfonate anion and a bis(trifluoromethanesulfonyl)imidate anion.

2. The colored photosensitive composition according to claim 1, which is a colored alkali-developable photosensitive composition wherein the polymerizable compound having an ethylenically unsaturated bond (B) is (B') a polymerizable compound having an ethylenically unsaturated bond, which has alkali-developability.

3. The colored photosensitive composition according to claim 2, which contains 0.01 to 50 mass % of the dye (A), 30 to 99 mass % of the polymerizable compound having an ethylenically unsaturated bond (B), and 0.1 to 30 mass % of the photopolymerization initiator (C).

4. The colored photosensitive composition according to claim 2, which further contains an inorganic pigment and/or an organic pigment (D).

5. The colored photosensitive composition according to claim 1, which contains 0.01 to 50 mass % of the dye (A), 30 to 99 mass % of the polymerizable compound having an ethylenically unsaturated bond (B), and 0.1 to 30 mass % of the photopolymerization initiator (C).

6. The colored photosensitive composition according to claim 5, which further contains an inorganic pigment and/or an organic pigment (D).

7. The colored photosensitive composition according to claim 1, which further contains an inorganic pigment and/or an organic pigment (D).

8. A cured product of the colored photosensitive composition according to claim 1.

9. A color filter for a display device, which is formed by using the cured product according to claim 8.

10. A liquid crystal display panel, which is formed by using the color filter for a display device according to claim 9.

* * * * *